United States Patent
Tsai et al.

(10) Patent No.: US 11,715,736 B2
(45) Date of Patent: Aug. 1, 2023

(54) SEMICONDUCTOR DEVICES WITH GATE ISOLATION STRUCTURES AND METHODS OF MANUFACTURING THEREOF

(71) Applicant: Taiwan Semiconductor Manufacturing Company, Ltd., Hsinchu (TW)

(72) Inventors: Ya-Yi Tsai, Hsinchu (TW); Wen-Shuo Hsieh, Taipei (TW); Shu-Yuan Ku, Zhubei (TW); Chieh-Ning Feng, Taichung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 8 days.

(21) Appl. No.: 17/355,418

(22) Filed: Jun. 23, 2021

(65) Prior Publication Data
US 2022/0415886 A1  Dec. 29, 2022

(51) Int. Cl.
| | | |
|---|---|---|
| *H01L 27/088* | (2006.01) | |
| *H01L 21/762* | (2006.01) | |
| *H01L 21/8234* | (2006.01) | |
| *H01L 29/66* | (2006.01) | |
| *H01L 29/06* | (2006.01) | |
| *H01L 29/78* | (2006.01) | |

(52) U.S. Cl.
CPC .... *H01L 27/0886* (2013.01); *H01L 21/76224* (2013.01); *H01L 21/823481* (2013.01); *H01L 29/6681* (2013.01)

(58) Field of Classification Search
CPC ............. H01L 29/785; H01L 29/7855; H01L 2029/7858; H01L 21/76; H01L 21/762; H01L 21/76224; H01L 21/823481; H01L 21/823878; H01L 29/0642; H01L 29/0649; H01L 29/0653; H01L 27/0886; H01L 21/823437; H01L 29/6681
See application file for complete search history.

(56) References Cited

U.S. PATENT DOCUMENTS

| | | | |
|---|---|---|---|
| 2019/0312124 A1* | 10/2019 | Lee | .............. H01L 29/6681 |
| 2020/0091311 A1* | 3/2020 | Hsu | .............. H01L 29/66545 |
| 2020/0357896 A1* | 11/2020 | Cheng | ............... H01L 27/0886 |

* cited by examiner

*Primary Examiner* — Sonya McCall-Shepard
(74) *Attorney, Agent, or Firm* — Foley & Lardner LLP

(57) ABSTRACT

A semiconductor device includes a first semiconductor fin and a second semiconductor fin extending along a first direction. The semiconductor device includes a dielectric fin, extending along the first direction, that is disposed between the first and second semiconductor fins. The semiconductor device includes a gate isolation structure vertically disposed above the dielectric fin. The semiconductor device includes a metal gate layer extending along a second direction perpendicular to the first direction, wherein the metal gate layer includes a first portion straddling the first semiconductor fin and a second portion straddling the second semiconductor fin. The gate isolation structure has a central portion and one or more side portions, the central portion extends toward the dielectric fin a further distance than at least one of the one or more side portions.

20 Claims, 41 Drawing Sheets

SEMICONDUCTOR DEVICES WITH GATE ISOLATION STRUCTURES AND METHODS OF MANUFACTURING THEREOF

BACKGROUND

The present disclosure generally relates to semiconductor devices, and particularly to methods of making a non-planar transistor device.

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
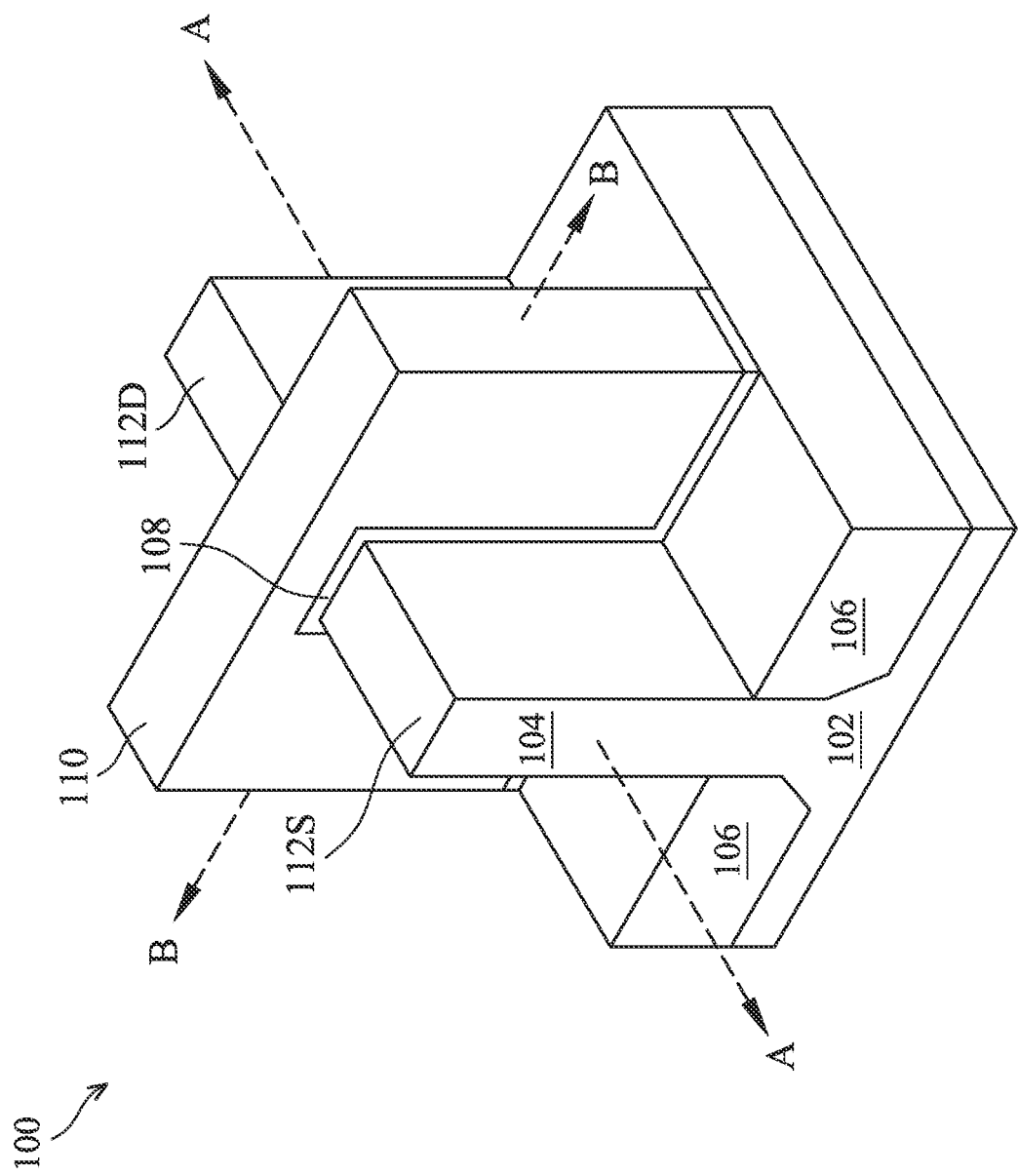
FIG. 1 illustrates a perspective view of a Fin Field-Effect Transistor (FinFET) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of forming a FinFET device, and in particular, in the context of forming a replacement gate of a FinFET device. In some embodiments, a dummy gate structure is formed over a number of fins. The fins can include one or more active fins and one or more dummy fins. Hereinafter, the term "active fin" is referred to as a fin that will be adopted as an active channel to electrically conduct current in a finished semiconductor device (e.g., FinFET device 300 shown below), when appropriately configured and powered; and the term "dummy fin" is referred to as a fin that will not be adopted as an active channel (i.e., a dummy channel) to electrically conduct current in a finished semiconductor device (e.g., FinFET device 300 shown below). In an embodiment, at least one of the dummy fins, disposed between two adjacent ones of the active fins, may be etched to have a v-shaped top surface. In another embodiment, at least one of the dummy fins, disposed between two adjacent ones of the active fins, may include two layers that have respective different etching selectivities (with respect to the dummy gate structure). Next, gate spacers are formed around the dummy gate structure. After an interlayer dielectric (ILD) layer is formed around the gate spacers to overlay respective portions of the fins, a portion of the dummy gate structure over the at least one dummy fin is removed to form a gate cut trench. Next, such a gate cut trench is filled with a gate isolation structure. Next, the remaining portion of the dummy gate structure is replaced with an active gate structure, which can include one or more metal gate layers.

Metal gate layers over multiple fins formed by the above described method can provide various advantages in advanced processing nodes. The gate isolation structure is formed over the dummy fin to disconnect, intercept, cut, or otherwise separate the metal gate layers. Forming the gate isolation structure to cut metal gate layers can allow different portions of the metal gate layers to be electrically coupled to respective active fin(s). However, the critical dimension of a gate isolation structure formed by the existing technologies, may be enlarged due to processing variation, which disadvantageously shrinks respective critical dimensions of the metal gate layers.

For example, the existing technologies typically form the dummy gate structure to have a reverse v-shaped top surface. Due to processing variation (e.g., where the gate cut trench is laterally shifted from a desired position, where the gate cut trench is formed wider than expected, etc.), the gate cut trench may include undesired lateral expansion, whose formation is facilitated by the reverse v-shaped top surface of the dummy fin. Such a lateral expansion (which is sometimes referred to as a "shadowing effect") in turn shrinks the respective critical dimensions of the metal gate layers, thereby adversely impacting subsequent process windows, for example, forming contacts for the active gate structure.

By forming a v-shaped top surface of the dummy fin or including two different layers in the dummy fin, even though the above-mentioned processing variation occurs, it can be assured that the shadowing effect can be significantly limited. For example, when the dummy fin has a v-shaped top surface, the dummy fin can have a central portion that is shorter than its respective side portions. At least one of such higher side portions can be used to block the lateral expansion of the gate cut trench. In another example, when the dummy fin has two layers that form its central portion and side portions, respectively, the central portion can be selected to have a relatively lower etching selectivity (with respect to the dummy gate structure) than the side portions. As such, while forming the gate cut trench, the side portions can remain substantially intact, which may also block the lateral expansion of the gate cut trench. In this way, the issues typically observed in the existing technologies can be eliminated.

FIG. 1 illustrates a perspective view of an example FinFET device 100, in accordance with various embodiments. The FinFET device 100 includes a substrate 102 and a fin 104 protruding above the substrate 102. Isolation regions 106 are formed on opposing sides of the fin 104, with the fin 104 protruding above the isolation regions 106. A gate dielectric 108 is along sidewalls and over a top surface of the fin 104, and a gate 110 is over the gate dielectric 108. Source region 112S and drain region 112D are in (or extended from) the fin 104 and on opposing sides of the gate dielectric 108 and the gate 110. FIG. 1 is provided as a reference to illustrate a number of cross-sections in subsequent figures. For example, cross-section B-B extends along a longitudinal axis of the gate 110 of the FinFET device 100. Cross-section A-A is perpendicular to cross-section B-B and is along a longitudinal axis of the fin 104 and in a direction of, for example, a current flow between the source/drain regions 112S/112D. Subsequent figures refer to these reference cross-sections for clarity.

Figure 2:
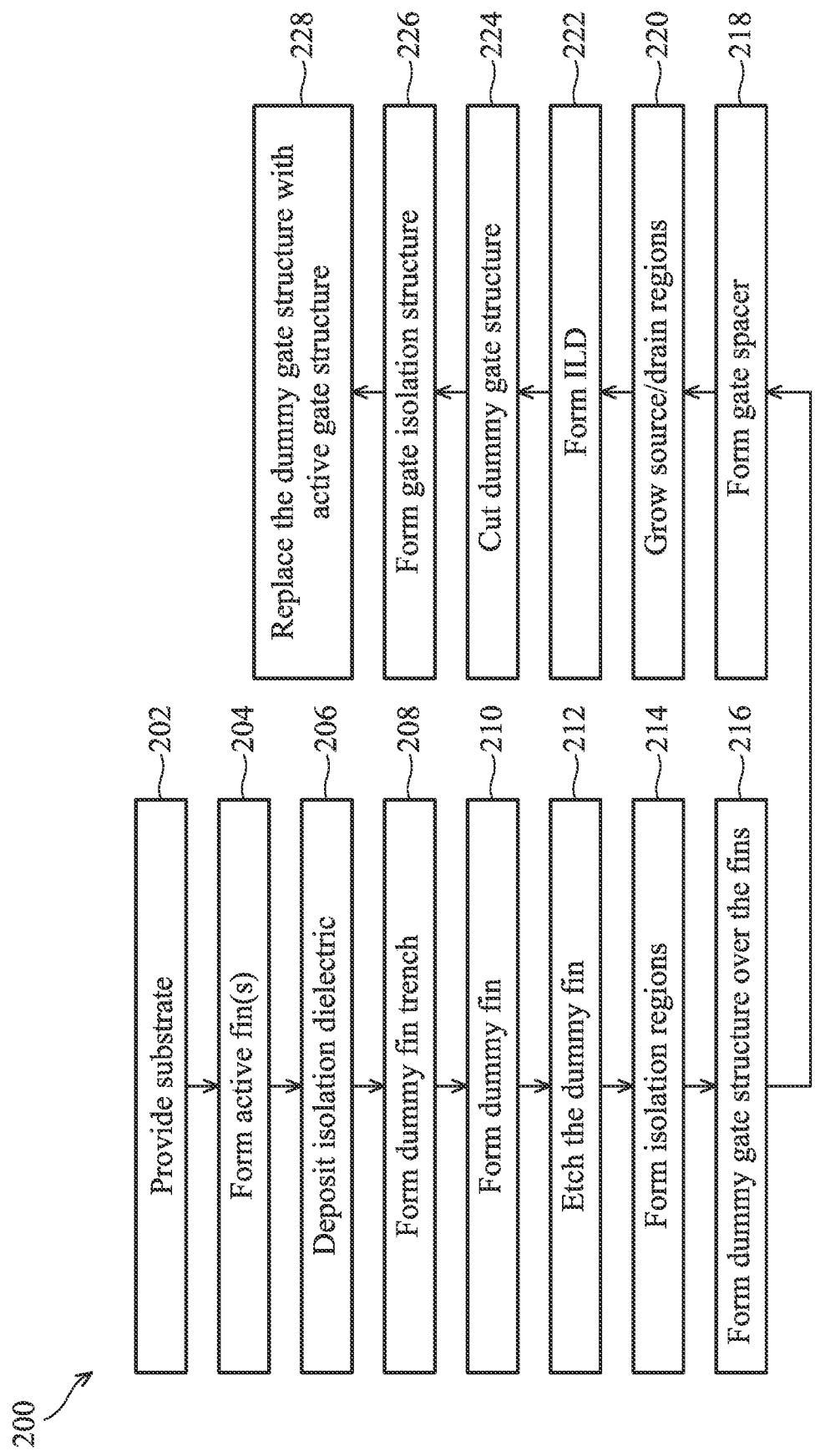
FIG. 2 illustrates a flow chart of an example method for making a non-planar transistor device, in accordance with some embodiments.

FIG. 2 illustrates a flowchart of a method 200 to form a non-planar transistor device, according to one or more embodiments of the present disclosure. For example, at least some of the operations (or steps) of the method 200 can be used to form a FinFET device (e.g., FinFET device 100), a nanosheet transistor device, a nanowire transistor device, a vertical transistor device, a gate-all-around (GAA) transistor device, or the like. It is noted that the method 200 is merely an example, and is not intended to limit the present disclosure. Accordingly, it is understood that additional operations may be provided before, during, and after the method 200 of FIG. 2, and that some other operations may only be briefly described herein. In some embodiments, operations of the method 200 may be associated with cross-sectional views of an example FinFET device at various fabrication stages as shown in FIGS. 3, 4, 5, 6, 7, 8A, 8B, 8C, 9, 10, 11, 12, 13, 14A, 14B, 14C, 15A, 15B, 15C, and 16, respectively, which will be discussed in further detail below.

In brief overview, the method 200 starts with operation 202 of providing a substrate. The method 200 continues to operation 204 of forming one or more active fins. The method 200 continues to operation 206 of depositing an isolation dielectric. The method 200 continues to operation 208 of forming a dummy fin trench. The method 200 continues to operation 210 of forming a dummy fin. The method 200 continues to operation 212 of etching the dummy fin. The method 200 continues to operation 214 of forming isolation regions. The method 200 continues to operation 216 of forming a dummy gate structure over the fins. The dummy gate structures can include a dummy gate dielectric and a dummy gate disposed above the dummy gate dielectric. The method 200 continues to operation 218 of forming a gate spacer. The gate spacers are extended along sidewalls of the dummy gate structure. The method 200 continues to operation 220 of growing source/drain regions. The method 200 continues to operation 222 of forming an interlayer dielectric (ILD). The method 200 continues to operation 224 of cutting the dummy gate structure. The method 200 continues to operation 226 of forming a gate isolation structure. The method 200 continues to operation 228 of replacing the dummy gate structure with an active gate structure.

Figure 11:
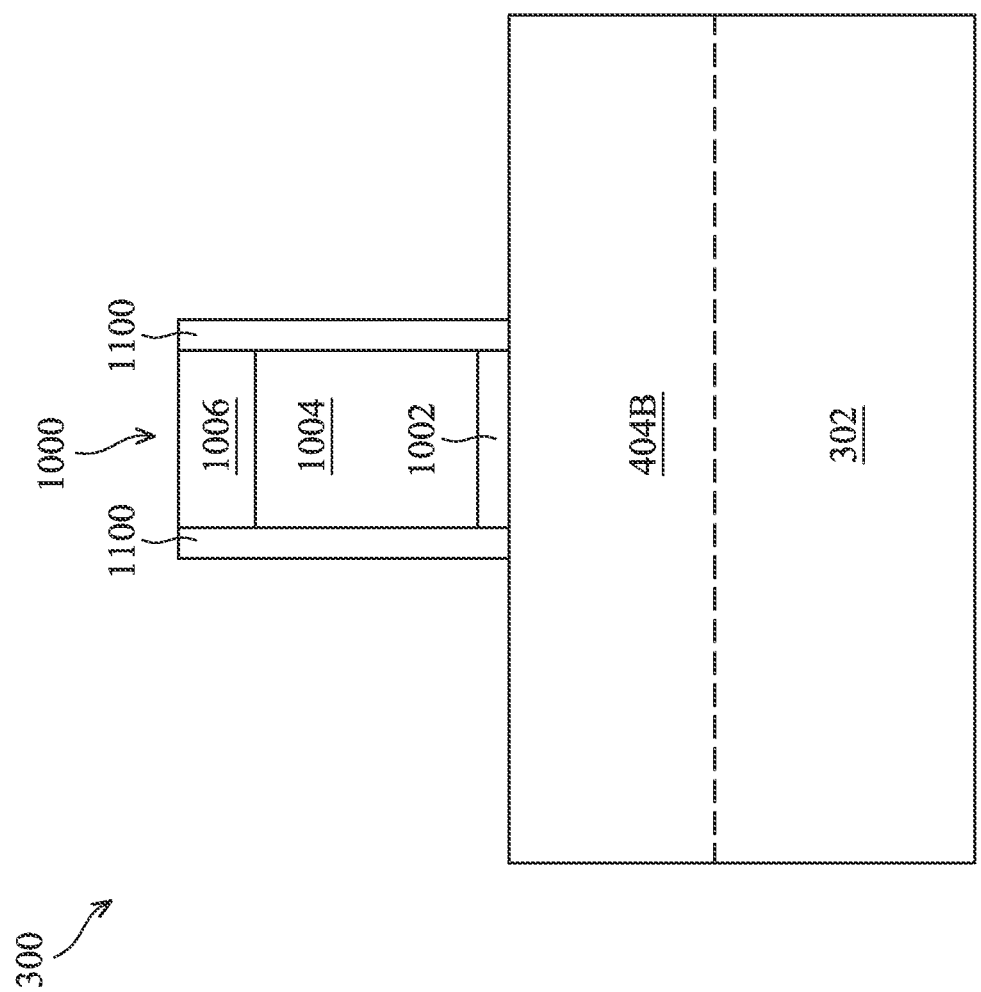
Figure 12:
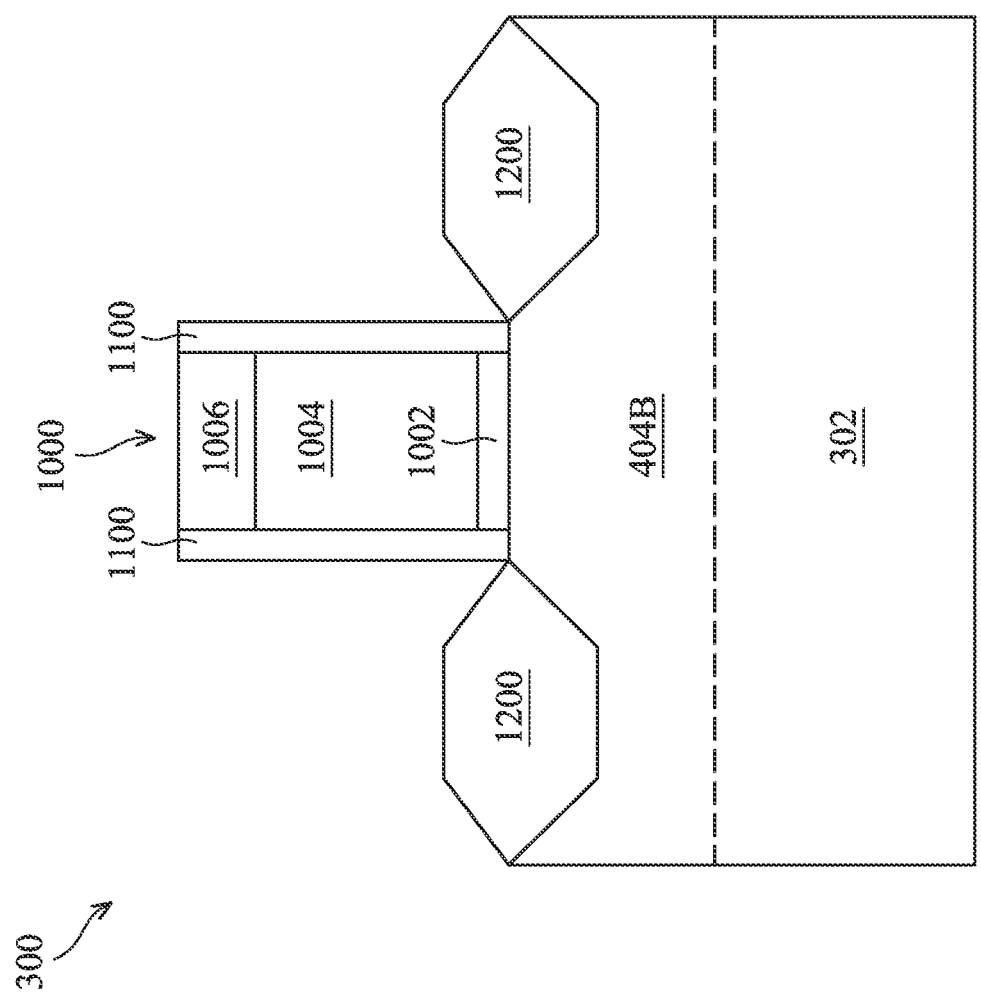
Figure 13:
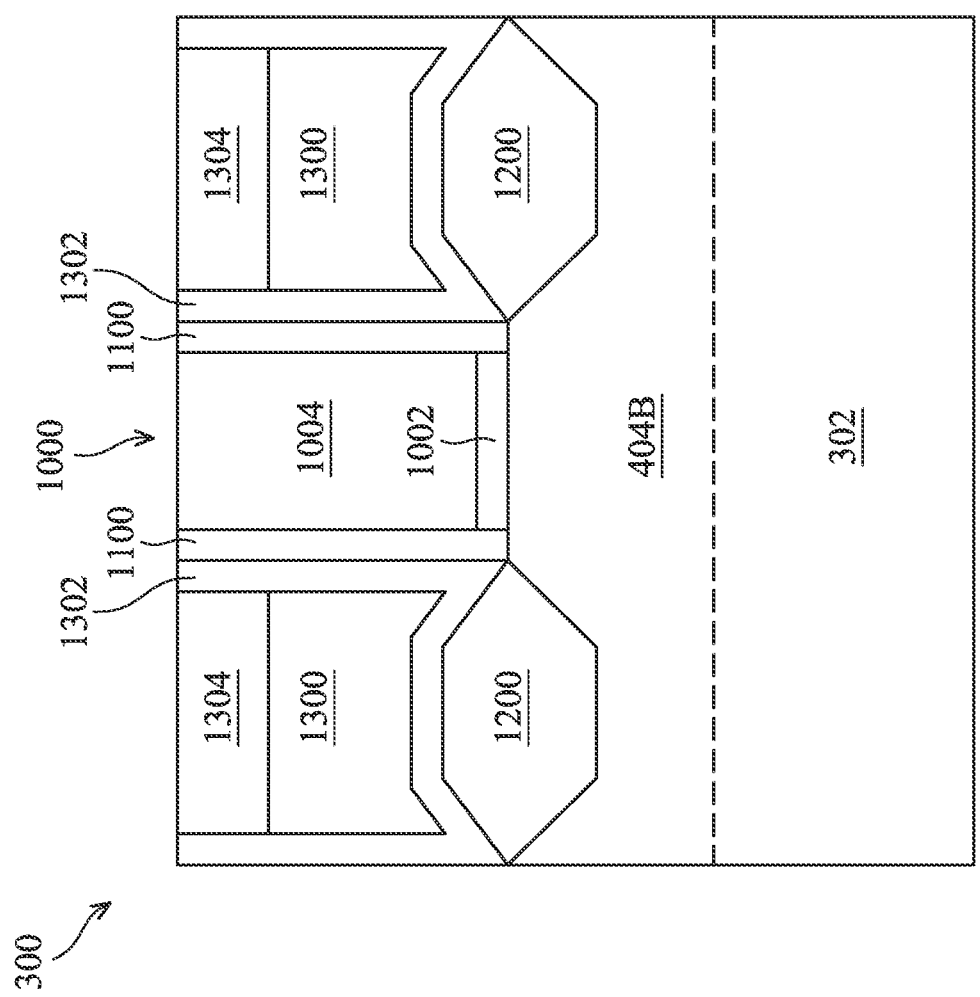

As mentioned above, FIGS. 3-16 each illustrate, in a cross-sectional view, a portion of a FinFET device 300 at various fabrication stages of the method 200 of FIG. 2. The FinFET device 300 is similar to the FinFET device 100 shown in FIG. 1, but with multiple fins. For example, FIGS. 3-10 and 14-16 illustrate cross-sectional views of the FinFET device 300 along cross-section B-B (as indicated in FIG. 1); and FIGS. 11-13 illustrate cross-sectional views of the FinFET device 300 along cross-section A-A (as indicated in FIG. 1). Although FIGS. 3-16 illustrate the FinFET device 300, it is understood the FinFET device 300 may include a number of other devices such as inductors, fuses, capacitors, coils, etc., which are not shown in FIGS. 3-16, for purposes of clarity of illustration.

Figure 3:
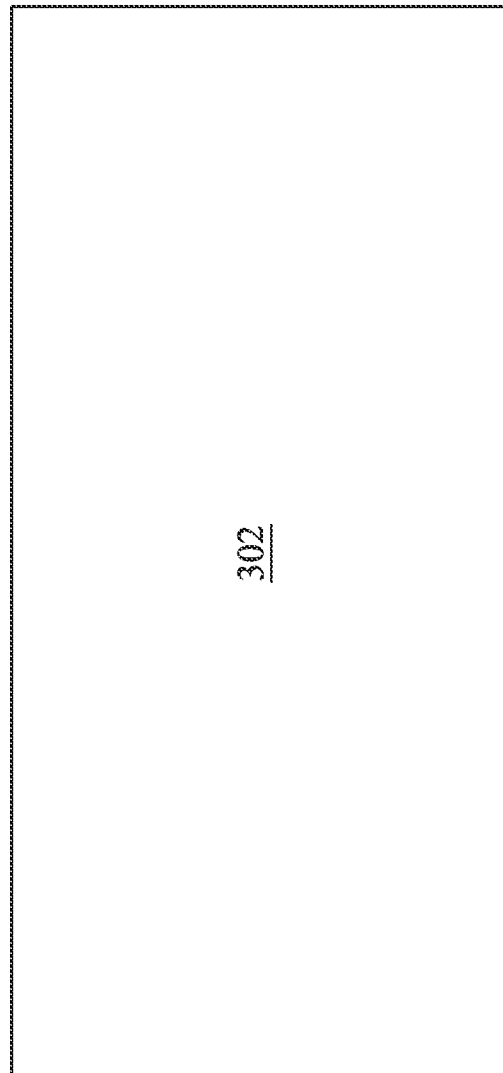
FIGS. 3, 4, 5, 6, 7, 8A, 8B, 8C, 9, 10, 11, 12, 13, 14A, 14B, 14C, 15A, 15B, 15C, and 16 illustrate cross-sectional views of an example FinFET device (or a portion of the example FinFET device) during various fabrication stages, made by the method of FIG. 2, in accordance with some embodiments.

Corresponding to operation 202 of FIG. 2, FIG. 3 is a cross-sectional view of the FinFET device 300 including a semiconductor substrate 302 at one of the various stages of fabrication. The cross-sectional view of FIG. 3 is cut along the lengthwise direction of an active/dummy gate structure of the FinFET device 300 (e.g., cross-section B-B indicated in FIG. 1).

The substrate 302 may be a semiconductor substrate, such as a bulk semiconductor, a semiconductor-on-insulator (SOI) substrate, or the like, which may be doped (e.g., with a p-type or an n-type dopant) or undoped. The substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 4:
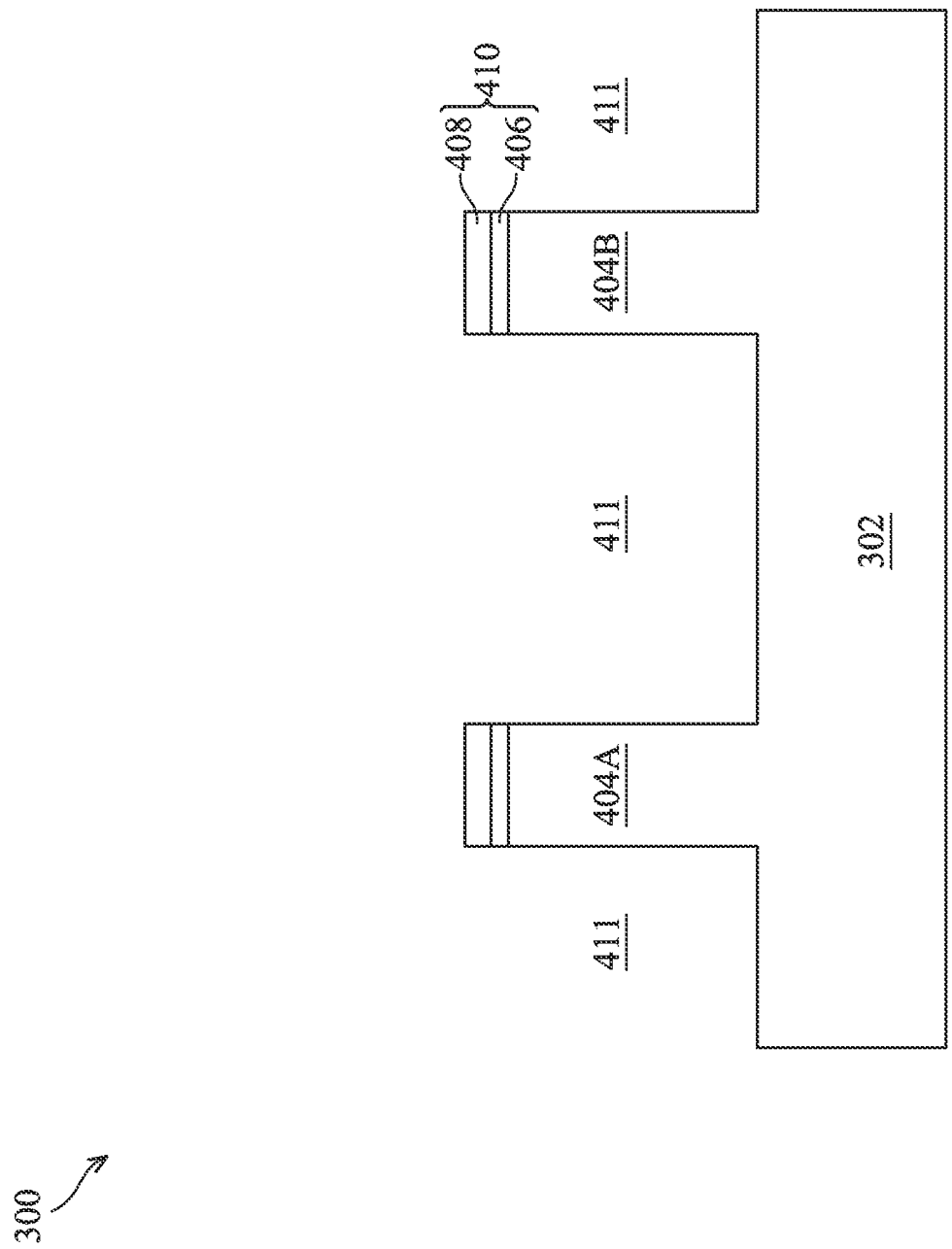

Corresponding to operation 204 of FIG. 2, FIG. 4 is a cross-sectional view of the FinFET device 300 including semiconductor fins 404A and 404B at one of the various stages of fabrication. The cross-sectional view of FIG. 4 is cut along the lengthwise direction of an active/dummy gate structure of the FinFET device 300 (e.g., cross-section B-B indicated in FIG. 1).

The semiconductor fins 404A-B may be each configured as an active fin, which will be adopted as an active (e.g., electrically functional) fin or channel in a respective completed FinFET. Hereinafter, the semiconductor fins 404A-B may sometimes be referred to as "active fins 404A-B." Although two semiconductor fins are shown in the illustrated example, it should be appreciated that the FinFET device 300 can include any number of semiconductor fins while remaining within the scope of the present disclosure.

The semiconductor fins 404A-B are formed by patterning the substrate 302 using, for example, photolithography and etching techniques. For example, a mask layer, such as a pad oxide layer 406 and an overlying pad nitride layer 408, is formed over the substrate 302. The pad oxide layer 406 may be a thin film comprising silicon oxide formed, for example, using a thermal oxidation process. The pad oxide layer 406 may act as an adhesion layer between the substrate 302 and the overlying pad nitride layer 408. In some embodiments, the pad nitride layer 408 is formed of silicon nitride, silicon oxynitride, silicon carbonitride, the like, or combinations thereof. Although only one pad nitride layer 408 is illustrated, a multilayer structure (e.g., a layer of silicon oxide on a layer of silicon nitride) may be formed as the pad nitride layer 408. The pad nitride layer 408 may be formed using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer 406 and pad nitride layer 408 to form a patterned mask 410, as illustrated in FIG. 4.

The patterned mask 410 is subsequently used to pattern exposed portions of the substrate 302 to form trenches (or openings) 411, thereby defining the active fins 404A-B between adjacent trenches 411 as illustrated in FIG. 4. When multiple fins are formed, such a trench may be disposed between any adjacent ones of the fins. In some embodiments, the active fins 404A-B are formed by etching trenches in the substrate 302 using, for example, reactive ion etch (ME), neutral beam etch (NBE), the like, or combinations thereof. The etch may be anisotropic. In some embodiments, the trenches 411 may be strips (viewed from the top) parallel to each other, and closely spaced with respect to each other. In some embodiments, the trenches 411 may be continuous and surround the active fins 404A-B.

The active fins 404A-B may be patterned by any suitable method. For example, the active fins 404A-B may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin.

FIGS. 3 and 4 illustrate an embodiment of forming the active fins 404A-B, but a fin may be formed in various different processes. For example, a top portion of the substrate 302 may be replaced by a suitable material, such as an epitaxial material suitable for an intended type (e.g., N-type or P-type) of semiconductor devices to be formed. Thereafter, the substrate 302, with epitaxial material on top, is patterned to form the active fins 404A-B that include the epitaxial material.

As another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form one or more fins.

In yet another example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form one or more fins.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ and implantation doping may be used together. Still further, it may be advantageous to epitaxially grow a material in an NMOS region different from the material in a PMOS region. In various embodiments, the active fins 404A-B may include silicon germanium ($Si_xGe_{1-x}$, where x can be between 0 and 1), silicon carbide, pure or pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 5:
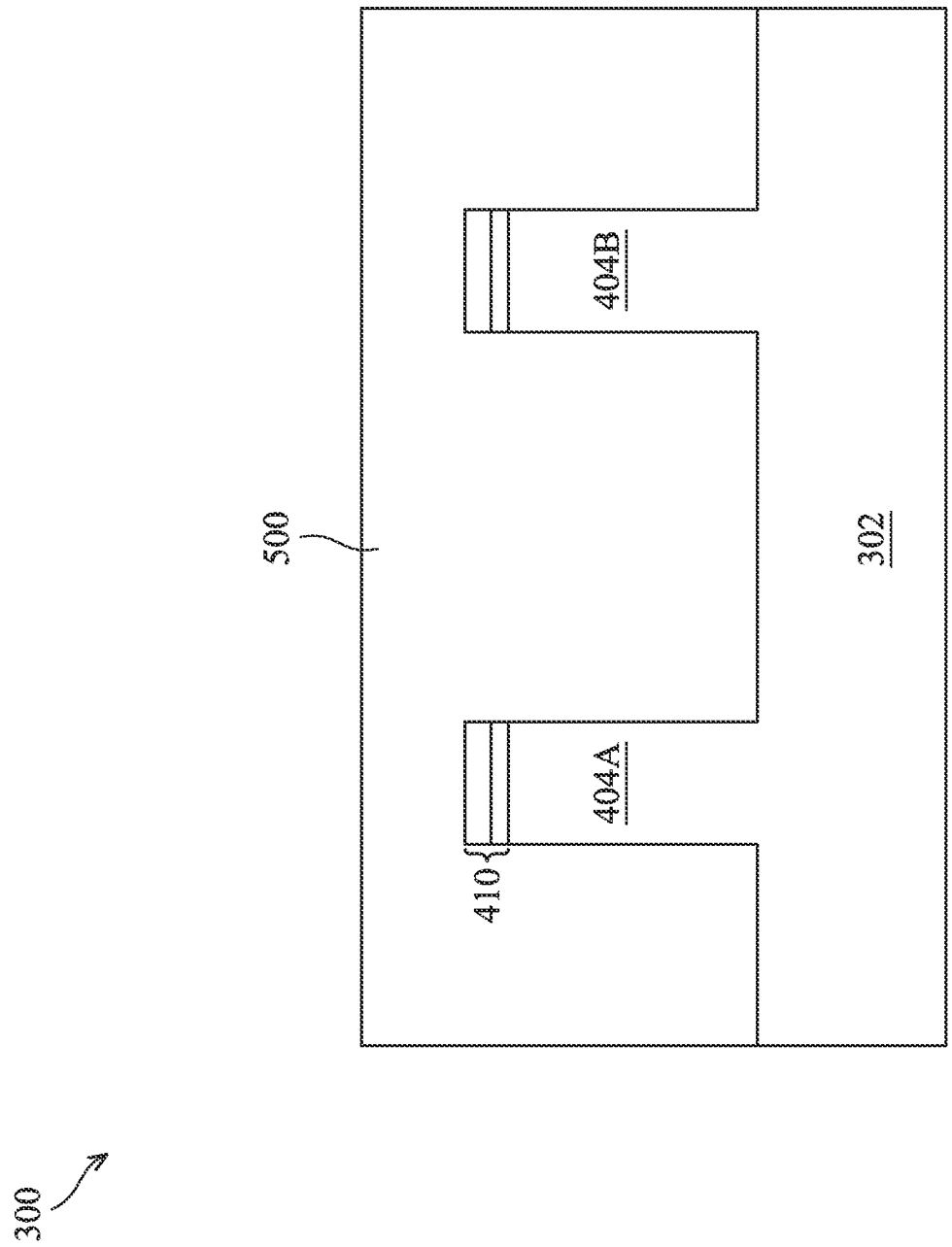

Corresponding to operation 206 of FIG. 2, FIG. 5 is a cross-sectional view of the FinFET device 300 including an isolation dielectric 500 at one of the various stages of fabrication at one of the various stages of fabrication. The cross-sectional view of FIG. 5 is cut along the lengthwise direction of an active/dummy gate structure of the FinFET device 300 (e.g., cross-section B-B indicated in FIG. 1).

The isolation dielectric 500 may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other isolation dielectrics and/or other formation processes may be used. In an example, the isolation dielectric 500 is silicon oxide formed by a FCVD process. An anneal process may be performed once the isolation dielectric 500 is formed.

In some embodiments, the isolation dielectric 500 may include a liner, e.g., a liner oxide (not shown), at the interface between the isolation dielectric 500 and the substrate 302 (active fins 404A-B). In some embodiments, the liner oxide is formed to reduce crystalline defects at the interface between the substrate 302 and the isolation dielectric 500. Similarly, the liner oxide may also be used to reduce crystalline defects at the interface between the active fins 404A-B and the isolation dielectric 500. The liner oxide (e.g., silicon oxide) may be a thermal oxide formed through a thermal oxidation of a surface layer of the substrate 302, although other suitable method may also be used to form the liner oxide.

Figure 6:
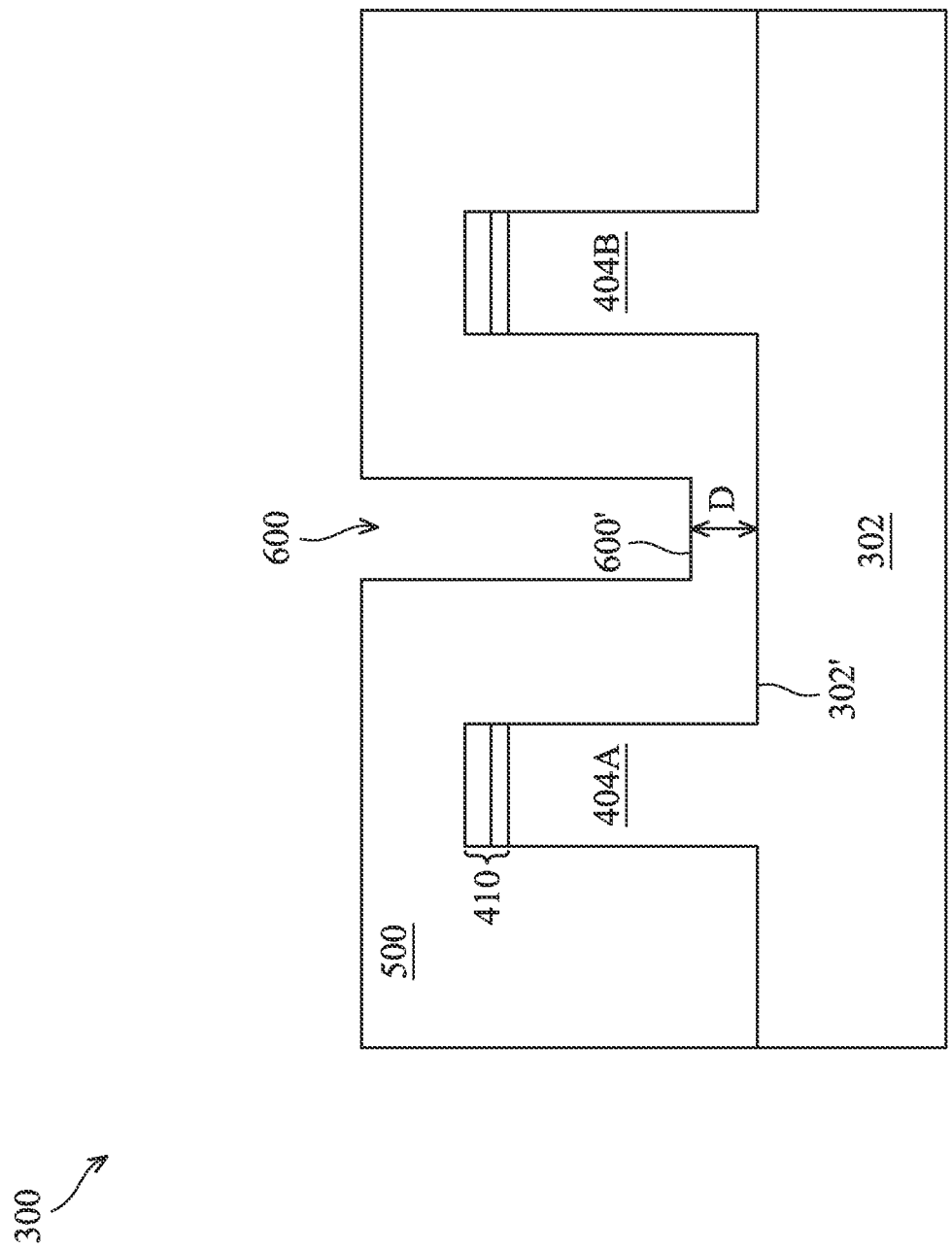

Corresponding to operation 208 of FIG. 2, FIG. 6 is a cross-sectional view of the FinFET device 300 including a dummy fin trench 600 at one of the various stages of fabrication at one of the various stages of fabrication. The cross-sectional view of FIG. 6 is cut along the lengthwise direction of an active/dummy gate structure of the FinFET device 300 (e.g., cross-section B-B indicated in FIG. 1).

Upon depositing the isolation dielectric 500 overlaying the active fins 404A-B, one or more dummy fin trenches, may be formed between the active fins 404A-B. For example in FIG. 6, the dummy fin trench 600 is formed between the active fins 404A and 404B. The dummy fin trench 600 can be formed by patterning the isolation dielectric 500 using, for example, photolithography and etching techniques. For example, a patterned mask may be formed over the isolation dielectric 500 to mask portions of the isolation dielectric 500 to form the dummy fin trench 600. Subsequently, unmasked portions of the isolation dielectric 500 may be etched using, for example, reactive ion etch (ME), neutral beam etch (NBE), the like, or combinations thereof, thereby defining the dummy fin trench 600 between adjacent active fins 404A-B (or in one of the trenches 411, FIG. 4). The etch may be anisotropic, in some embodiments.

In the illustrated example of FIG. 6, the dummy fin trench 600 has a bottom surface 600' vertically higher than a top surface 302' of the substrate 302. In other words, the bottom surface 600' is separated from the top surface 302' with a non-zero, positive distance (of the isolation dielectric 500), "D." D can be measured from the top surface 302' to the bottom surface 600'. It is understood that such a distance, D, can be zero or negative, while remaining within the scope of the present disclosure. For example, the formation of the dummy fin trench 600 may be stopped once a portion of the top surface 302' is exposed, which can result in a zero distance. In another example, the formation of the dummy fin trench 600 may be continued (in a controlled manner) after a portion of the top surface 302' is exposed, which can result in a non-zero, negative distance. In the following discussions, the illustrated embodiment of FIG. 6 will continue to be used as an representative example.

Figure 7:
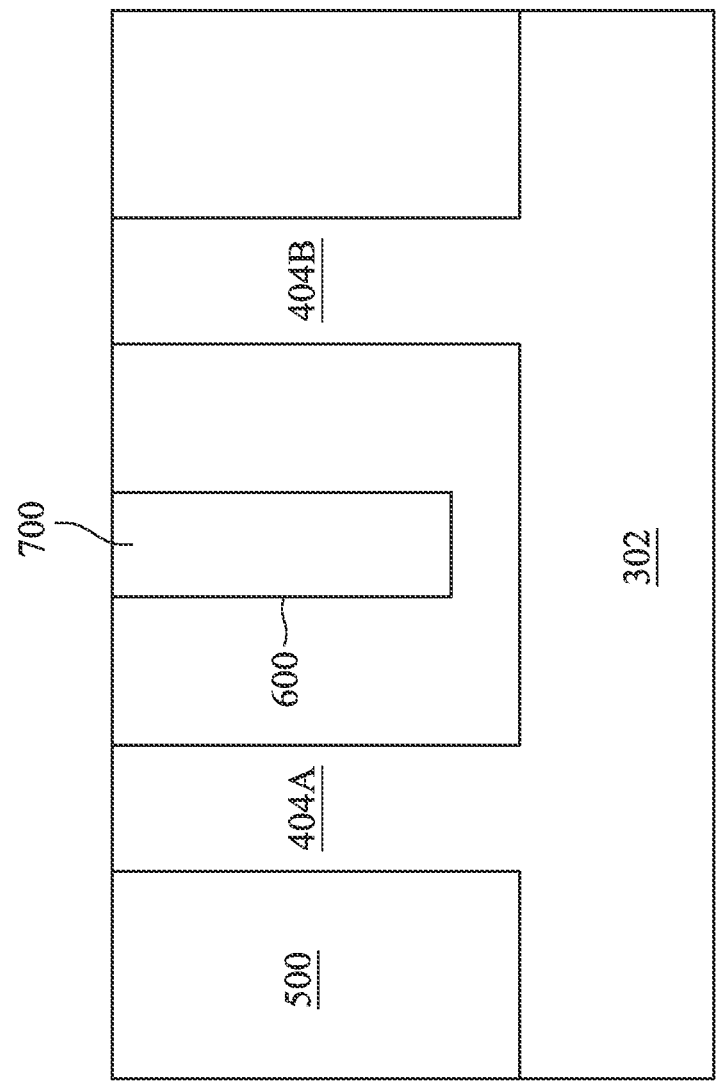

Corresponding to operation 210 of FIG. 2, FIG. 7 is a cross-sectional view of the FinFET device 300 including a dummy fin 700 at one of the various stages of fabrication at one of the various stages of fabrication. The cross-sectional view of FIG. 7 is cut along the lengthwise direction of an active/dummy gate structure of the FinFET device 300 (e.g., cross-section B-B indicated in FIG. 1).

The dummy fin 700 can be formed by filling the dummy fin trench 600 with a dielectric material using a deposition technique, followed by a chemical mechanical polish (CMP) process, which may remove any excess dielectric material and form top surfaces of the isolation dielectric 500 and a top surface of the fins 404A-B that are coplanar (not shown). In some embodiments, the patterned mask 410 may be removed by the planarization process. In some embodiments, the patterned mask 410 may remain after the planarization process. For clarity of illustration, the patterned mask 410 is not shown in FIG. 7. The dielectric material may include silicon oxide, silicon nitride, silicon oxynitride, silicon carbide, silicon carbonitride, silicon oxycarbonitride, silicon oxycarbide, or combinations thereof. In another example, the dielectric material may include group IV-based oxide or group IV-based nitride, e.g., tantalum nitride, tantalum oxide, hafnium oxide, or combinations thereof. The deposition technique to form the dummy fin 700 may include low-pressure chemical vapor deposition (LPCVD) or plasma enhanced chemical vapor deposition (PECVD), for example.

In advanced processing nodes, such a dummy fin can be disposed next to one or more active fins (e.g., between two adjacent active fins) to improve the overall design and fabrication of a semiconductor device. For example, dummy fins can be used for optical proximity correction (OPC) to enhance a pattern density and pattern uniformity in the stage of designing the semiconductor device. In another example, adding dummy fins adjacent to active fins can improve chemical-mechanical polishing (CMP) performance when fabricating the semiconductor device. The dummy fin is designed to stay inactive or electrically non-functional, when the semiconductor device is appropriately configured and powered.

Figure 8A:
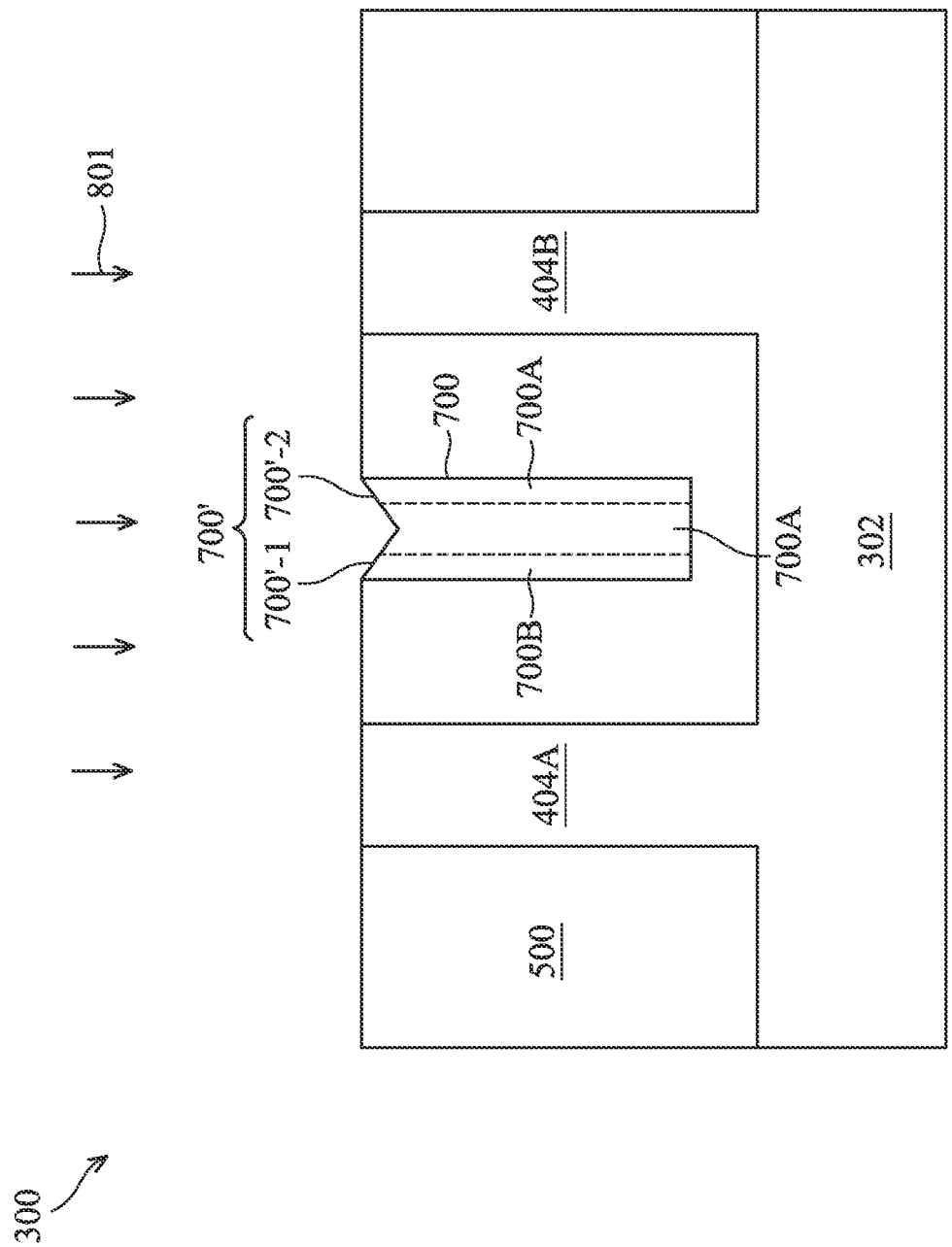
Figure 8B:
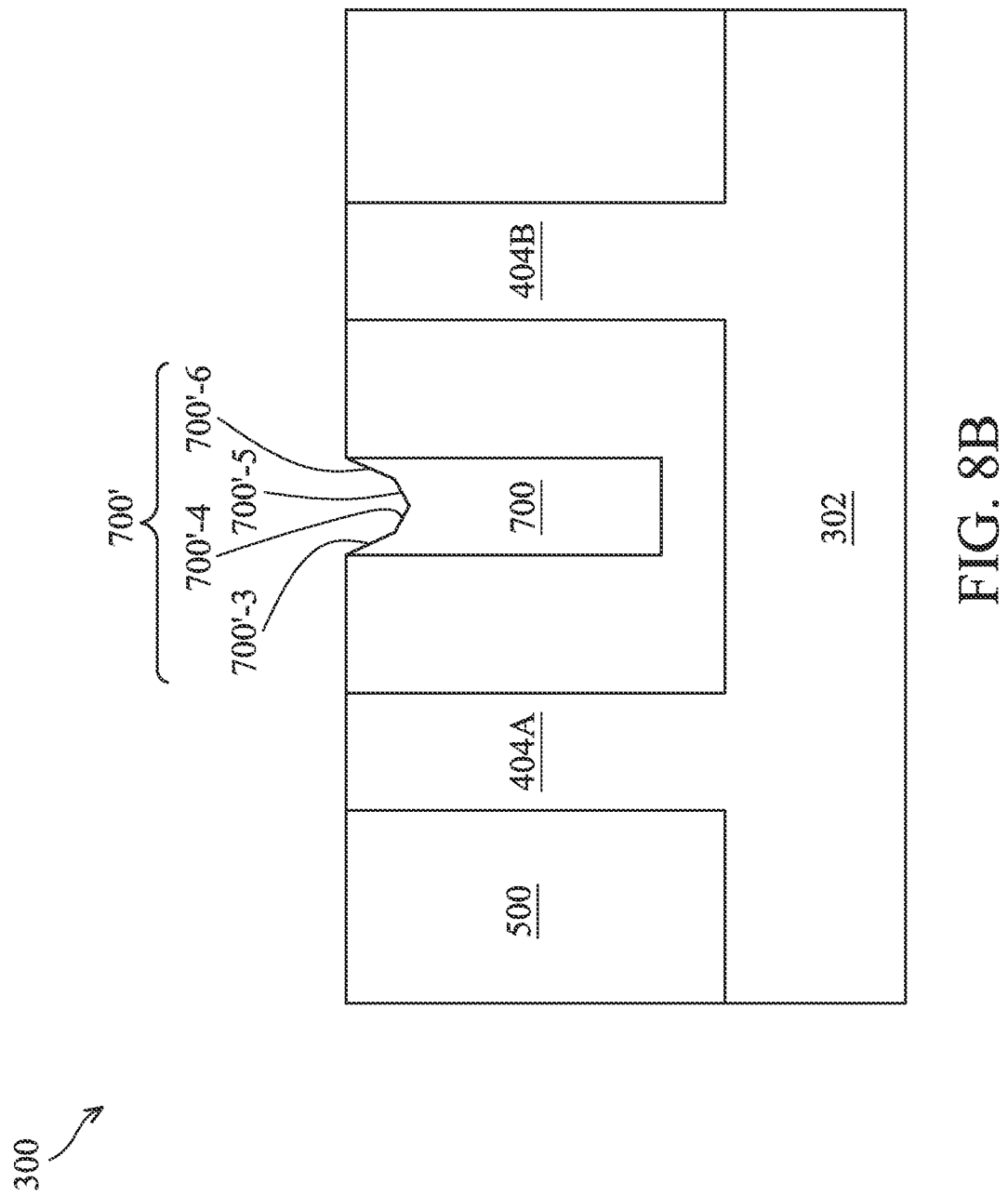
Figure 8C:
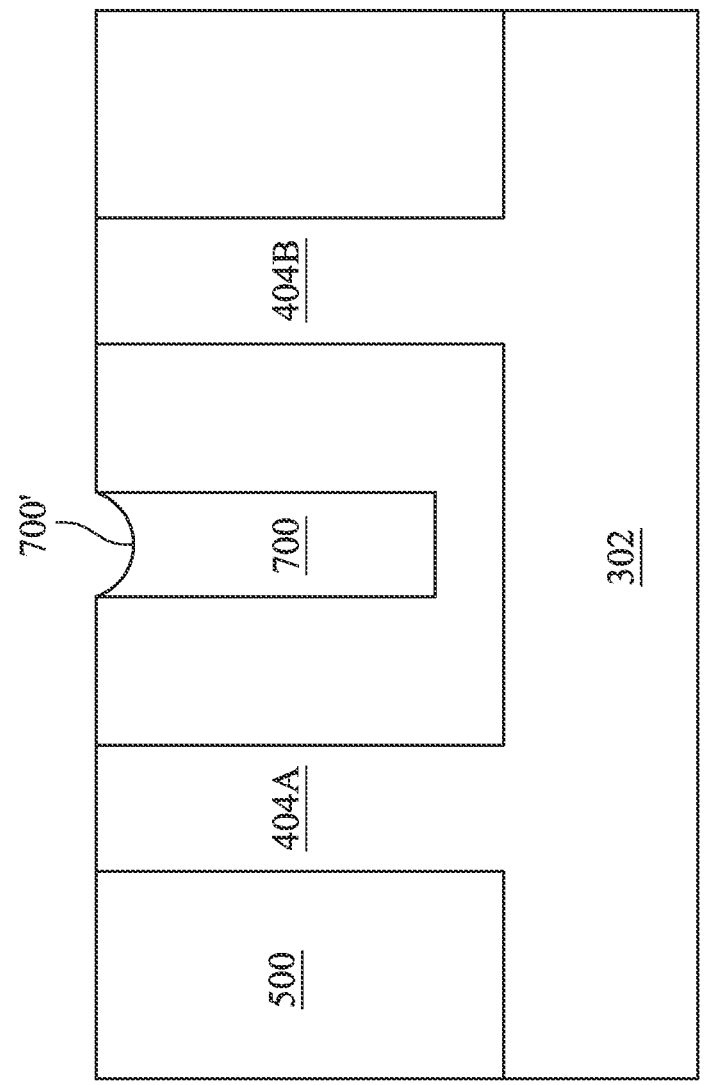

Corresponding to operation 212 of FIG. 2, FIGS. 8A, 8B, and 8C are each a cross-sectional view of the FinFET device 300 in which the dummy fin 700 is etched at one of the various stages of fabrication at one of the various stages of fabrication. The cross-sectional views of FIGS. 8A-C are each cut along the lengthwise direction of an active/dummy gate structure of the FinFET device 300 (e.g., cross-section B-B indicated in FIG. 1).

Upon forming the dummy fin 700, one or more etching processes 801 may be performed on the workpiece to cause a top surface 700' of the dummy fin 700 to have a v-shaped profile. The etching process 801 may include reactive ion etch (RIE), neutral beam etch (NBE), the like, or combinations thereof. The etch may be anisotropic. In some embodiments, the etching process 801 may be controlled to have a high etching selectivity between the isolation dielectric 500 and the dummy fin 700. For example, the etching process 801 can have a relatively high etching rate for the dummy fin 700 and a relatively low etching rate for the isolation dielectric 500. As such, a patterning process (e.g., a patterned mask) may not be required. During such an etching process (without requiring a patterned mask), the active fins 404A-B may still be covered by the patterned mask 410.

As shown in FIG. 8A, the top surface 700' has two edges or facets, 700'-1 and 700'-2, pointing toward each other, wherein each of these edges is tilted downward from a top surface of isolation dielectric 500. In this way, the dummy fin 700 may include one or more portions that present a relatively short height and one or more portions that present a relatively tall height. For example, the dummy fin 700, includes a central portion 700A with a relatively short height and two side portions 700B with a relatively tall height.

Although in the illustrated embodiment of FIG. 8A, the top surface 700' is formed as having two edges or facets, it is understood that the top surface 700' can include any number of edges as long as the dummy fin 700 includes a shorter central portion and one or more taller side portions, while remaining within the scope of the present disclosure. For example in FIG. 8B, the top surface 700' has four edges, 700'-3, 700'-4, 700'-5, and 700'-6, thereby causing the dummy fin 700 to include a shorter central portion and multiple shorter side portions. Further, although in the illustrated embodiment of FIG. 8A, the top surface 700' is formed as having an edge-based or facet-based profile, it is understood that the top surface 700' can have any of various other profiles as long as the dummy fin 700 includes a shorter central portion and one or more taller side portions, while remaining within the scope of the present disclosure. For example in FIG. 8C, the top surface 700' has a curvature-based profile that extends toward the substrate 302, thereby causing the dummy fin 700 to include a shorter central portion and multiple shorter side portions. In the following discussions, the illustrated embodiment of FIG. 8A will be used as an representative example.

Figure 9:
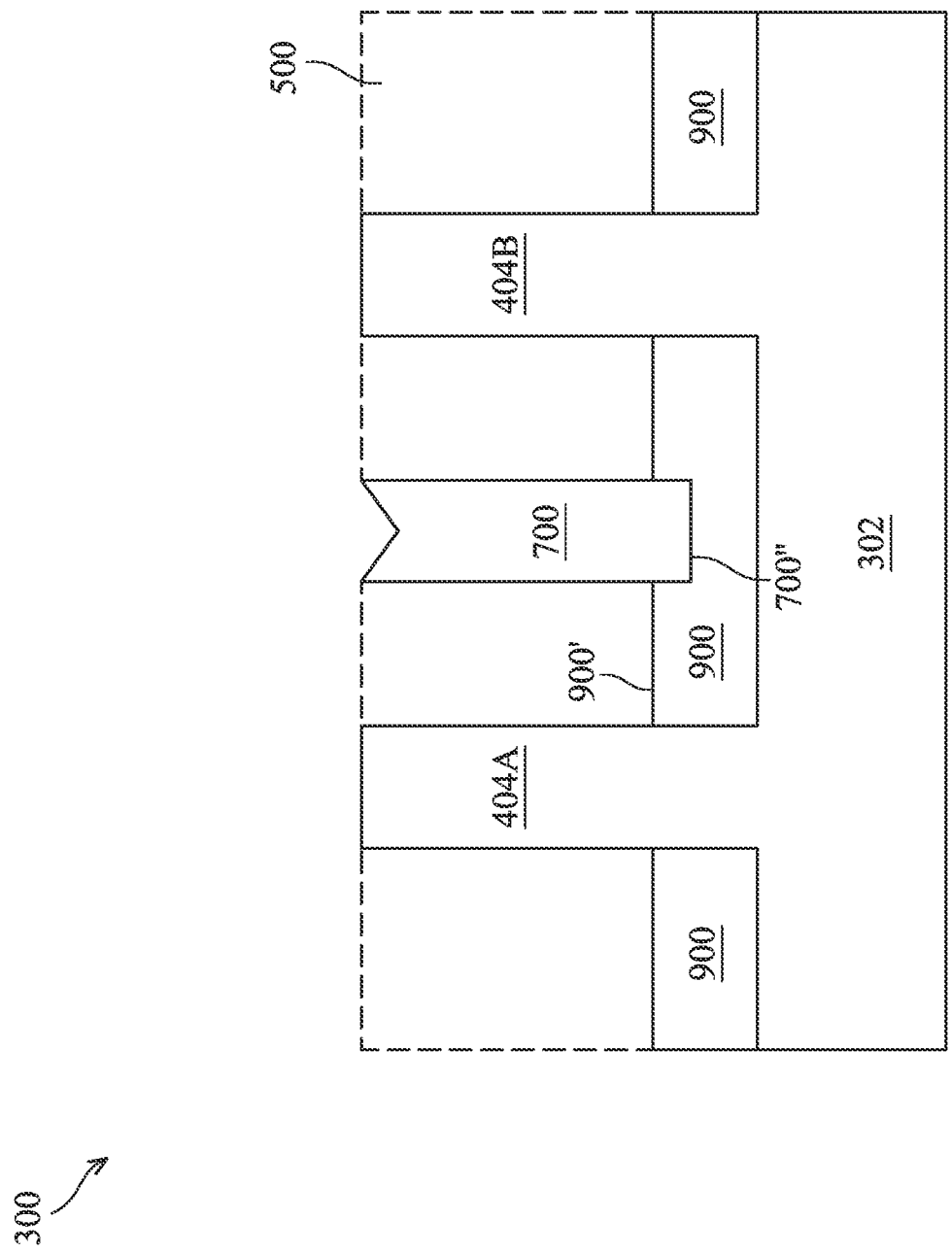

Corresponding to operation 214 of FIG. 2, FIG. 9 is a cross-sectional view of the FinFET device 300 including one or more isolation regions 900 at one of the various stages of fabrication at one of the various stages of fabrication. The cross-sectional view of FIG. 9 is cut along the lengthwise direction of an active/dummy gate structure of the FinFET device 300 (e.g., cross-section B-B indicated in FIG. 1).

The isolation regions 900 are formed by recessing the isolation dielectric 500, as indicated in dotted lines in FIG.

9. The isolation regions are sometimes referred to as shallow trench isolation (STI) regions 900. The isolation dielectric 500 is recessed such that upper portions of the fins 404A-B protrude from between neighboring STI regions 900. A top surface, 900', of the STI regions 900 may have a flat surface (as illustrated), a convex surface, a concave surface (such as dishing), or combinations thereof. The top surface 900' of the STI regions 900 may be formed flat, convex, and/or concave by an appropriate etch. The STI regions 900 may be recessed using an acceptable etching process, such as one that is selective to the material of the isolation dielectric 500. For example, a dry etch or a wet etch using dilute hydrofluoric (DHF) acid may be performed to recess the STI regions 900. Although in FIG. 9, the top surface 900' is formed vertically higher than a bottom surface, 700", of the dummy fin 700, it is understood that the top surface 900' may be formed aligned with the bottom surface 700", while remaining within the scope of the present disclosure.

Figure 10:
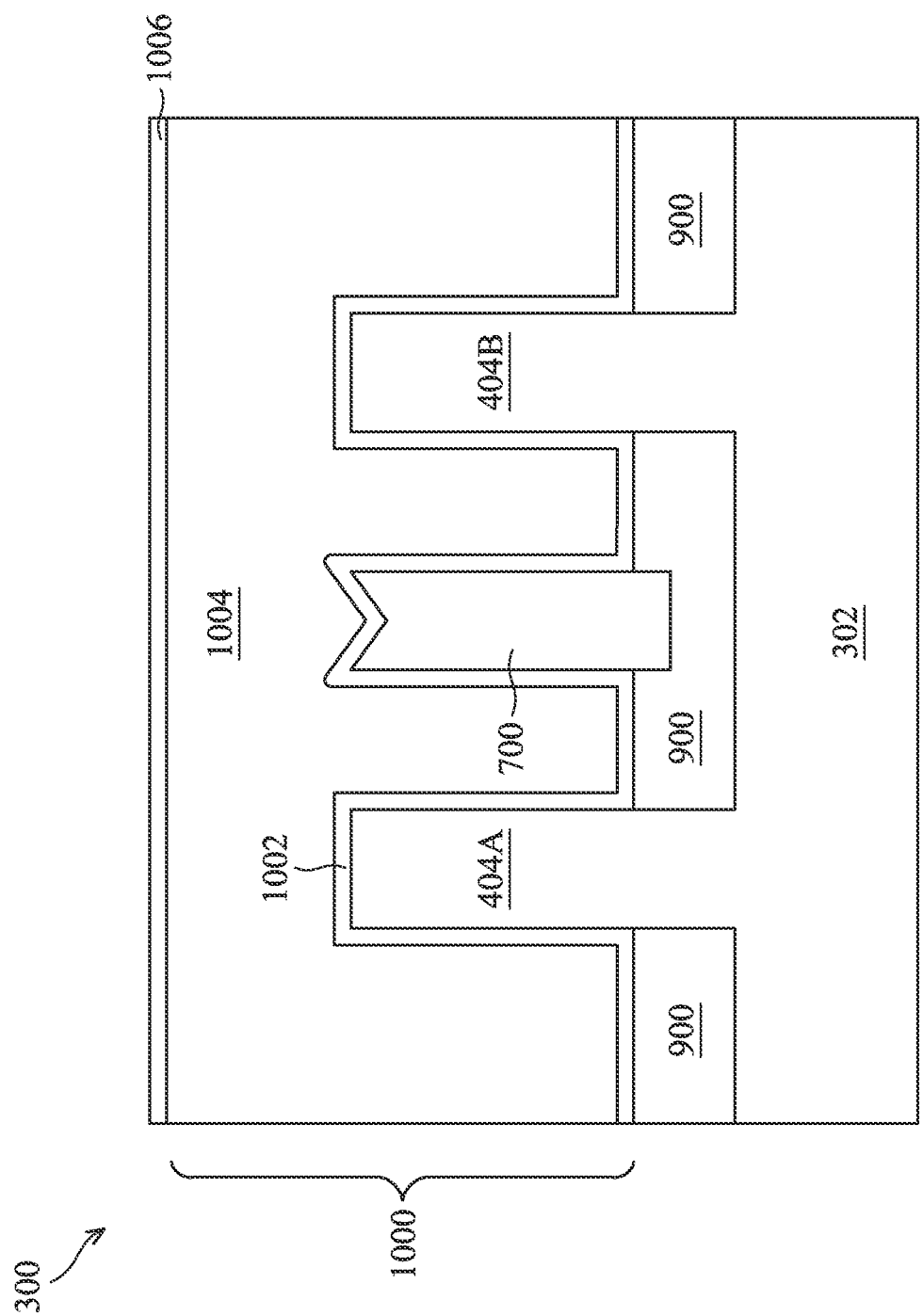

Corresponding to operation 216 of FIG. 2, FIG. 10 is a cross-sectional view of the FinFET device 300 including a dummy gate structure 1000 at one of the various stages of fabrication at one of the various stages of fabrication. The cross-sectional view of FIG. 10 is cut along the lengthwise direction of an active/dummy gate structure of the FinFET device 300 (e.g., cross-section B-B indicated in FIG. 1).

The dummy gate structure 1000 includes a dummy gate dielectric 1002 and a dummy gate 1004, in some embodiments. A mask 1006 may be formed over the dummy gate structure 1000. To form the dummy gate structure 1000, a dielectric layer is formed on the active fins 404A-B and dummy fin 700. The dielectric layer may be, for example, silicon oxide, silicon nitride, silicon oxynitride, silicon carbide, silicon carbonitride, silicon oxycarbonitride, silicon oxycarbide, multilayers thereof, or the like, and may be deposited or thermally grown.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using suitable lithography and etching techniques to form the mask 1006. The pattern of the mask 1006 then may be transferred to the gate layer and the dielectric layer by a suitable etching technique to form the dummy gate 1004 and the underlying dummy gate dielectric 1002, respectively. The dummy gate 1004 and the dummy gate dielectric 1002 straddle or otherwise cover a respective portion (e.g., a channel region) of each of the active fins 404A-B and the dummy fin 700. For example, when one dummy gate structure is formed, a dummy gate and dummy gate dielectric of the dummy gate structure may straddle respective central portions of the fins. The dummy gate 1004 may also have a lengthwise direction (e.g., cross-section B-B of FIG. 1) perpendicular to the lengthwise direction (e.g., cross-section A-A of FIG. 1) of the fins.

The dummy gate dielectric 1002 is shown to be formed over the active fins 404A-B and the dummy fin 700 (e.g., over the respective top surfaces and the sidewalls of the fins) and over the STI regions 900 in the example of FIG. 10. In other embodiments, the dummy gate dielectric 1002 may be formed by, e.g., thermal oxidization of a material of the fins, and therefore, may be formed over the fins but not over the STI regions 900. It should be appreciated that these and other variations are still included within the scope of the present disclosure.

FIGS. 11-13 illustrate the cross-sectional views of further processing (or making) of the FinFET device 300 along the lengthwise direction (e.g., cross-section A-A indicated in FIG. 1) of one of the active fins 404A-B. As a representative example, one dummy gate structure (e.g., 1000) is illustrated over the active fin 404B in FIGS. 11-13. It should be appreciated that more or less than one dummy gate structure can be formed over the fin 404B (and each of the other fins, e.g., 404A, 700), while remaining within the scope of the present disclosure.

Corresponding to operation 212 of FIG. 2, FIG. 11 is a cross-sectional view of the FinFET device 300 including a gate spacer 1100 formed around (e.g., along and contacting the sidewalls of) the dummy gate structure 1000. The cross-sectional view of FIG. 11 is cut along the lengthwise direction of the active fin 404B (e.g., cross-section A-A indicated in FIG. 1).

For example, the gate spacer 1100 may be formed on opposing sidewalls of the dummy gate structure 1000. Although the gate spacer 1100 is shown as a single layer in the example of FIG. 11 (and the following figures), it should be understood that the gate spacer can be formed to have any number of layers while remaining within the scope of the present disclosure. The gate spacer 1100 may be a low-k spacer and may be formed of a suitable dielectric material, such as silicon oxide, silicon oxycarbonitride, or the like. Any suitable deposition method, such as thermal oxidation, chemical vapor deposition (CVD), or the like, may be used to form the gate spacer 1100. The shapes and formation methods of the gate spacer 1100 as illustrated in FIG. 11 are merely non-limiting examples, and other shapes and formation methods are possible. These and other variations are fully intended to be included within the scope of the present disclosure.

Corresponding to operation 214 of FIG. 2, FIG. 12 is a cross-sectional view of the FinFET device 300 including a number (e.g., 2) of source/drain regions 1200 at one of the various stages of fabrication. The cross-sectional view of FIG. 12 is cut along the lengthwise direction of the active fin 404B (e.g., cross-section A-A indicated in FIG. 1).

The source/drain regions 1200 are formed in recesses of the active fin 404B adjacent to the dummy gate structures 1000, e.g., between adjacent dummy gate structures 1000 and/or next to a dummy gate structure 1000. The recesses are formed by, e.g., an anisotropic etching process using the dummy gate structures 1000 as an etching mask, in some embodiments, although any other suitable etching process may also be used.

The source/drain regions 1200 are formed by epitaxially growing a semiconductor material in the recess, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

As illustrated in FIG. 12, the epitaxial source/drain regions 1200 may have surfaces raised from the top surface of the active fin 404B (e.g. raised above the non-recessed portions of the active fin 404B) and may have facets. In some embodiments, the source/drain regions 1200 of the adjacent fins may merge to form a continuous epitaxial source/drain region (not shown). In some embodiments, the source/drain regions 1200 of the adjacent fins may not merge together and remain separate source/drain regions 1200 (not shown). In some embodiments, when the resulting FinFET device is an n-type FinFET, the source/drain regions 1200 can include silicon carbide (SiC), silicon phosphorous (SiP), phosphorous-doped silicon carbon (SiCP), or the like. In some embodiments, when the resulting FinFET device is a p-type FinFET, the source/drain regions 1200 comprise SiGe, and a p-type impurity such as boron or indium.

The epitaxial source/drain regions 1200 may be implanted with dopants to form source/drain regions 1200 followed by an annealing process. The implanting process may include forming and patterning masks such as a photoresist to cover the regions of the FinFET device 300 that are to be protected from the implanting process. The source/drain regions 1200 may have an impurity (e.g., dopant) concentration in a range from about $1 \times 10^{19}$ cm$^{-3}$ to about $1 \times 10^{21}$ cm$^{-3}$. P-type impurities, such as boron or indium, may be implanted in the source/drain regions 1200 of a P-type transistor. N-type impurities, such as phosphorous or arsenide, may be implanted in the source/drain regions 1200 of an N-type transistor. In some embodiments, the epitaxial source/drain regions 1200 may be in situ doped during their growth.

Corresponding to operation 216 of FIG. 2, FIG. 13 is a cross-sectional view of the FinFET device 300 including an interlayer dielectric (ILD) 1300 at one of the various stages of fabrication. The cross-sectional view of FIG. 13 is cut along the lengthwise direction of the active fin 404B (e.g., cross-section A-A indicated in FIG. 1).

In some embodiments, prior to forming the ILD 1300, a contact etch stop layer (CESL) 1302 is formed over the structure, as illustrated in FIG. 13. The CESL 1302 can function as an etch stop layer in a subsequent etching process, and may comprise a suitable material such as silicon oxide, silicon nitride, silicon oxynitride, combinations thereof, or the like, and may be formed by a suitable formation method such as CVD, PVD, combinations thereof, or the like.

Next, the ILD 1300 is formed over the CESL 1302 and over the dummy gate structure 1000. In some embodiments, the ILD 1300 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. After the ILD 1300 is formed, an optional dielectric layer 1304 is formed over the ILD 1300. The dielectric layer 1304 can function as a protection layer to prevent or reduces the loss of the ILD 1300 in subsequent etching processes. The dielectric layer 1304 may be formed of a suitable material, such as silicon nitride, silicon carbonitride, or the like, using a suitable method such as CVD, PECVD, or FCVD. After the dielectric layer 1304 is formed, a planarization process, such as a CMP process, may be performed to achieve a level upper surface for the dielectric layer 1304. The CMP may also remove the mask 1006 and portions of the CESL 1302 disposed over the dummy gate 1004 (FIG. 12). After the planarization process, the upper surface of the dielectric layer 1304 is level with the upper surface of the dummy gate 1004, in some embodiments.

An example gate-last process (sometimes referred to as replacement gate process) can then performed to replace the dummy gate structure 1000 with an active gate structure (which may also be referred to as a replacement gate structure or a metal gate structure). Prior to replacing the dummy gate structure, a portion of the dummy gate structure disposed between the active fins can be replaced with a gate isolation structure so as to separate the active gate structure into different portions that are electrically coupled to the active fins, respectively. FIGS. 14A-16 illustrate the cross-sectional views of further processing (or making) of the FinFET device 300, which will be discussed in more detail as follows.

Figure 14A:
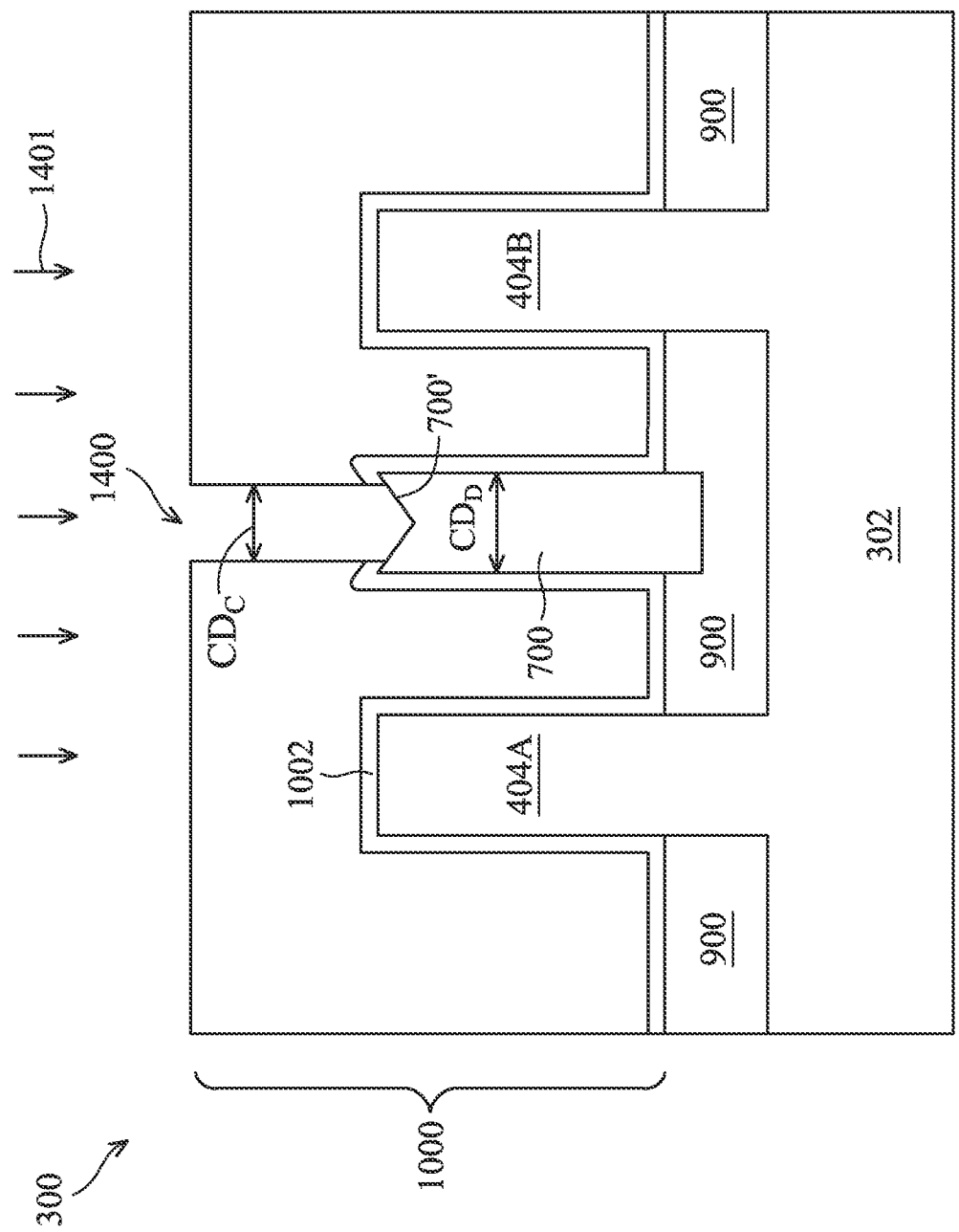
Figure 14B:
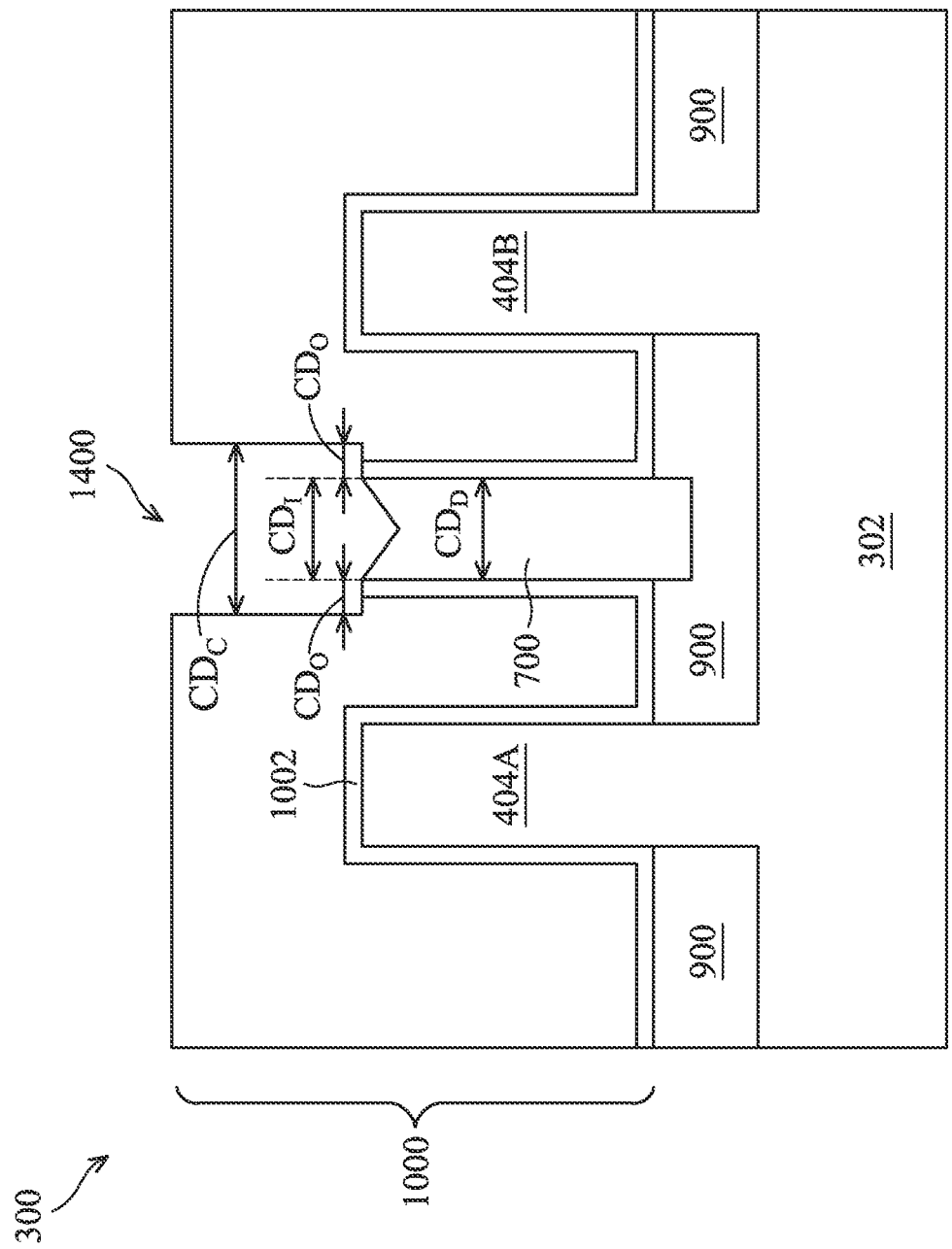
Figure 14C:
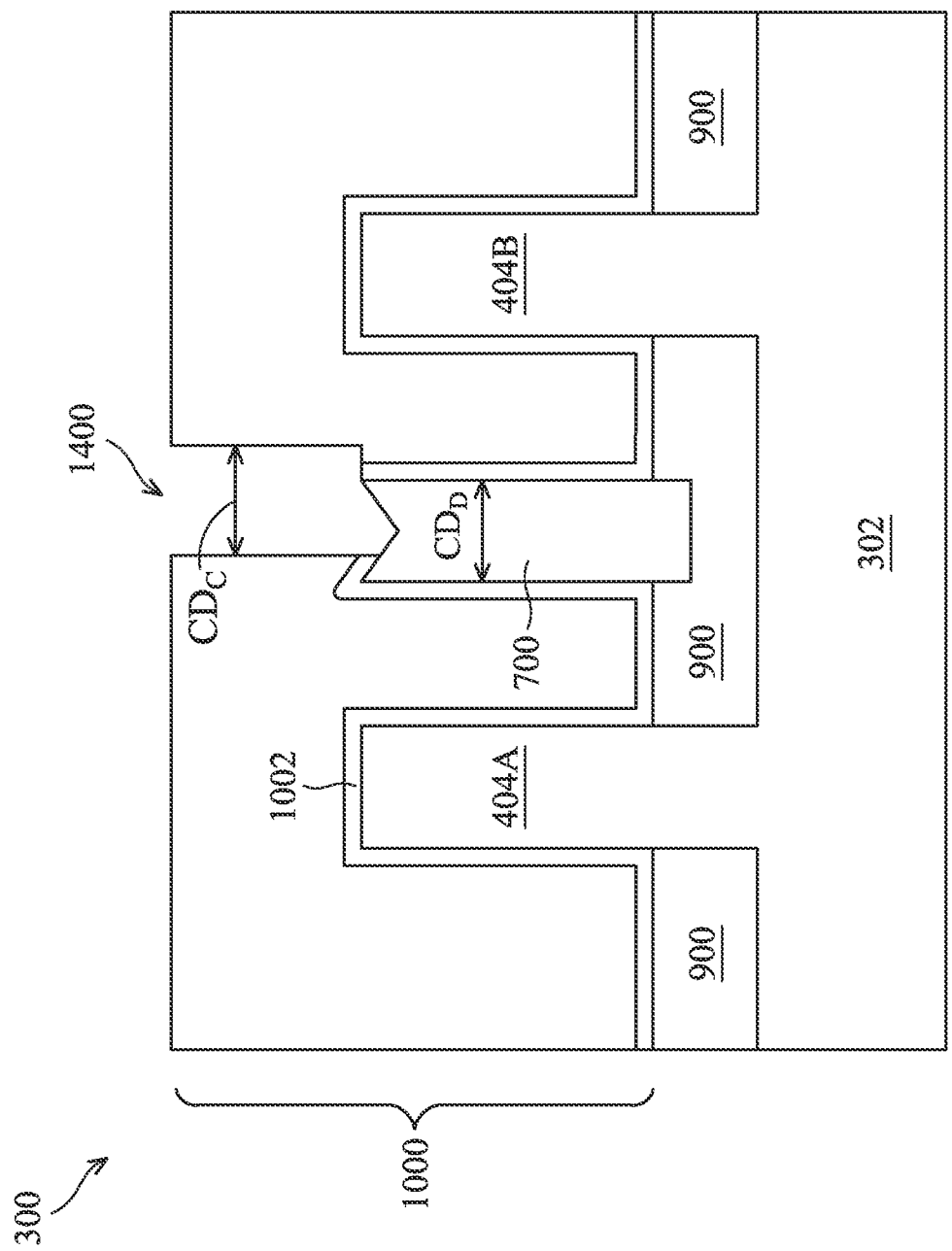

Corresponding to operation 224 of FIG. 2, FIGS. 14A, 14B, and 14C are each a cross-sectional view of the FinFET device 300 in which the dummy gate structure 1000 is cut, intercepted, or otherwise disconnected to form a gate cut trench (or otherwise opening) 1400 at one of the various stages of fabrication. The cross-sectional views of FIGS. 14A-C are each cut along the lengthwise direction of an active/dummy gate structure of the FinFET device 300 (e.g., cross-section B-B indicated in FIG. 1). Specifically, FIGS. 14A-B illustrate various embodiments of the gate cut trench 1400 that have respective different critical dimensions (CD's) along the lengthwise direction of the dummy gate structure 1000 (hereinafter "$CD_C$") with respect to a critical dimension of the dummy fin 700 along the same direction (hereinafter "$CD_D$"); and FIG. 14C illustrates an embodiment in which the gate cut trench 1400 is laterally shifted from the dummy fin 700.

To form the gate cut trench 1400, a mask (not shown) may be formed over the dummy gate structure 1000 to expose a portion of the dummy gate structure 1000 desired to be removed (e.g., the portion disposed over the dummy fin 700), followed by an etching processes 1401 (FIG. 14A) to remove the portion of the dummy gate structure 1000. It should be understood that the dummy gate structure 1000 may be cut prior to the formation of source/drain regions 1200 (operation 214 of FIG. 2), while remaining within the scope of the present disclosure. During the removal of the dummy gate structure 1000, the dummy fin 700 may function as an etch stop layer by having a high etching selectivity between the dummy fin 700 and the dummy gate structure 1000. For example, the etching process 1401 may have a higher etching rate for the dummy gate structure 1000 than the dummy fin 700. Further, in various embodiments, the higher side portion(s) of the dummy fin 700 can limit the gate cut trench 1400 from being laterally expanded.

For example, the etching process 1401 may be configured to remove the portion of the dummy gate structure 1000 so as to at least partially expose the top surface 700' of the dummy fin 700 that has a v-shaped profile, as discussed above. Upon the top surface 700' being exposed, the etching process 1401 may be slowed down by at least one of the side portions of the dummy fin 700 due to its (or their) relatively great height. In other words, the etching process 1401 may be confined around the central portion of the dummy fin 700 by the side portion(s) of the dummy fin 700, thereby limiting the amount of lateral penetration into the dummy gate structure. As such, undesired lateral expansion of the gate cut trench 1400 can be avoided.

In the illustrated embodiment of FIG. 14A, $CD_C$ is less than $CD_D$. In some cases, $CD_C$ may be intentionally or inadvertently greater than $CD_D$, as illustrated in FIG. 14B. When this occurs, $CD_C$ may include two components, $CD_I$ and $CD_O$. $CD_I$ corresponds to the critical dimension of an inner portion of the gate cut trench 1400 whose vertical projection is approximately aligned with the dummy fin 700, and $CD_O$ corresponds to the critical dimension of an outer portion of the gate cut trench 1400 that is outside the inner portion. $CD_C$ may equal to $CD_I + 2 \times CD_O$. By having the side portions of the dummy fin 700 with a relatively tall height, as discussed above, $CD_O$ can be advantageously limited. As such, $CD_C$ can be avoided to be disadvantageously enlarged. In some other cases, the gate cut trench 1400 may be shifted from the dummy fin 700, e.g., due to the misalignment of a patterning process, as illustrated in FIG. 14C. When this occurs, $CD_C$ may include two components, $CD_I$ and $CD_O$. $CD_I$ corresponds to the critical dimension of an inner portion of the gate cut trench 1400 whose vertical projection is approximately aligned with the dummy fin 700, and $CD_O$ corresponds to the critical dimension of an outer portion of the gate cut trench 1400 that is outside the inner portion. $CD_C$ may be equal to $CD_I+CD_O$. By having the side portions of the dummy fin 700 with a relatively tall height, as discussed above, $CD_O$ can be advantageously limited. As such, $CD_C$ can be avoided to be disadvantageously enlarged.

The etching process 1401 may be configured to have at least some anisotropic etching characteristic to limit the undesired lateral etch. For example, the etching process 1401 can include a plasma etching process, which can have a certain amount of anisotropic characteristic. In such a plasma etching process (including radical plasma etching, remote plasma etching, and other suitable plasma etching processes), gas sources such as chlorine ($Cl_2$), hydrogen bromide (HBr), carbon tetrafluoride ($CF_4$), fluoroform ($CHF_3$), difluoromethane ($CH_2F_2$), fluoromethane ($CH_3F$), hexafluoro-1,3-butadiene ($C_4F_6$), boron trichloride ($BCl_3$), sulfur hexafluoride ($SF_6$), hydrogen ($H_2$), nitrogen trifluoride ($NF_3$), and other suitable gas sources and combinations thereof can be used with passivation gases such as nitrogen ($N_2$), oxygen ($O_2$), carbon dioxide ($CO_2$), sulfur dioxide ($SO_2$), carbon monoxide (CO), methane ($CH_4$), silicon tetrachloride ($SiCl_4$), and other suitable passivation gases and combinations thereof. Moreover, for the plasma etching process, the gas sources and/or the passivation gases can be diluted with gases such as argon (Ar), helium (He), neon (Ne), and other suitable dilutive gases and combinations thereof to control the above-described etching rates. As a non-limiting example, a source power of 10 watts to 3000 watts, a bias power of 0 watts to 3000 watts, a pressure of 1 millitorr to 5 torr, and an etch gas flow of 0 standard cubic centimeters per minute to 5000 standard cubic centimeters per minute may be used in the etching process 1401. However, it is noted that source powers, bias powers, pressures, and flow rates outside of these ranges are also contemplated.

In another example, the etching process 1401 can include a wet etching process, which can have a certain amount of isotropic characteristic, in combination with the plasma etching process. In such a wet etching process, a main etch chemical such as hydrofluoric acid (HF), and other suitable main etch chemicals and combinations thereof can be used with assistive etch chemicals such as sulfuric acid ($H_2SO_4$), hydrogen chloride (HCl), hydrogen bromide (HBr), ammonia ($NH_3$), phosphoric acid ($H_3PO_4$), and other suitable assistive etch chemicals and combinations thereof as well as solvents such as deionized water, alcohol, acetone, and other suitable solvents and combinations thereof to control the above-described etching rates.

Figure 15A:
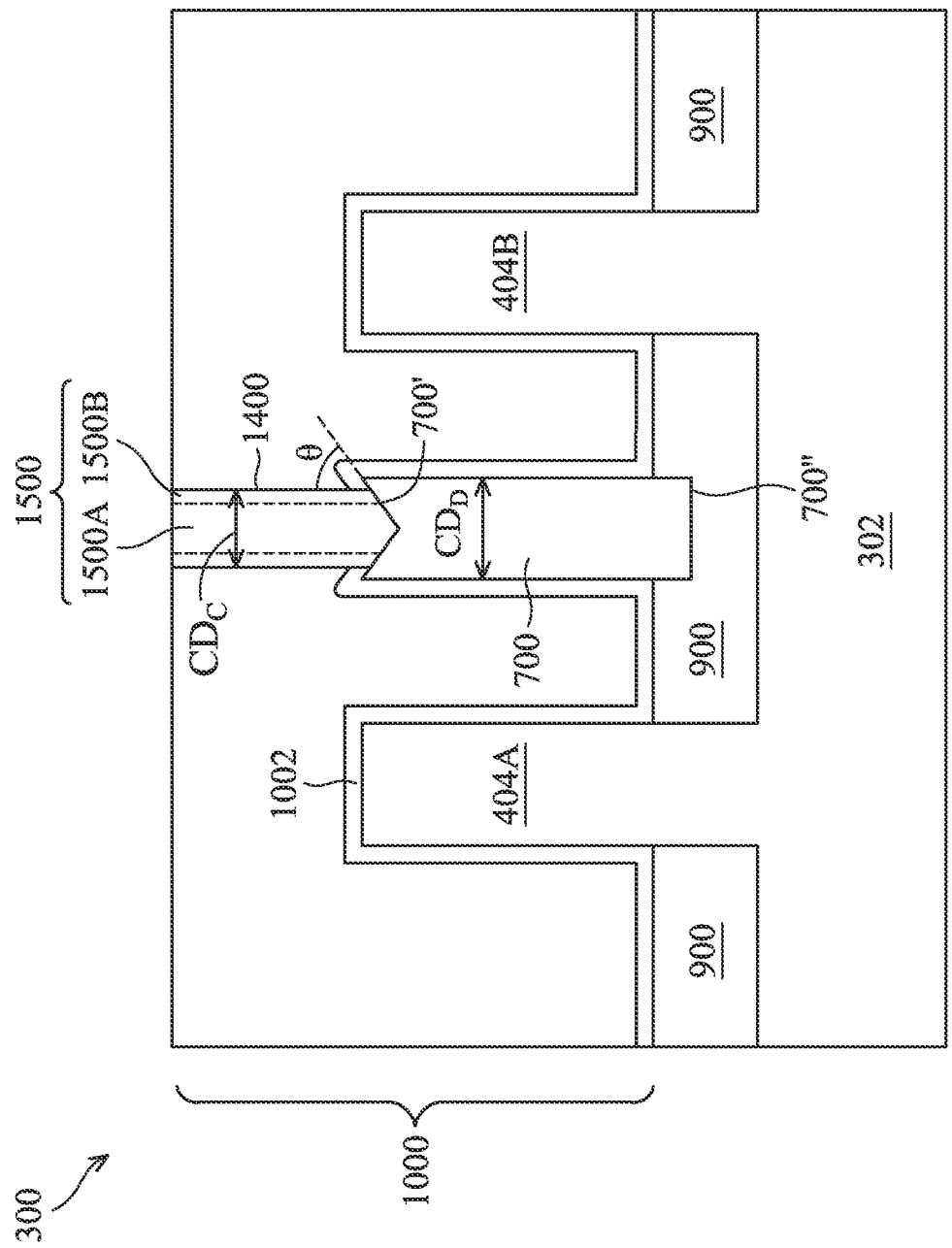
Figure 15B:
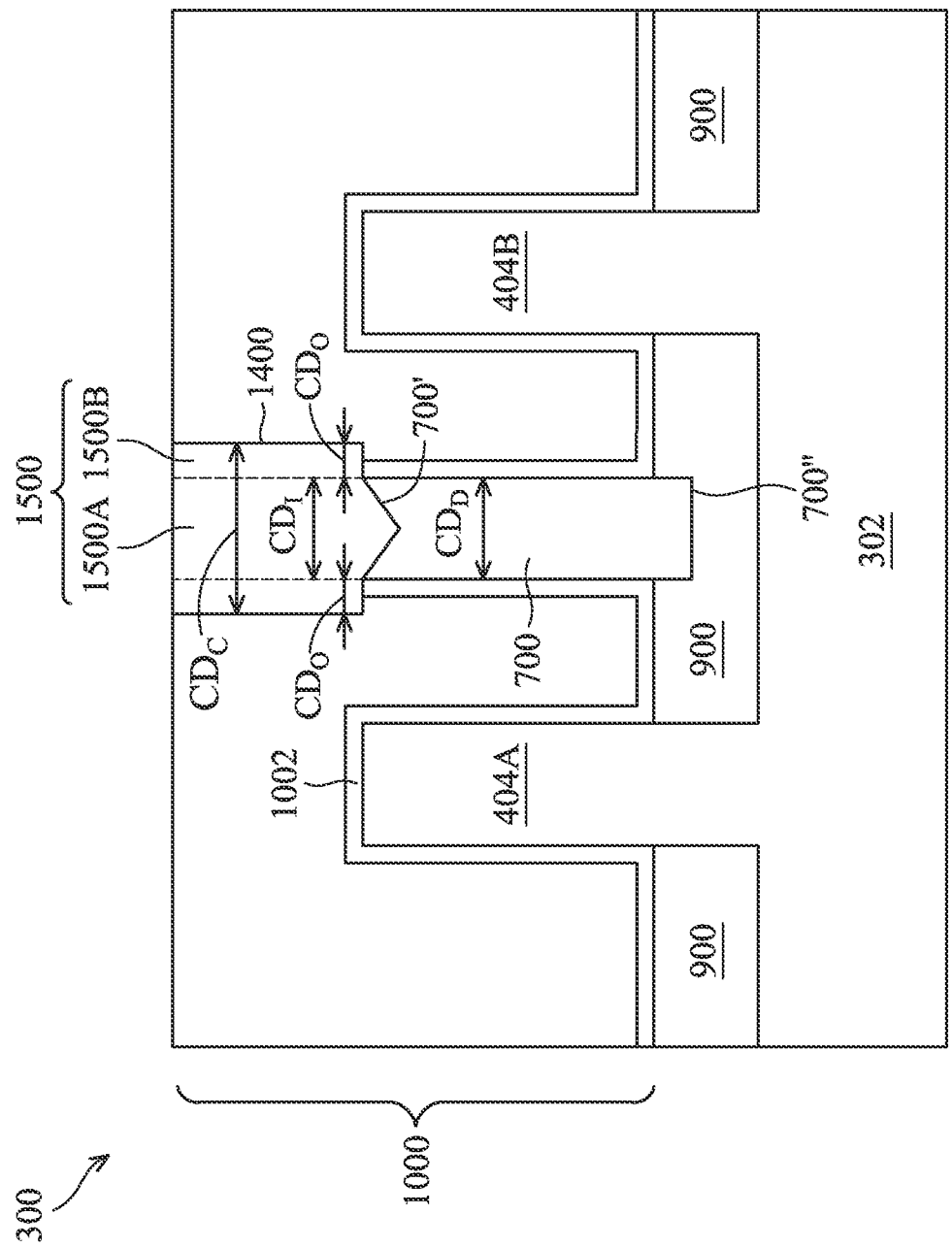
Figure 15C:
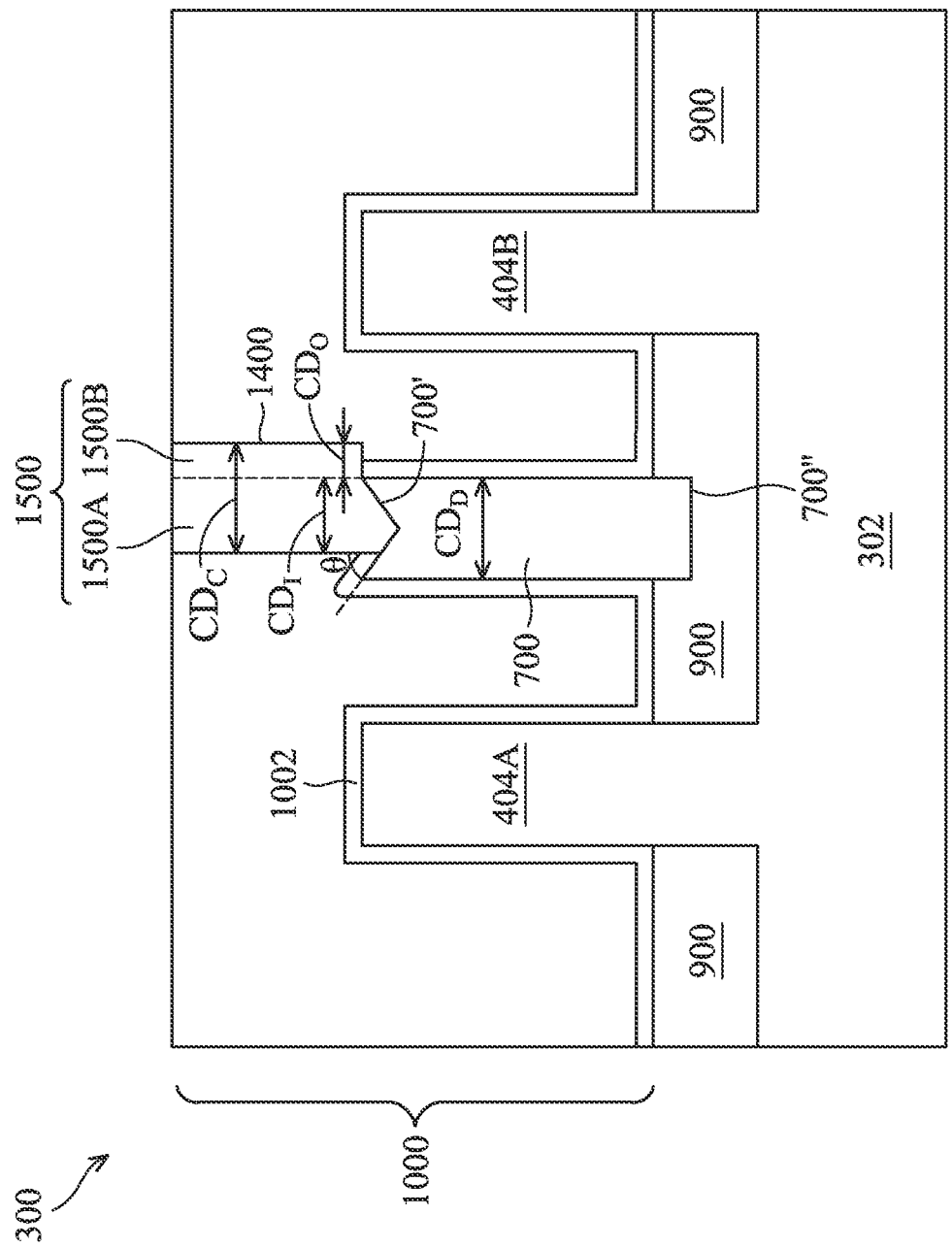

Corresponding to operation 226 of FIG. 2, FIGS. 15A, 15B, and 15C are each a cross-sectional view of the FinFET device 300 including a gate isolation structure 1500 at one of the various stages of fabrication. The cross-sectional views of FIGS. 15A-C are each cut along the lengthwise direction of the dummy gate structure 1000 (e.g., cross-section B-B indicated in FIG. 1). Specifically, the gate isolation structures 1500 of FIGS. 15A-C are formed according to the gate cut trenches 1400 of FIGS. 14A-C, respectively.

The gate isolation structure 1500 is formed by filling the gate cut trench 1400 with a dielectric material, which can thus inherit the profile (or dimensions) of the gate cut trench 1400. As such, the gate isolation structure 1500 can include a central portion 1500A and one or more side portions 1500B. The central portion 1500A extends farther into the dummy fin 700 than the side portion(s) 1500B, as illustrated in FIGS. 15A-C. Further, at least a bottom surface of the central portion, which is in contact with the top surface 700' of the dummy fin 700, can follow its v-shaped profile. In some other embodiments, the bottom surface of the central portion and a bottom surface of at least one of the side portions can be in contact with the top surface 700' so as to follow the v-shaped profile. For example in FIG. 15A, the respective bottom surfaces of the central portion 1500A and both side portions 1500B collectively follow the v-shaped profile of the dummy fin 700. In another example of FIG. 15B-C, at least the central portion 1500A follows the v-shaped profile of the dummy fin 700.

In accordance with various embodiments, at least a portion of the top surface 700' of the dummy fin 700 and at least one of the sidewalls of the gate isolation structure 1500 can form an acute angle. As shown in FIG. 15A, each of the edges of the top surface 700' and a corresponding one of the sidewalls of the gate isolation structure 1500 form an angle, θ, that is less than 90°. In another example of FIG. 15C, one of the edges of the top surface 700' and one of the sidewalls of the gate isolation structure 1500 form an angle, θ, that is less than 90°.

In accordance with various embodiments, the gate isolation structure 1500 can also be characterized with $CD_C$ of the gate cut trench 1400. For example in FIG. 15A where the gate isolation structure 1500 fills the gate cut trench 1400 of FIG. 14A, the gate isolation structure 1500 can have its $CD_C$ less than $CD_D$. For example in FIG. 15B where the gate isolation structure 1500 fills the gate cut trench 1400 of FIG. 14B, the gate isolation structure 1500 can have its $CD_C$ greater than $CD_D$ and including two components, $CD_I$ and $CD_O$. $CD_I$ and $CD_O$ may correspond to critical dimensions of the central portion 1500A and side portion 1500B, respectively. For example in FIG. 15C where the gate isolation structure 1500 fills the gate cut trench 1400 of FIG. 14C, the gate isolation structure 1500 can have its $CD_C$ including two components, $CD_I$ and $CD_O$. $CD_I$ and $CD_O$ may correspond to critical dimensions of the central portion 1500A and side portion 1500B, respectively. In the following discussions, the illustrated embodiment of FIG. 15A will be used as an representative example.

The dielectric material that is used to form the gate isolation structure 1500 may include, for example, silicon oxide, silicon nitride, silicon oxynitride, silicon carbide, silicon carbonitride, silicon oxycarbonitride, silicon oxycarbide, or combinations thereof. The gate isolation structure 1500 can be formed by depositing the dielectric material in the gate cut trench 1400 using any suitable method, such as CVD, PECVD, or FCVD. After the deposition, a CMP may be performed to remove any excess dielectric material from the remaining dummy gate structure 1000.

Although the examples of FIGS. 15A-C show that the gate isolation structure 1500 fills the gate cut trench 1400 with a single dielectric piece (which can include one or more dielectric materials listed above), it is understood that the gate isolation structure 1500 can include multiple pieces. Each of the pieces may include, for example, silicon oxide, silicon nitride, silicon oxynitride, silicon carbide, silicon carbonitride, silicon oxycarbonitride, silicon oxycarbide, or combinations thereof. For example, the gate isolation structure 1500 may include a first piece, which is formed as a conformal layer lining the gate cut trench 1400, and a second piece, which fills the gate cut trench 1400 with the first piece coupled therebetween. In another example, the gate isolation structure 1500 may include a first piece, which fills a lower portion of the gate cut trench 1400, and a second piece, which fills an upper portion of the gate cut trench 1400.

Figure 16:
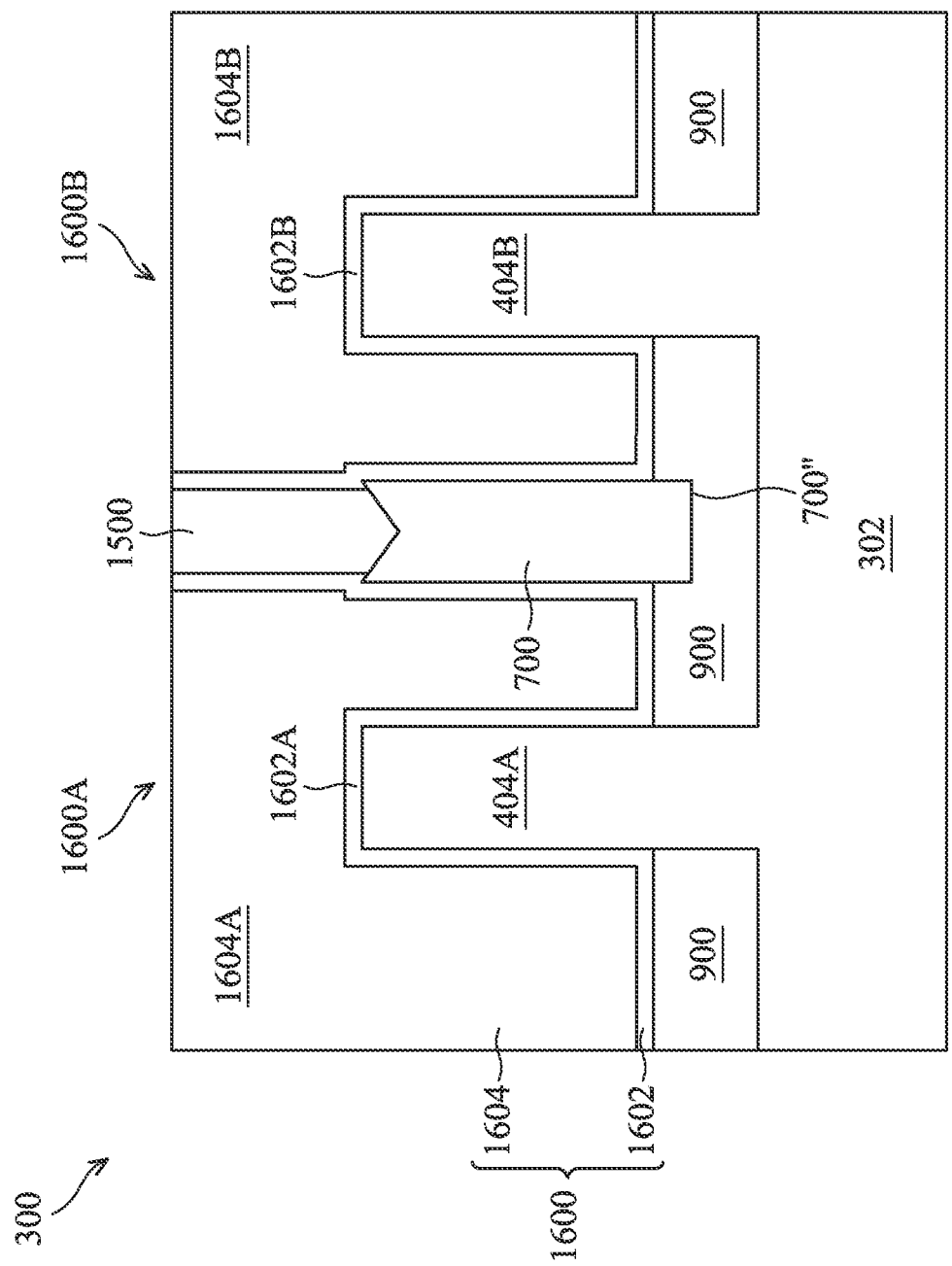

Corresponding to operation 228 of FIG. 2, FIG. 16 is a cross-sectional view of the FinFET device 300 including an active gate structure 1600 at one of the various stages of fabrication. The cross-sectional view of FIG. 16 is cut along a lengthwise direction of the active gate structure 1600 (e.g., cross-section B-B indicated in FIG. 1).

The active gate structure 1600 may be formed by replacing the dummy gate structure 1000. As illustrated, the active gate structure 1600 may include two portions 1600A and 1600B that are separated by the gate isolation structure 1500 and the dummy fin 700. The portion 1600A can overlay the active fin 404A, and the portion 1600B can overlay the active fin 404B. After the active gate structure 1600 is formed, the FinFET device 300 can include a number of transistors. For example, a first active transistor, adopting the active fin 404A as its conduction channel and portion 1600A as its active gate structure, may be formed; and a second active transistor, adopting the active fin 404B as its conduction channel and portion 1600B as its active gate structure, may be formed.

The active gate structure 1600 can include a gate dielectric layer 1602, a metal gate layer 1604, and one or more other layers that are not shown for clarity. For example, the active gate structure 1600 may further include a capping layer and a glue layer. The capping layer can protect the underlying work function layer from being oxidized. In some embodiments, the capping layer may be a silicon-containing layer, such as a layer of silicon, a layer of silicon oxide, or a layer of silicon nitride. The glue layer can function as an adhesion layer between the underlying layer and a subsequently formed gate electrode material (e.g., tungsten) over the glue layer. The glue layer may be formed of a suitable material, such as titanium nitride.

The gate dielectric layer 1602 is deposited (e.g., conformally) in a corresponding gate trench to surround (e.g., straddle) one or more fins. For example, the gate dielectric layer 1602 of the portion 1600A (sometimes referred to as "gate dielectric layer 1602A") is deposited in a gate trench that is formed by removing a portion of the dummy gate structure 1000 on the left-hand side of the dummy fin 700. The gate dielectric layer 1602A can overlay the top surfaces and the sidewalls of the active fin 404A, one of the sidewalls of the dummy fin 700, and one of the sidewalls of the gate isolation structure 1500. The gate dielectric layer 1602 of the portion 1600B (sometimes referred to as "gate dielectric layer 1602B") is deposited in a gate trench that is formed by removing a portion of the dummy gate structure 1000 on the right-hand side of the dummy fin 700. The gate dielectric layer 1602B can overlay the top surfaces and the sidewalls of the active fin 404B, the other of the sidewalls of the dummy fin 700, and the other of the sidewalls of the gate isolation structure 1500.

The gate dielectric layer 1602 includes silicon oxide, silicon nitride, or multilayers thereof. In example embodiments, the gate dielectric layer 1602 includes a high-k dielectric material, and in these embodiments, the gate dielectric layer 1602 may have a k value greater than about 7.0, and may include a metal oxide or a silicate of Hf, Al, Zr, La, Mg, Ba, Ti, Pb, or combinations thereof. The formation methods of gate dielectric layer 1602 may include molecular beam deposition (MBD), atomic layer deposition (ALD), PECVD, and the like. A thickness of the gate dielectric layer 1602 may be between about 8 angstroms (Å) and about 20 Å, as an example.

The metal gate layer 1604 is formed over the gate dielectric layer 1602. The metal gate layer 1604 of the portion 1600A (sometimes referred to as "metal gate layer 1604A") is deposited in the gate trench over the gate dielectric layer 1602A; and the metal gate layer 1604 of the portion 1600B (sometimes referred to as "metal gate layer 1604B") is deposited in the gate trench over the gate dielectric layer 1602B. The metal gate layer 1604 may be a P-type work function layer, an N-type work function layer, multi-layers thereof, or combinations thereof, in some embodiments. Accordingly, the metal gate layer 1604 is sometimes referred to as a work function layer. For example, the metal gate layer 1604 may be an N-type work function layer. In the discussion herein, a work function layer may also be referred to as a work function metal. Example P-type work function metals that may be included in the gate structures for P-type devices include TiN, TaN, Ru, Mo, Al, WN, $ZrSi_2$, $MoSi_2$, $TaSi_2$, $NiSi_2$, WN, other suitable P-type work function materials, or combinations thereof. Example N-type work function metals that may be included in the gate structures for N-type devices include Ti, Ag, TaAl, TaAlC, TiAlN, TaC, TaCN, TaSiN, Mn, Zr, other suitable N-type work function materials, or combinations thereof.

A work function value is associated with the material composition of the work function layer, and thus, the material of the work function layer is chosen to tune its work function value so that a target threshold voltage $V_t$ is achieved in the device that is to be formed. The work function layer(s) may be deposited by CVD, physical vapor deposition (PVD), ALD, and/or other suitable process. The thickness of a P-type work function layer may be between about 8 Å and about 15 Å, and the thickness of an N-type work function layer may be between about 15 Å and about 30 Å, as an example.

It should be noted that the active gate structure 1600 illustrated in FIG. 16 is formed based on the gate isolation structures 1500 being formed as shown in FIG. 15A. When the gate isolation structures 1500 is formed differently, the active gate structure 1600 may have different profiles. For example, when the gate isolation structures 1500 is formed to have a CD wider than a corresponding dummy fin 700 (e.g., FIG. 15B), a portion of the gate dielectric layer 1602, and optionally a portion of the metal gate layer 1604 (which depends on a thickness of the gate dielectric layer 1602 (1602A/1602B)) may be disposed beneath each of the side portions 1500B. If the thickness of the gate dielectric layer 1602 is greater than or equal to $CD_O$, beneath any side portion 1500B, the metal gate layer 1604 may not be present; and if the thickness of the gate dielectric layer 1602 is less than $CD_O$, portions of the metal gate layer 1604 (e.g., a portion of 1604A and a portion of 1604B) may be present beneath each of the side portions 1500B. In another example, in FIG. 15C, a portion of the gate dielectric layer 1602, and optionally a portion of the metal gate layer 1604 (which depends on a thickness of the gate dielectric layer 1602) may be disposed beneath the side portion 1500B. If the thickness of the gate dielectric layer 1602 is greater than or equal to $CD_O$, beneath the side portion 1500B, the metal gate layer 1604 may not be present; and if the thickness of the gate dielectric layer 1602 is less than $CD_O$, the metal gate layer 1604 (e.g., a portion of 1604B) may be present beneath the side portion 1500B.

Figure 17:
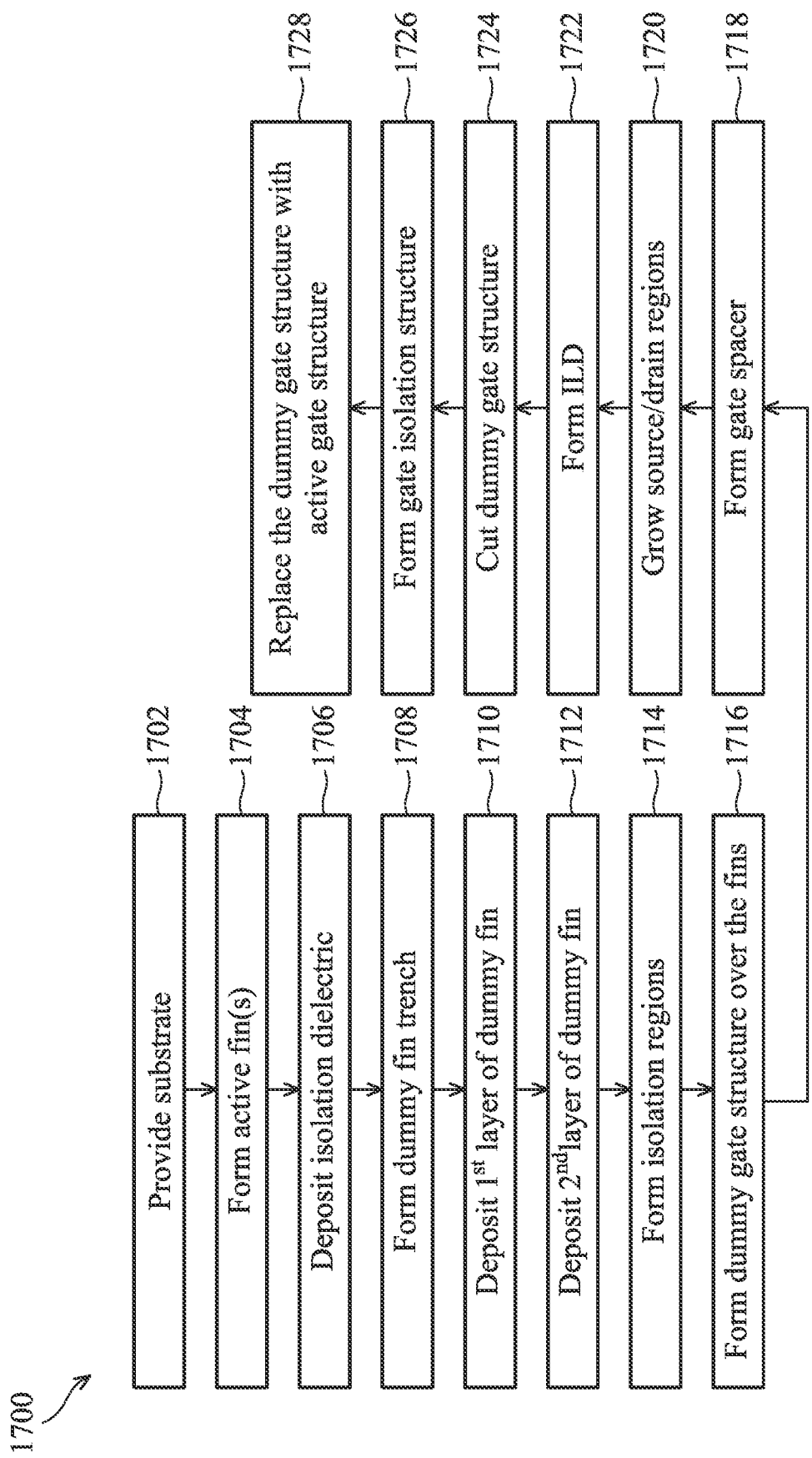
FIG. 17 illustrates a flow chart of another example method for making a non-planar transistor device, in accordance with some embodiments.

FIG. 17 illustrates a flowchart of a method 1700 to form a non-planar transistor device, according to one or more embodiments of the present disclosure. For example, at least some of the operations (or steps) of the method 1700 can be used to form a FinFET device (e.g., FinFET device 100), a nanosheet transistor device, a nanowire transistor device, a vertical transistor device, a gate-all-around (GAA) transistor device, or the like. It is noted that the method 1700 is merely an example, and is not intended to limit the present disclosure. Accordingly, it is understood that additional operations may be provided before, during, and after the method 1700 of FIG. 17, and that some other operations may only be briefly described herein. In some embodiments, operations of the method 1700 may be associated with cross-sectional views of an example FinFET device at various fabrication stages as shown in FIGS. 18, 19, 20, 21, 22, 23, 24, 25, 26, 27, 28, 29A, 29B, 29C, 30A, 30B, 30C, and 31, respectively, which will be discussed in further detail below.

In brief overview, the method 1700 starts with operation 1702 of providing a substrate. The method 1700 continues to operation 1704 of forming one or more active fins. The method 1700 continues to operation 1706 of depositing an isolation dielectric. The method 200 continues to operation 1708 of forming a dummy fin trench. The method 1700 continues to operation 1710 of depositing a first layer of a dummy fin. The method 1700 continues to operation 1712 of depositing a second layer of the dummy fin. The method 1700 continues to operation 1714 of forming isolation regions. The method 1700 continues to operation 1716 of forming a dummy gate structure over the fins. The dummy gate structures can include a dummy gate dielectric and a dummy gate disposed above the dummy gate dielectric. The method 1700 continues to operation 1718 of forming a gate spacer. The gate spacers are extended along sidewalls of the dummy gate structure. The method 1700 continues to operation 1720 of growing source/drain regions. The method 1700 continues to operation 1722 of forming an interlayer dielectric (ILD). The method 1700 continues to operation 1724 of cutting the dummy gate structure. The method 1700 continues to operation 1726 of forming a gate isolation structure. The method 1700 continues to operation 1728 of replacing the dummy gate structure with an active gate structure.

Figure 26:
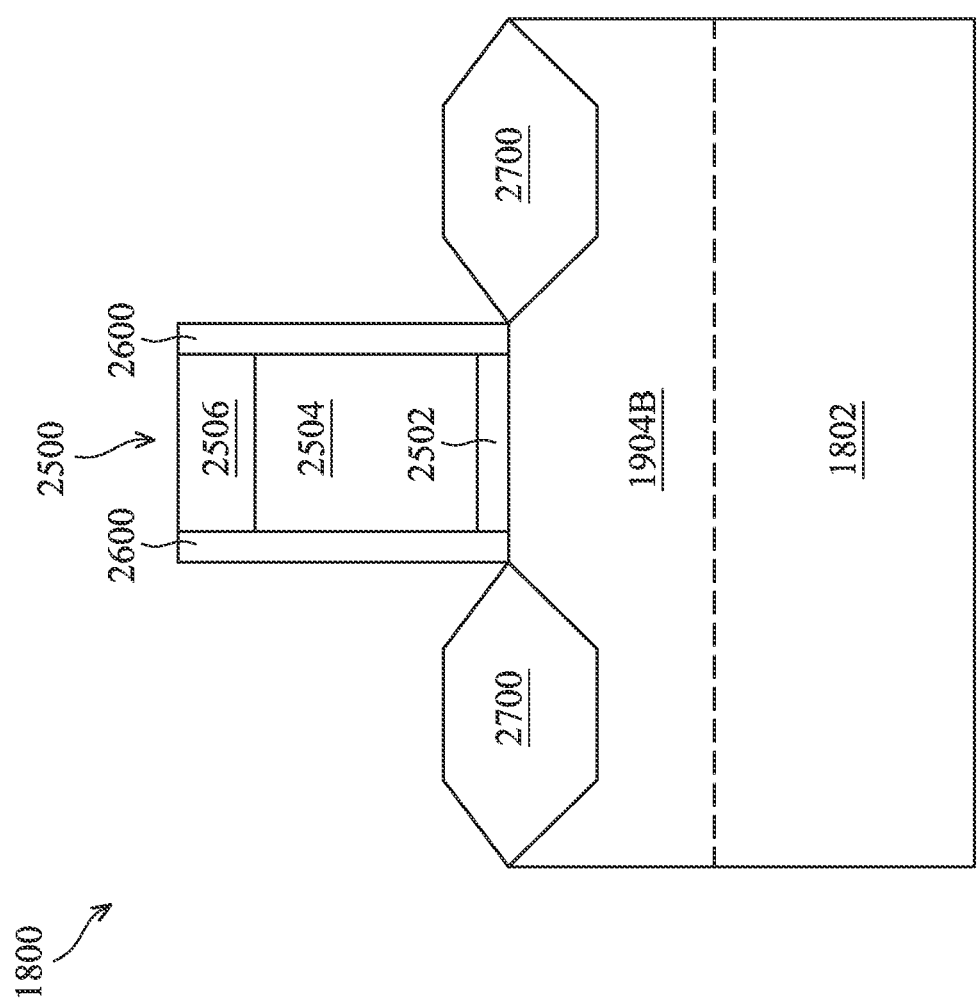
Figure 27:
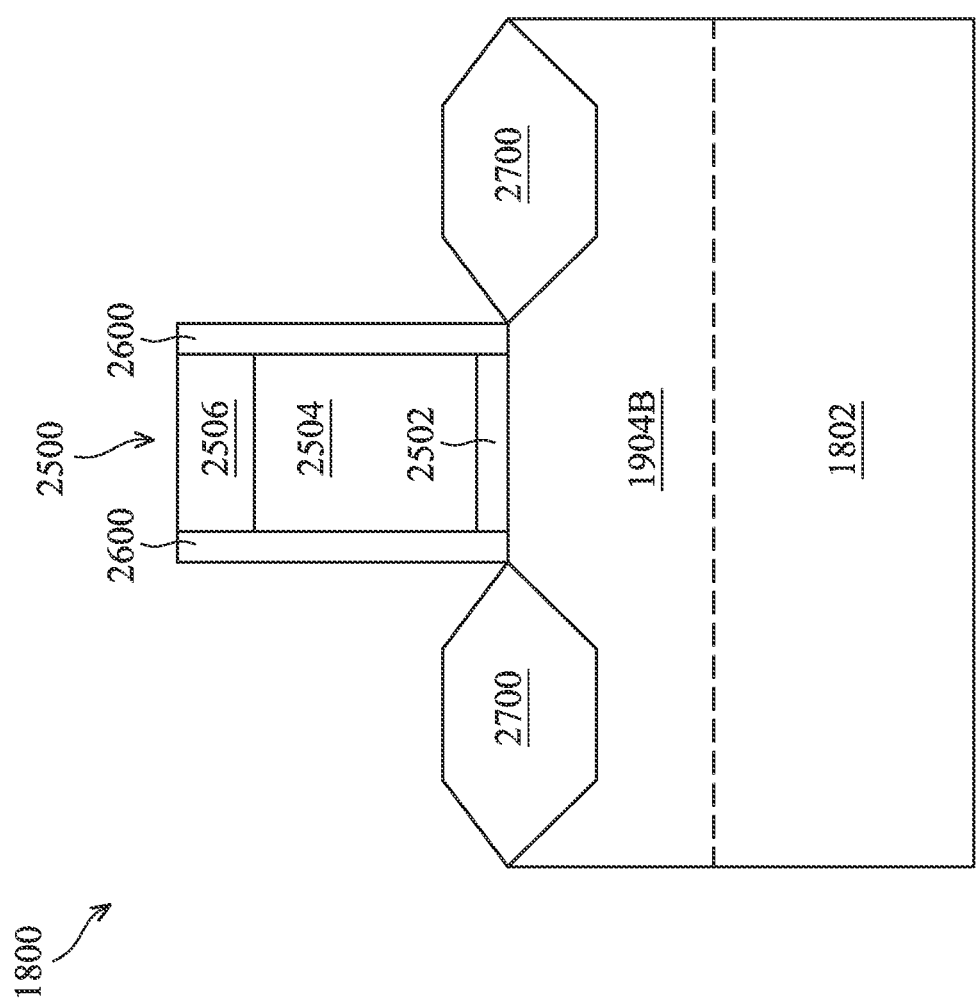
Figure 28:
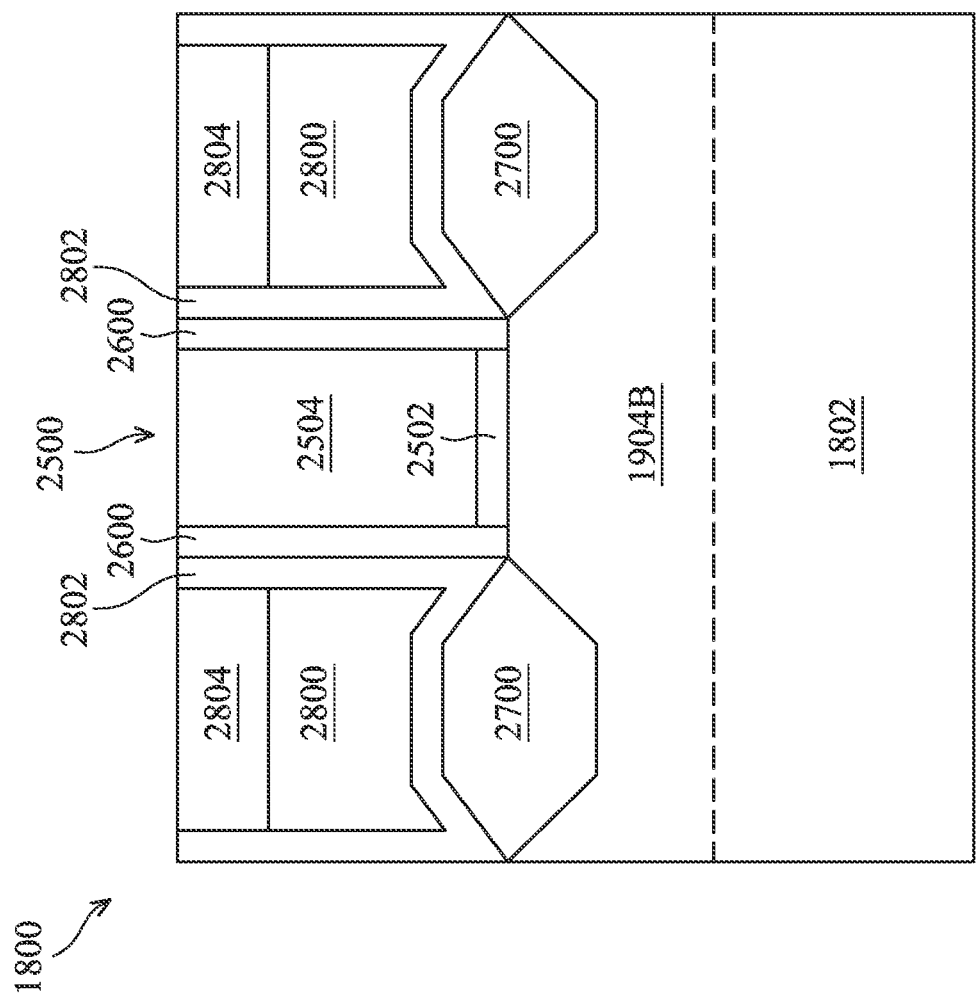

As mentioned above, FIGS. 18-31 each illustrate, in a cross-sectional view, a portion of a FinFET device 1800 at various fabrication stages of the method 1700 of FIG. 17. The FinFET device 1800 is similar to the FinFET device 100 shown in FIG. 1, but with multiple fins. For example, FIGS. 18-25 and 29A-31 illustrate cross-sectional views of the FinFET device 1800 along cross-section B-B (as indicated in FIG. 1); and FIGS. 26-28 illustrate cross-sectional views of the FinFET device 1800 along cross-section A-A (as indicated in FIG. 1). Although FIGS. 18-31 illustrate the FinFET device 1800, it is understood the FinFET device 1800 may include a number of other devices such as inductors, fuses, capacitors, coils, etc., which are not shown in FIGS. 18-31, for purposes of clarity of illustration.

Figure 18:
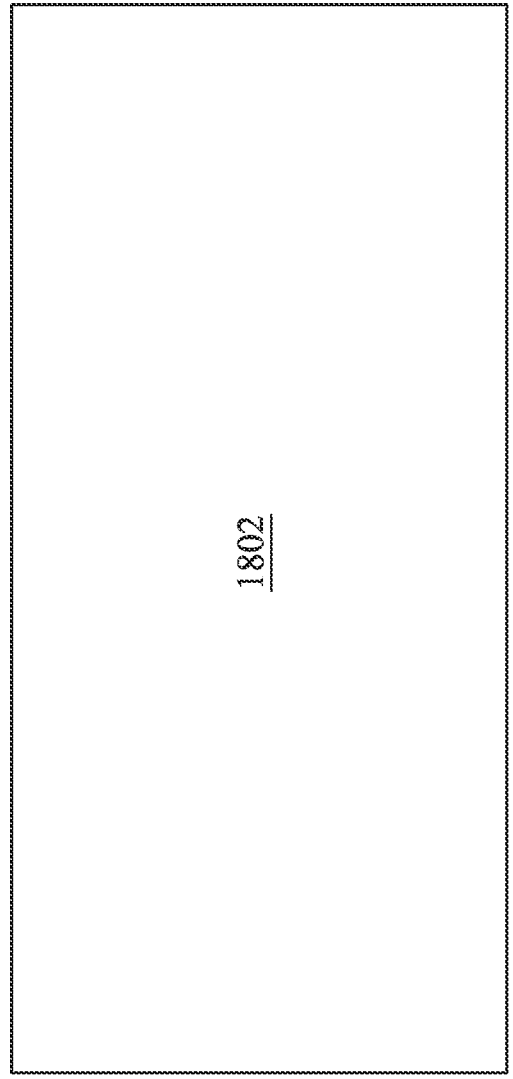
FIGS. 18, 19, 20, 21, 22, 23, 24, 25, 26, 27, 28, 29A, 29B, 29C, 30A, 30B, 30C, and 31 illustrate cross-sectional views of an example FinFET device (or a portion of the example FinFET device) during various fabrication stages, made by the method of FIG. 17, in accordance with some embodiments.

Corresponding to operation 1702 of FIG. 17, FIG. 18 is a cross-sectional view of the FinFET device 1800 including a semiconductor substrate 1802 at one of the various stages of fabrication. The cross-sectional view of FIG. 18 is cut along the lengthwise direction of an active/dummy gate structure of the FinFET device 1800 (e.g., cross-section B-B indicated in FIG. 1).

The substrate 1802 may be a semiconductor substrate, such as a bulk semiconductor, a semiconductor-on-insulator (SOI) substrate, or the like, which may be doped (e.g., with a p-type or an n-type dopant) or undoped. The substrate 1802 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 1802 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 19:
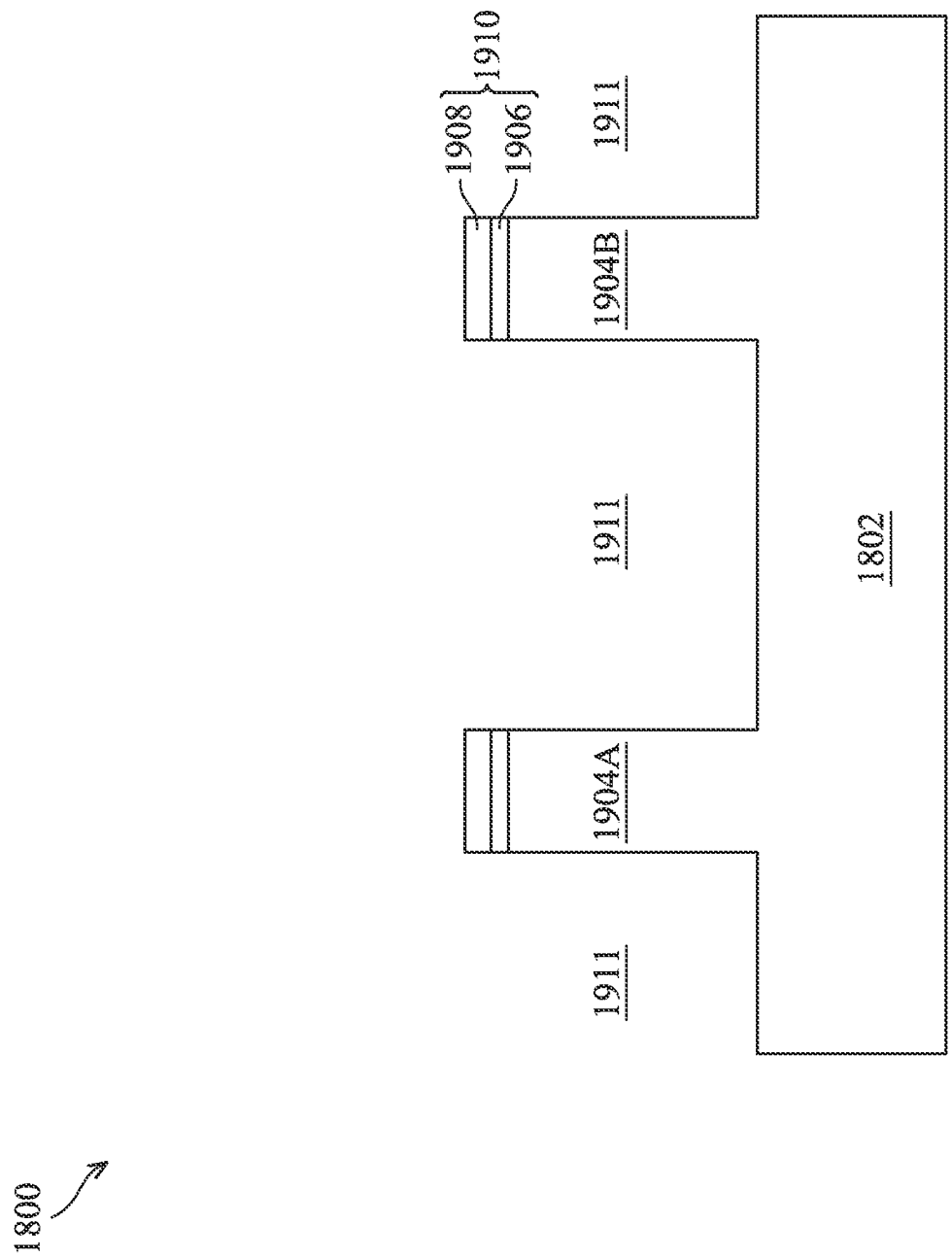

Corresponding to operation 1704 of FIG. 17, FIG. 19 is a cross-sectional view of the FinFET device 1800 including semiconductor fins 1904A and 1904B at one of the various stages of fabrication. The cross-sectional view of FIG. 19 is cut along the lengthwise direction of an active/dummy gate structure of the FinFET device 1800 (e.g., cross-section B-B indicated in FIG. 1).

The semiconductor fins 1904A-B may be each configured as an active fin, which will be adopted as an active (e.g., electrically functional) fin or channel in a respective completed FinFET. Hereinafter, the semiconductor fins 1904A-B may sometimes be referred to as "active fins 1904A-B." Although two semiconductor fins are shown in the illustrated example, it should be appreciated that the FinFET device 1800 can include any number of semiconductor fins while remaining within the scope of the present disclosure.

The semiconductor fins 1904A-B are formed by patterning the substrate 1802 using, for example, photolithography and etching techniques. For example, a mask layer, such as a pad oxide layer 1906 and an overlying pad nitride layer 1908, is formed over the substrate 1802. The pad oxide layer 1906 may be a thin film comprising silicon oxide formed, for example, using a thermal oxidation process. The pad oxide layer 1906 may act as an adhesion layer between the substrate 1802 and the overlying pad nitride layer 1908. In some embodiments, the pad nitride layer 1908 is formed of silicon nitride, silicon oxynitride, silicon carbonitride, the like, or combinations thereof. Although only one pad nitride layer 1908 is illustrated, a multilayer structure (e.g., a layer of silicon oxide on a layer of silicon nitride) may be formed as the pad nitride layer 1908. The pad nitride layer 1908 may be formed using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer 1906 and pad nitride layer 1908 to form a patterned mask 1910, as illustrated in FIG. 19.

The patterned mask 1910 is subsequently used to pattern exposed portions of the substrate 1802 to form trenches (or openings) 1911, thereby defining the active fins 1904A-B between adjacent trenches 1811 as illustrated in FIG. 19. When multiple fins are formed, such a trench may be disposed between any adjacent ones of the fins. In some embodiments, the active fins 1904A-B are formed by etching trenches in the substrate 1802 using, for example, reactive ion etch (RIE), neutral beam etch (NBE), the like, or combinations thereof. The etch may be anisotropic. In some embodiments, the trenches 1911 may be strips (viewed from the top) parallel to each other, and closely spaced with respect to each other. In some embodiments, the trenches 1911 may be continuous and surround the active fins 1904A-B.

The active fins 1904A-B may be patterned by any suitable method. For example, the active fins 1904A-B may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin.

FIGS. 18 and 19 illustrate an embodiment of forming the active fins 1904A-B, but a fin may be formed in various different processes. For example, a top portion of the substrate 1802 may be replaced by a suitable material, such as an epitaxial material suitable for an intended type (e.g., N-type or P-type) of semiconductor devices to be formed. Thereafter, the substrate 1802, with epitaxial material on top, is patterned to form the active fins 1904A-B that include the epitaxial material.

As another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form one or more fins.

In yet another example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form one or more fins.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ and implantation doping may be used together. Still further, it may be advantageous to epitaxially grow a material in an NMOS region different from the material in a PMOS region. In various embodiments, the active fins 1904A-B may include silicon germanium ($Si_xGe_{1-x}$, where x can be between 0 and 1), silicon carbide, pure or pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 20:
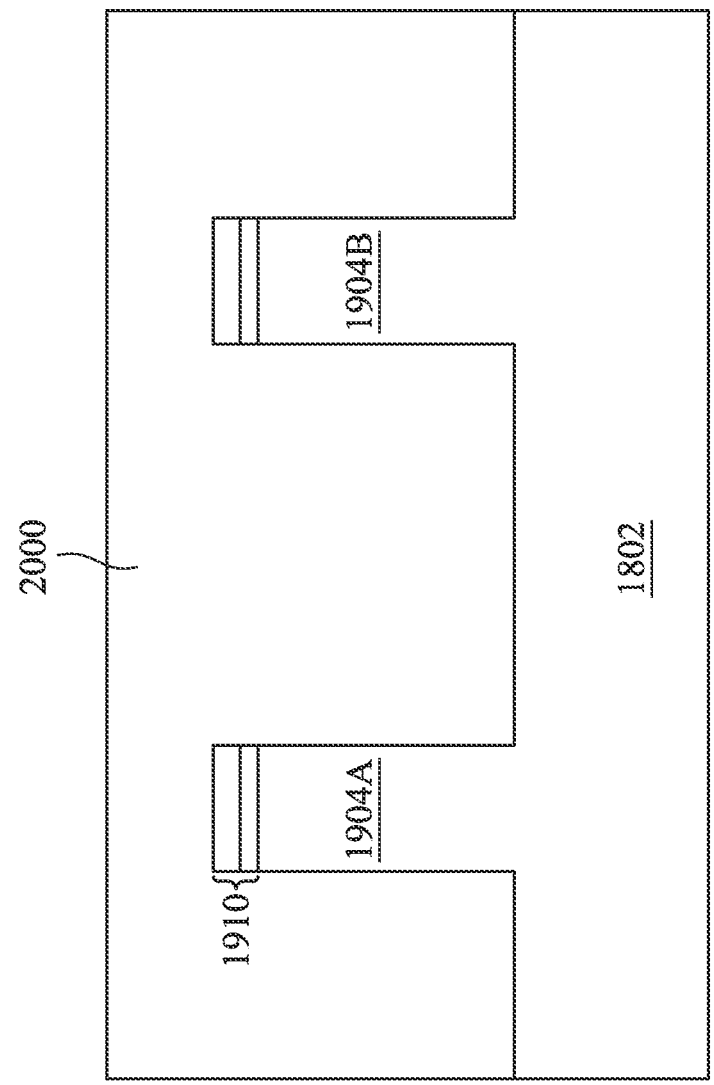

Corresponding to operation 1706 of FIG. 17, FIG. 20 is a cross-sectional view of the FinFET device 1800 including an isolation dielectric 2000 at one of the various stages of fabrication at one of the various stages of fabrication. The cross-sectional view of FIG. 20 is cut along the lengthwise direction of an active/dummy gate structure of the FinFET device 1800 (e.g., cross-section B-B indicated in FIG. 1).

The isolation dielectric 2000 may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other isolation dielectrics and/or other formation processes may be used. In an example, the isolation dielectric 2000 is silicon oxide formed by a FCVD process. An anneal process may be performed once the isolation dielectric 2000 is formed.

In some embodiments, the isolation dielectric 2000 may include a liner, e.g., a liner oxide (not shown), at the interface between the isolation dielectric 2000 and the substrate 1802 (active fins 1904A-B). In some embodiments, the liner oxide is formed to reduce crystalline defects at the interface between the substrate 1802 and the isolation dielectric 2000. Similarly, the liner oxide may also be used to reduce crystalline defects at the interface between the active fins 1904A-B and the isolation dielectric 2000. The liner oxide (e.g., silicon oxide) may be a thermal oxide formed through a thermal oxidation of a surface layer of the substrate 1802, although other suitable method may also be used to form the liner oxide.

Figure 21:
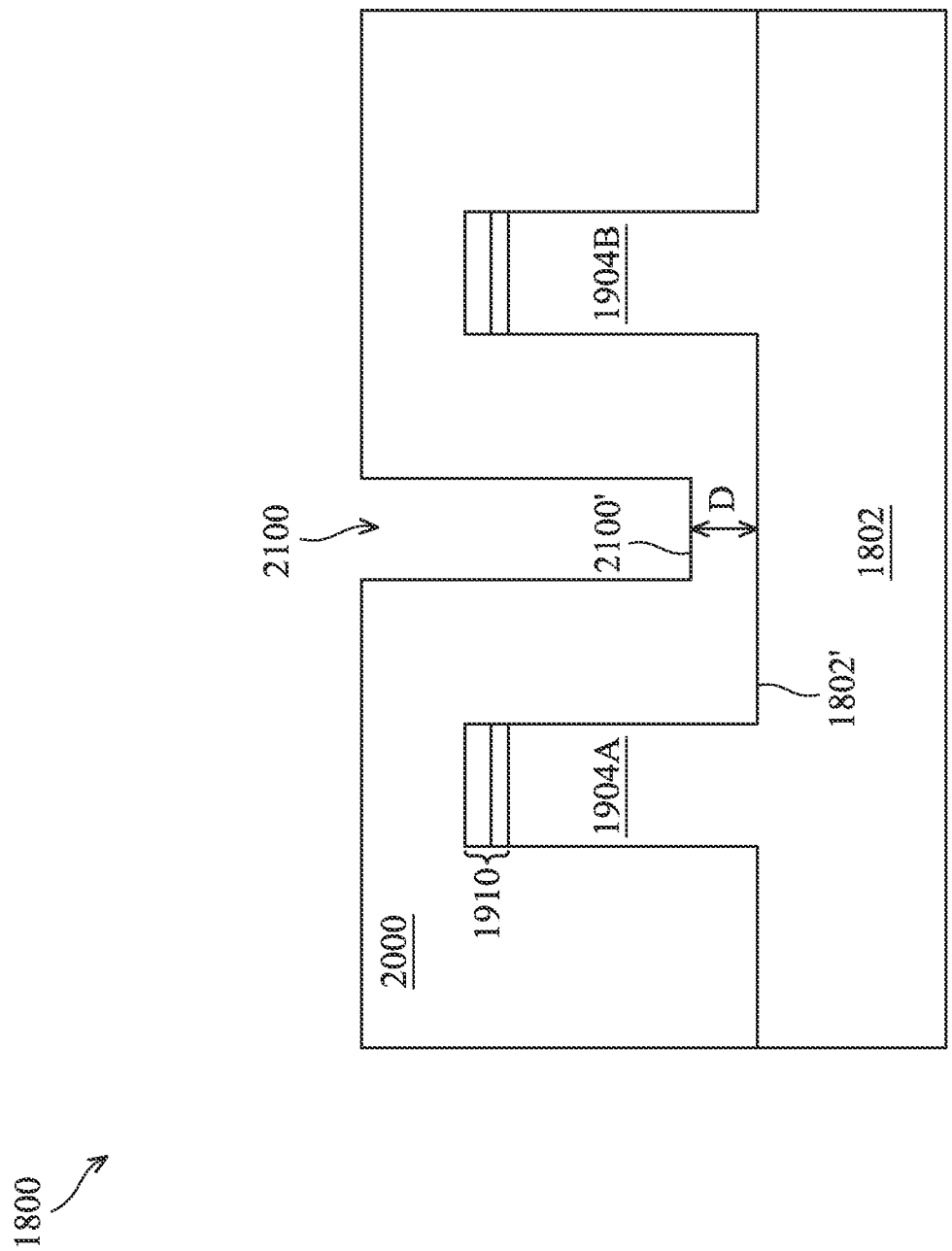

Corresponding to operation 1708 of FIG. 17, FIG. 21 is a cross-sectional view of the FinFET device 1800 including a dummy fin trench 2100 at one of the various stages of fabrication at one of the various stages of fabrication. The cross-sectional view of FIG. 21 is cut along the lengthwise direction of an active/dummy gate structure of the FinFET device 1800 (e.g., cross-section B-B indicated in FIG. 1).

Upon depositing the isolation dielectric 2000 overlaying the active fins 1904A-B, one or more dummy fin trenches, may be formed between the active fins 1904A-B. For example in FIG. 21, the dummy fin trench 2100 is formed between the active fins 1904A and 1904B. The dummy fin trench 2100 can be formed by patterning the isolation dielectric 2000 using, for example, photolithography and etching techniques. For example, a patterned mask may be formed over the isolation dielectric 2000 to mask portions of the isolation dielectric 2000 to form the dummy fin trench 2100. Subsequently, unmasked portions of the isolation dielectric 2000 may be etched using, for example, reactive ion etch (RIE), neutral beam etch (NBE), the like, or combinations thereof, thereby defining the dummy fin trench 2100 between adjacent active fins 1904A-B (or in one of the trenches 1911, FIG. 19). The etch may be anisotropic, in some embodiments.

In the illustrated example of FIG. 21, the dummy fin trench 2100 has a bottom surface 2100' vertically higher than a top surface 1802' of the substrate 1802. In other words, the bottom surface 2100' is separated from the top surface 1802' with a non-zero, positive distance (of the isolation dielectric 2000), "D." D can be measured from the top surface 1802' to the bottom surface 2100'. It is understood that such a distance, D, can be zero or negative, while remaining within the scope of the present disclosure. For example, the formation of the dummy fin trench 2100 may be stopped once a portion of the top surface 1802' is exposed, which can result in a zero distance. In another example, the formation of the dummy fin trench 2100 may be continued (in a controlled manner) after a portion of the top surface 1802' is exposed, which can result in a non-zero, negative distance. In the following discussions, the illustrated embodiment of FIG. 21 will continue to be used as an representative example.

Figure 22:
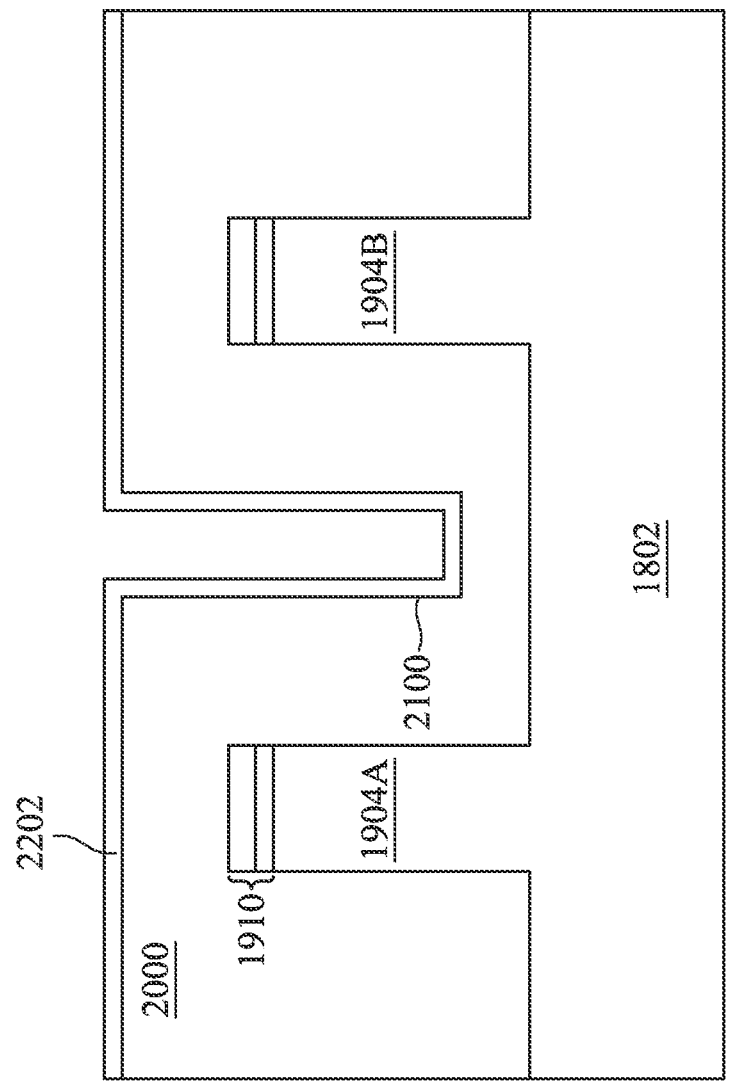

Corresponding to operation 1710 of FIG. 17, FIG. 22 is a cross-sectional view of the FinFET device 1800 including a first layer 2202 at one of the various stages of fabrication at one of the various stages of fabrication. The cross-sectional view of FIG. 22 is cut along the lengthwise direction of an active/dummy gate structure of the FinFET device 1800 (e.g., cross-section B-B indicated in FIG. 1).

The first layer 2202 can include a dielectric material used to form one or more dummy fins. For example, the dielectric material may include silicon oxide, silicon nitride, silicon oxynitride, silicon carbide, silicon carbonitride, silicon oxycarbonitride, silicon oxycarbide, or combinations thereof. In another example, the dielectric material may include group IV-based oxide or group IV-based nitride, e.g., tantalum nitride, tantalum oxide, hafnium oxide, or combinations thereof. The first layer 2200 may be formed using low-pressure chemical vapor deposition (LPCVD) or plasma enhanced chemical vapor deposition (PECVD), for example. In accordance with various embodiments, the first layer 2202 may be formed as a conformal layer lining the workpiece. For example in FIG. 22, the first layer 2202 lines the dummy fin trench 2100 and a top surface of the isolation dielectric 2000. As such, a portion of the dummy fin trench 2100 may remain unfilled or otherwise exposed, which can be later filled with one or more other layers.

Figure 23:
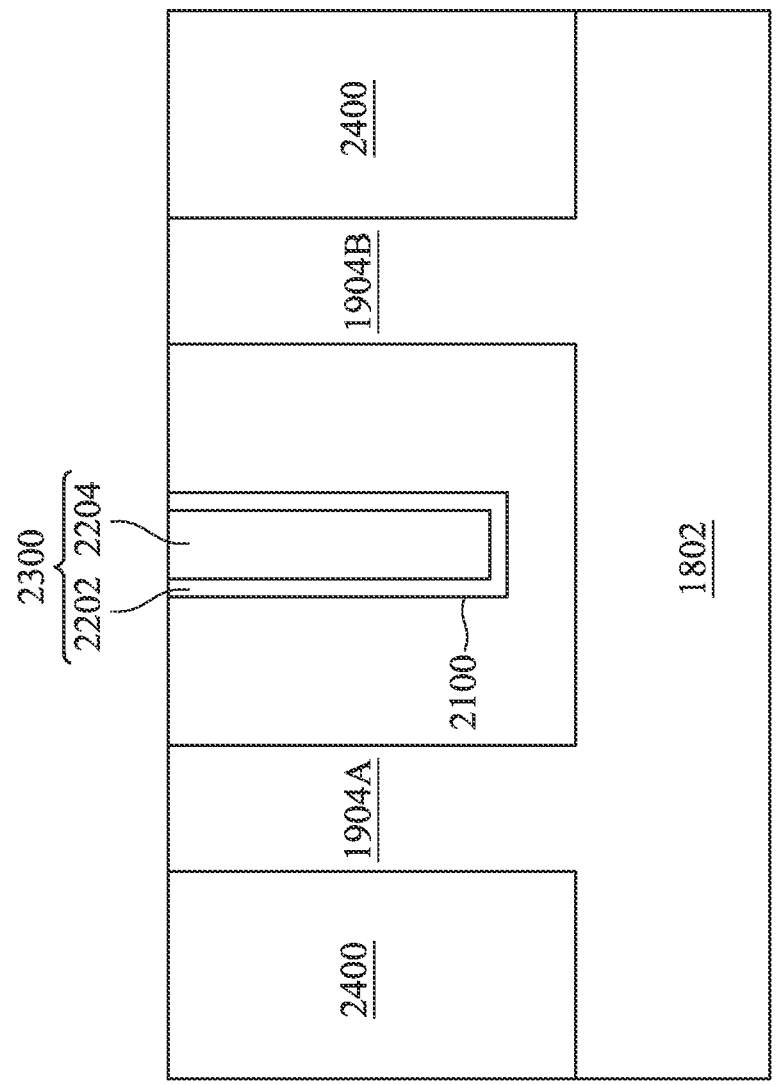

Corresponding to operation 1712 of FIG. 17, FIG. 23 is a cross-sectional view of the FinFET device 1800 including a second layer 2204 at one of the various stages of fabrication at one of the various stages of fabrication. The cross-sectional view of FIG. 23 is cut along the lengthwise direction of an active/dummy gate structure of the FinFET device 1800 (e.g., cross-section B-B indicated in FIG. 1).

The second layer 2204 can include a dielectric material used to form one or more dummy fins. For example, the dielectric material may include silicon oxide, silicon nitride, silicon oxynitride, silicon carbide, silicon carbonitride, silicon oxycarbonitride, silicon oxycarbide, or combinations thereof. In another example, the dielectric material may include group IV-based oxide or group IV-based nitride, e.g., tantalum nitride, tantalum oxide, hafnium oxide, or combinations thereof. The second layer 2204 may be formed using low-pressure chemical vapor deposition (LPCVD) or plasma enhanced chemical vapor deposition (PECVD), for example.

In accordance with various embodiments, the dielectric materials of the first layer 2202 and the second layer 2204 may be selected to cause an etching selectivity between the first and second layers to be greater than a certain threshold. For example, an etching selectivity of the second layer 2204 over the first layer 2202 may be selected to be greater than 10. That is, an etching rate for the second layer 2204 is ten times greater than an etching rate for the first layer 2202. As such, when both of first and second layers experience a same etching process, the first layer 2202 may remain substantially intact while a portion of the second layer 2204 has been removed, which will be discussed below. Further, an etching selectivity of the second layer 2204 with respect to a dummy gate structure (later to be formed) may be selected to be less than an etching selectivity of the first layer 2202 with respect to the dummy gate structure. As such, when the dummy gate structure is being etched, a portion of the second layer 2204 can be etched, while keeping the first layer 2202 substantially intact, which will also be discussed below.

In accordance with various embodiments, the second layer 2204 may not be formed as a conformal layer. Instead, the second layer 2204 may be formed to fill out the rest of the dummy fin trench 2100. Following filling out the rest of the dummy fin trench 2100 (with the first layer sandwiched therebetween), a planarization process (e.g., CMP) may be performed to remove any excess dielectric material and form top surfaces of the isolation dielectric 2000 and a top surface of the fins 1904A-B that are coplanar (not shown). In some embodiments, the patterned mask 1910 may be removed by the planarization process. In some embodiments, the patterned mask 1910 may remain after the planarization process. For clarity of illustration, the patterned mask 1910 is not shown in FIG. 23. Consequently, a dummy fin 2300 including the first and second layers, 2202 and 2204, is formed, wherein the first layer 2202 lines a bottom surface and sidewalls of the second layer 2204.

Figure 24:
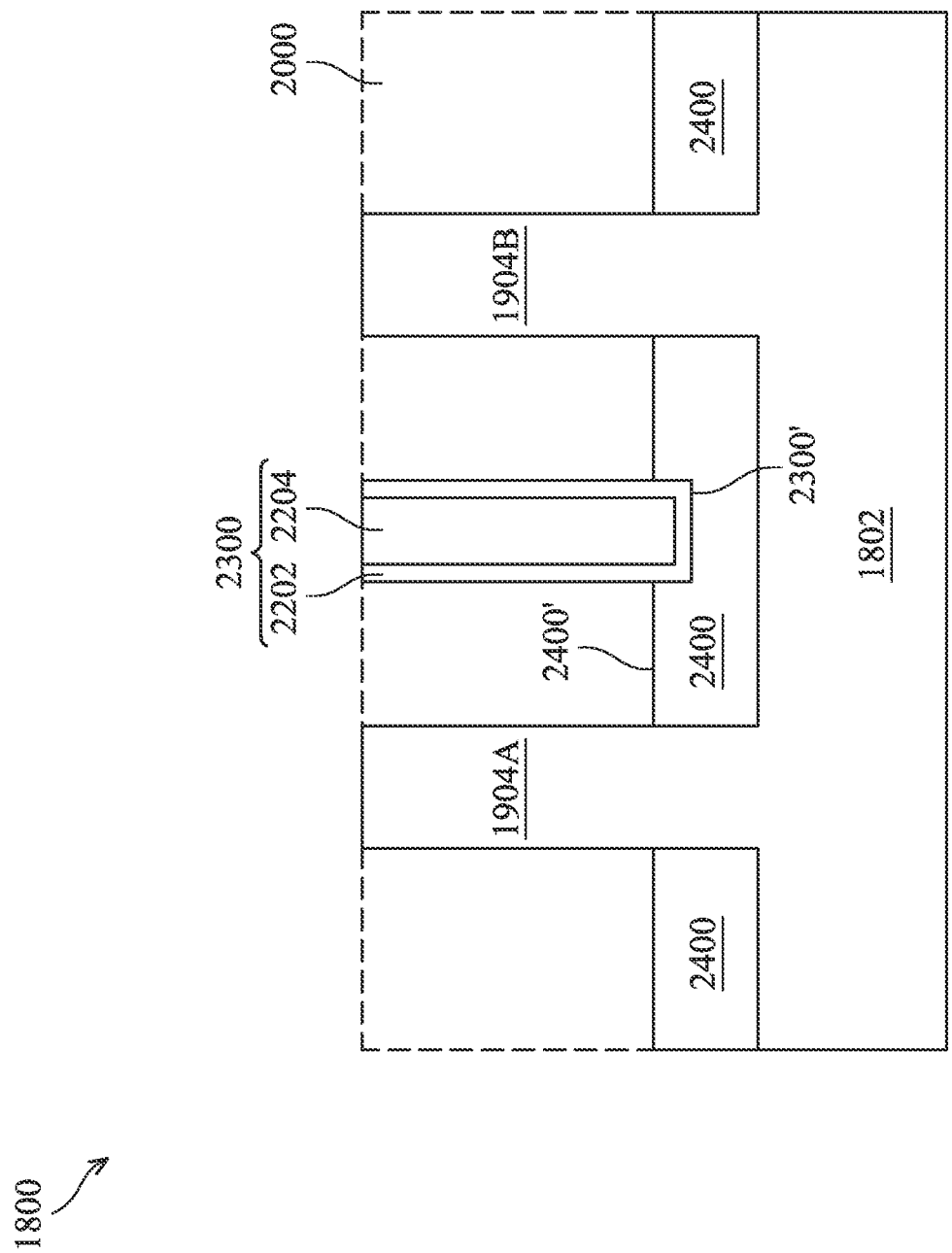

Corresponding to operation 1714 of FIG. 17, FIG. 24 is a cross-sectional view of the FinFET device 1800 including one or more isolation regions 2400 at one of the various stages of fabrication at one of the various stages of fabrication. The cross-sectional view of FIG. 24 is cut along the lengthwise direction of an active/dummy gate structure of the FinFET device 1800 (e.g., cross-section B-B indicated in FIG. 1).

The isolation regions 2400 are formed by recessing the isolation dielectric 2000, as indicated in dotted lines in FIG. 24. The isolation regions are sometimes referred to as shallow trench isolation (STI) regions 2400. The isolation dielectric 2000 is recessed such that upper portions of the fins 1904A-B protrude from between neighboring STI regions 2400. A top surface, 2400', of the STI regions 2400 may have a flat surface (as illustrated), a convex surface, a concave surface (such as dishing), or combinations thereof. The top surface 2400' of the STI regions 2400 may be formed flat, convex, and/or concave by an appropriate etch. The STI regions 2400 may be recessed using an acceptable etching process, such as one that is selective to the material of the isolation dielectric 2000. For example, a dry etch or a wet etch using dilute hydrofluoric (DHF) acid may be performed to recess the STI regions 2400. Although in FIG. 24, the top surface 2400' is formed vertically higher than a bottom surface, 2300', of the dummy fin 2300, it is understood that the top surface 2400' may be formed aligned with the bottom surface 2300', while remaining within the scope of the present disclosure.

Figure 25:
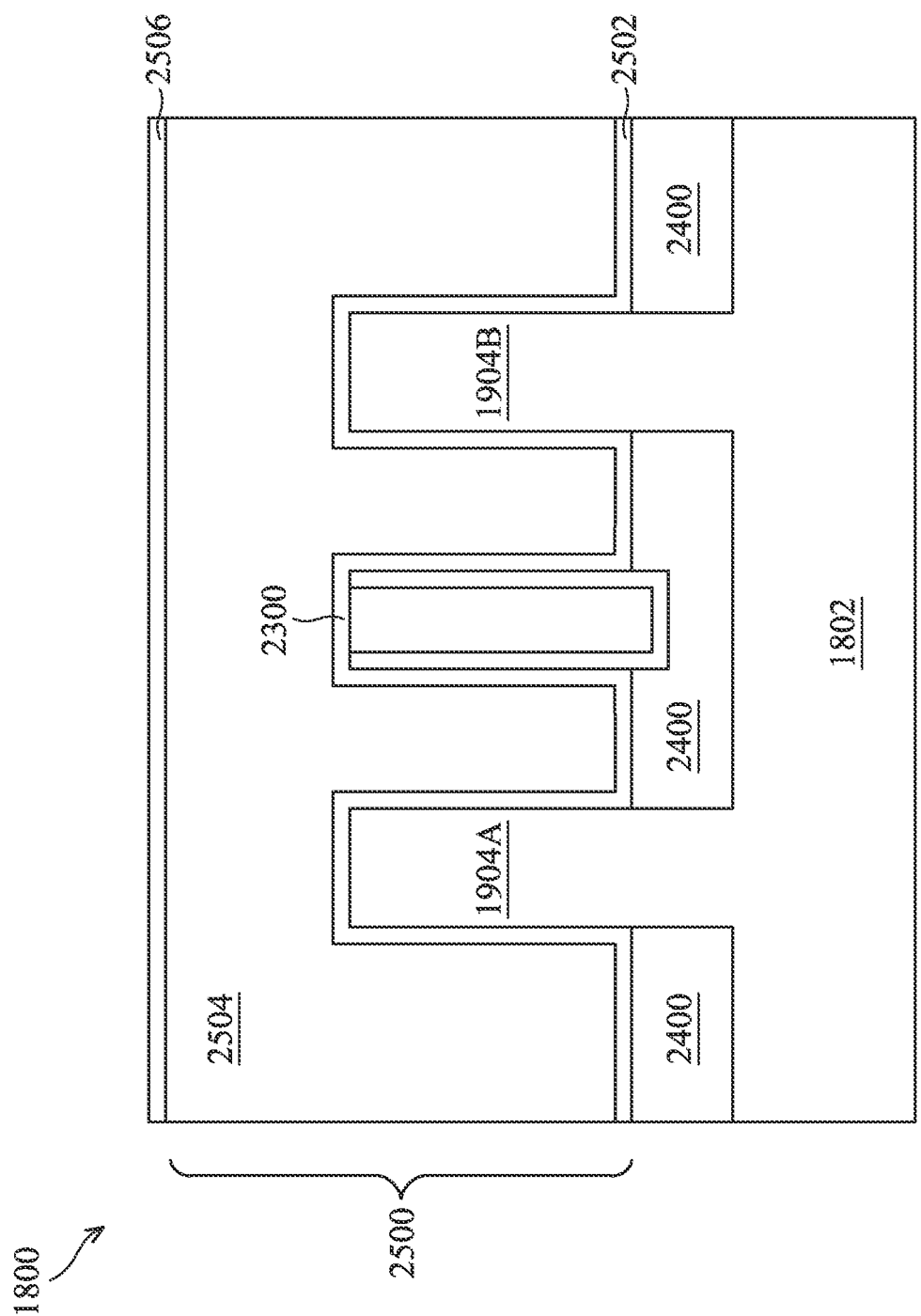

Corresponding to operation 1716 of FIG. 17, FIG. 25 is a cross-sectional view of the FinFET device 1800 including a dummy gate structure 2500 at one of the various stages of fabrication at one of the various stages of fabrication. The cross-sectional view of FIG. 25 is cut along the lengthwise direction of an active/dummy gate structure of the FinFET device 1800 (e.g., cross-section B-B indicated in FIG. 1).

The dummy gate structure 2500 includes a dummy gate dielectric 2502 and a dummy gate 2504, in some embodiments. A mask 2506 may be formed over the dummy gate structure 2500. To form the dummy gate structure 2500, a dielectric layer is formed on the active fins 1904A-B and dummy fin 2300. The dielectric layer may be, for example, silicon oxide, silicon nitride, silicon oxynitride, silicon carbide, silicon carbonitride, silicon oxycarbonitride, silicon oxycarbide, multilayers thereof, or the like, and may be deposited or thermally grown.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using suitable lithography and etching techniques to form the mask 2506. The pattern of the mask 2506 then may be transferred to the gate layer and the dielectric layer by a suitable etching technique to form the dummy gate 2504 and the underlying dummy gate dielectric 2502, respectively. The dummy gate 2504 and the dummy gate dielectric 2502 straddle or otherwise cover a respective portion (e.g., a channel region) of each of the active fins 1904A-B and the dummy fin 2300. For example, when one dummy gate structure is formed, a dummy gate and dummy gate dielectric of the dummy gate structure may straddle respective central portions of the fins. The dummy gate 2504 may also have a lengthwise direction (e.g., cross-section B-B of FIG. 1) perpendicular to the lengthwise direction (e.g., cross-section A-A of FIG. 1) of the fins.

The dummy gate dielectric 2502 is shown to be formed over the active fins 1904A-B and the dummy fin 2300 (e.g., over the respective top surfaces and the sidewalls of the fins) and over the STI regions 2400 in the example of FIG. 25. In other embodiments, the dummy gate dielectric 2502 may be formed by, e.g., thermal oxidization of a material of the fins, and therefore, may be formed over the fins but not over the STI regions 2400. It should be appreciated that these and other variations are still included within the scope of the present disclosure.

FIGS. 26-28 illustrate the cross-sectional views of further processing (or making) of the FinFET device 1800 along the lengthwise direction (e.g., cross-section A-A indicated in FIG. 1) of one of the active fins 1904A-B. As a representative example, one dummy gate structure (e.g., 2500) is illustrated over the active fin 1904B in FIGS. 26-28. It should be appreciated that more or less than one dummy gate structure can be formed over the fin 1904B (and each of the other fins, e.g., 1904A, 2300), while remaining within the scope of the present disclosure.

Corresponding to operation 1718 of FIG. 17, FIG. 26 is a cross-sectional view of the FinFET device 1800 including a gate spacer 2600 formed around (e.g., along and contacting the sidewalls of) the dummy gate structure 2500. The cross-sectional view of FIG. 26 is cut along the lengthwise direction of the active fin 1904B (e.g., cross-section A-A indicated in FIG. 1).

For example, the gate spacer 1100 may be formed on opposing sidewalls of the dummy gate structure 1000. Although the gate spacer 1100 is shown as a single layer in the example of FIG. 11 (and the following figures), it should be understood that the gate spacer can be formed to have any number of layers while remaining within the scope of the present disclosure. The gate spacer 1100 may be a low-k spacer and may be formed of a suitable dielectric material, such as silicon oxide, silicon oxycarbonitride, or the like. Any suitable deposition method, such as thermal oxidation, chemical vapor deposition (CVD), or the like, may be used to form the gate spacer 1100. The shapes and formation methods of the gate spacer 1100 as illustrated in FIG. 11 are merely non-limiting examples, and other shapes and formation methods are possible. These and other variations are fully intended to be included within the scope of the present disclosure.

Corresponding to operation 1720 of FIG. 17, FIG. 27 is a cross-sectional view of the FinFET device 1800 including a number (e.g., 2) of source/drain regions 2700 at one of the various stages of fabrication. The cross-sectional view of FIG. 27 is cut along the lengthwise direction of the active fin 1904B (e.g., cross-section A-A indicated in FIG. 1).

The source/drain regions 2700 are formed in recesses of the active fin 1904B adjacent to the dummy gate structures 2500, e.g., between adjacent dummy gate structures 2500 and/or next to a dummy gate structure 2500. The recesses are formed by, e.g., an anisotropic etching process using the dummy gate structures 2500 as an etching mask, in some embodiments, although any other suitable etching process may also be used.

The source/drain regions 2700 are formed by epitaxially growing a semiconductor material in the recess, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

As illustrated in FIG. 27, the epitaxial source/drain regions 2700 may have surfaces raised from the top surface of the active fin 1904B (e.g. raised above the non-recessed portions of the active fin 1904B) and may have facets. In some embodiments, the source/drain regions 2700 of the adjacent fins may merge to form a continuous epitaxial source/drain region (not shown). In some embodiments, the source/drain regions 2700 of the adjacent fins may not merge together and remain separate source/drain regions 2700 (not shown). In some embodiments, when the resulting FinFET device is an n-type FinFET, the source/drain regions 1200 can include silicon carbide (SiC), silicon phosphorous (SiP), phosphorous-doped silicon carbon (SiCP), or the like. In some embodiments, when the resulting FinFET device is a p-type FinFET, the source/drain regions 2700 comprise SiGe, and a p-type impurity such as boron or indium.

The epitaxial source/drain regions 2700 may be implanted with dopants to form source/drain regions 2700 followed by an annealing process. The implanting process may include forming and patterning masks such as a photoresist to cover the regions of the FinFET device 1800 that are to be protected from the implanting process. The source/drain regions 2700 may have an impurity (e.g., dopant) concentration in a range from about $1\times10^{19}$ cm$^{-3}$ to about $1\times10^{21}$ cm$^{-3}$. P-type impurities, such as boron or indium, may be implanted in the source/drain regions 2700 of a P-type transistor. N-type impurities, such as phosphorous or arsenide, may be implanted in the source/drain regions 2700 of an N-type transistor. In some embodiments, the epitaxial source/drain regions 2700 may be in situ doped during their growth.

Corresponding to operation 1722 of FIG. 17, FIG. 28 is a cross-sectional view of the FinFET device 1800 including an interlayer dielectric (ILD) 2800 at one of the various stages of fabrication. The cross-sectional view of FIG. 28 is cut along the lengthwise direction of the active fin 1904B (e.g., cross-section A-A indicated in FIG. 1).

In some embodiments, prior to forming the ILD 2800, a contact etch stop layer (CESL) 2802 is formed over the structure, as illustrated in FIG. 28. The CESL 2802 can function as an etch stop layer in a subsequent etching process, and may comprise a suitable material such as silicon oxide, silicon nitride, silicon oxynitride, combinations thereof, or the like, and may be formed by a suitable formation method such as CVD, PVD, combinations thereof, or the like.

Next, the ILD 2800 is formed over the CESL 1302 and over the dummy gate structure 2500. In some embodiments, the ILD 2800 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. After the ILD 2800 is formed, an optional dielectric layer 2804 is formed over the ILD 2800. The dielectric layer 2804 can function as a protection layer to prevent or reduces the loss of the ILD 2800 in subsequent etching processes.

The dielectric layer 2804 may be formed of a suitable material, such as silicon nitride, silicon carbonitride, or the like, using a suitable method such as CVD, PECVD, or FCVD. After the dielectric layer 2804 is formed, a planarization process, such as a CMP process, may be performed to achieve a level upper surface for the dielectric layer 2804. The CMP may also remove the mask 2506 and portions of the CESL 2802 disposed over the dummy gate 2504 (FIG. 28). After the planarization process, the upper surface of the dielectric layer 2804 is level with the upper surface of the dummy gate 2504, in some embodiments.

An example gate-last process (sometimes referred to as replacement gate process) can then performed to replace the dummy gate structure 2500 with an active gate structure (which may also be referred to as a replacement gate structure or a metal gate structure). Prior to replacing the dummy gate structure, a portion of the dummy gate structure disposed between the active fins can be replaced with a gate isolation structure so as to separate the active gate structure into different portions that are electrically coupled to the active fins, respectively. FIGS. 29A-31 illustrate the cross-sectional views of further processing (or making) of the FinFET device 1800, which will be discussed in more detail as follows.

Figure 29A:
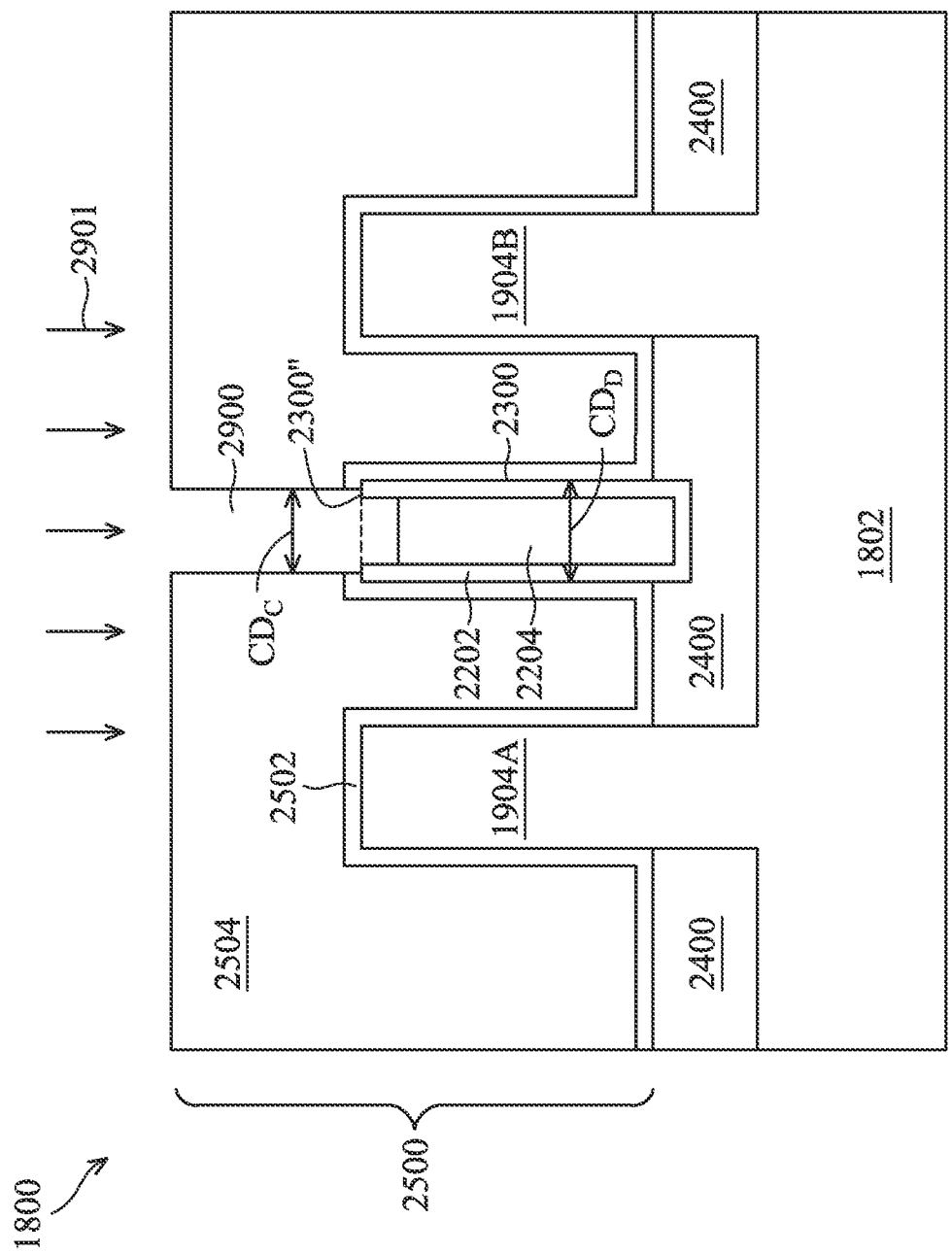
Figure 29B:
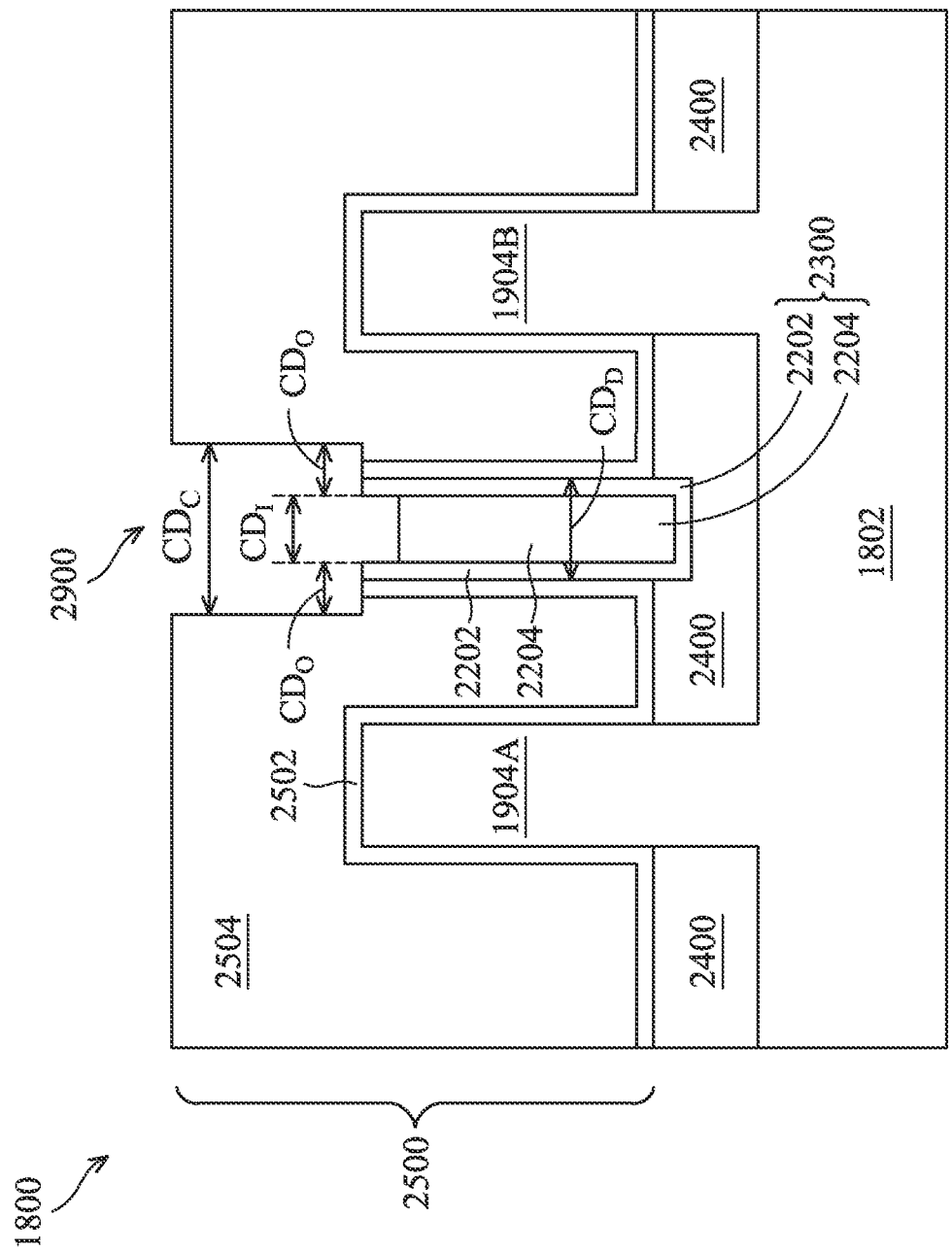
Figure 29C:
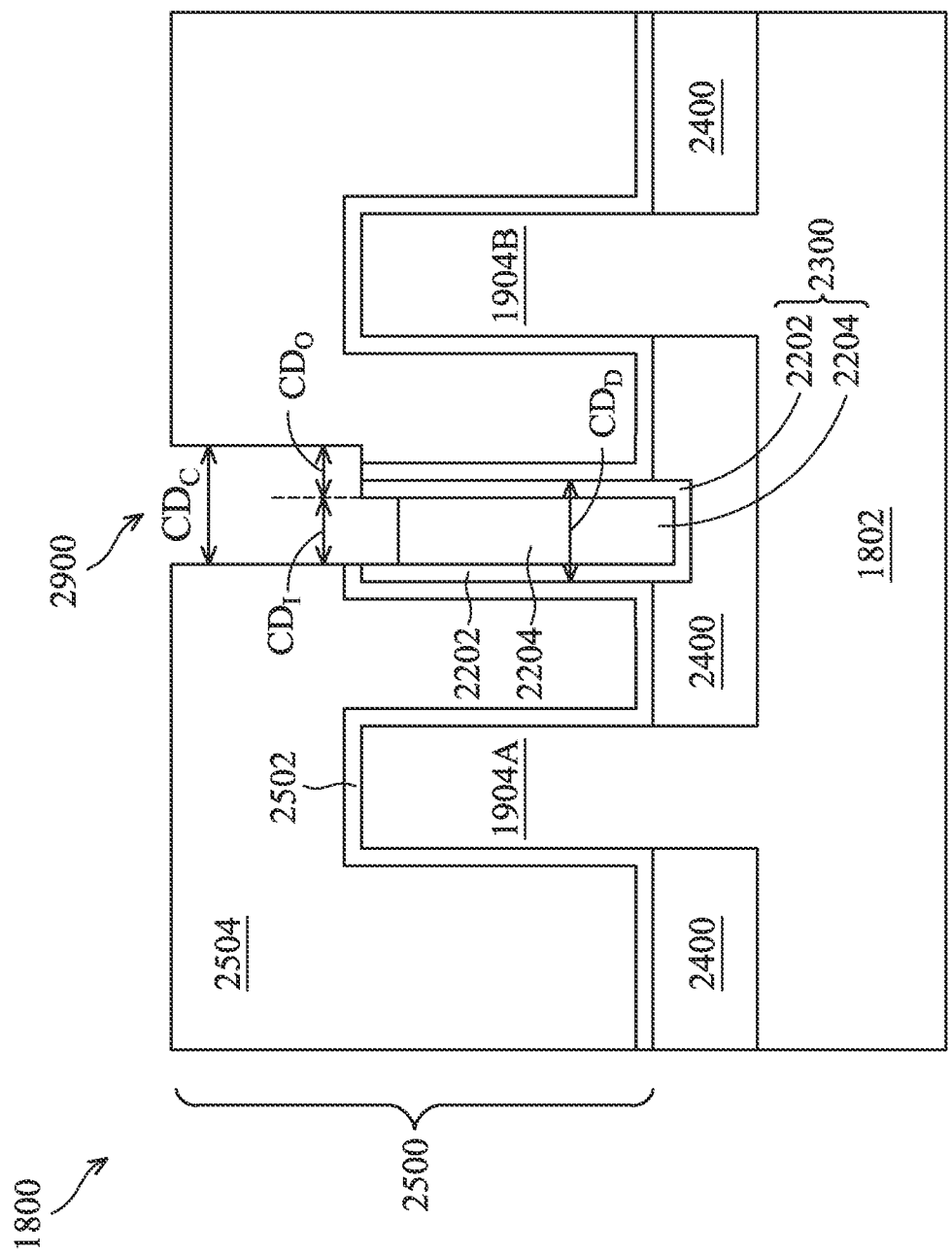

Corresponding to operation 1724 of FIG. 17, FIGS. 29A, 29B, and 29C are each a cross-sectional view of the FinFET device 1800 in which the dummy gate structure 2500 is cut, intercepted, or otherwise disconnected to form a gate cut trench (or otherwise opening) 2900 at one of the various stages of fabrication. The cross-sectional views of FIGS. 29A-C are each cut along the lengthwise direction of an active/dummy gate structure of the FinFET device 1800 (e.g., cross-section B-B indicated in FIG. 1). Specifically, FIGS. 29A-B illustrate various embodiments of the gate cut trench 2900 that have respective different critical dimensions (CD's) along the lengthwise direction of the dummy gate structure 2500 (hereinafter "$CD_C$") with respect to a critical dimension of the dummy fin 2300 along the same direction (hereinafter "$CD_D$"); and FIG. 29C illustrates an embodiment in which the gate cut trench 2900 is laterally shifted from the dummy fin 2300.

To form the gate cut trench 2900, a mask (not shown) may be formed over the dummy gate structure 2500 to expose a portion of the dummy gate structure 2500 desired to be removed (e.g., the portion disposed over the dummy fin 2300), followed by an etching processes 2901 (FIG. 29A) to remove the portion of the dummy gate structure 2500. It should be understood that the dummy gate structure 2500 may be cut prior to the formation of source/drain regions 2700 (operation 1720 of FIG. 17), while remaining within the scope of the present disclosure. During the removal of the dummy gate structure 2500, a portion of the dummy fin 2300 may function as an etch stop layer by having a high enough etching selectivity between the first and second layers, 2202 and 2204, of the dummy fin 2300, as discussed above.

For example, the etching process 2901 may be configured to remove the portion of the dummy gate structure 2500 so as to at least partially expose a top surface 2300" of the dummy fin 2300 (indicated by a dotted line). Upon the top surface 2300" being exposed, the etching process 2901 etch the second layer 2204 in a faster etching rate than the first layer 2202 (due to the high etching selectivity between the two layers). As such, an upper portion of the second layer 2204 is removed, while the first layer 2202 remains substantially intact, which causes the dummy fin 2300 to have a step-based profile on its top surface 2300", as illustrated.

In some embodiments, the first layer 2202 may sometimes be referred to as a side portion of the dummy fin 2300, and the second layer 2204 may sometimes be referred to as a central portion of the dummy fin 2300. The (etched) central portion 2204 presents a lower height when compared to the side portion 2202, during and/or after the etching process 2901. Consequently, the etching process 2901 may be slowed down by at least one of the side portions of the dummy fin 2300 due to its (or their) relatively great height. In other words, the etching process 2901 may be confined around the central portion of the dummy fin 2300 by the side portion(s) of the dummy fin 2300, thereby limiting the amount of lateral penetration into the dummy gate structure. As such, undesired lateral expansion of the gate cut trench 2900 can be avoided.

In the illustrated embodiment of FIG. 29A, $CD_C$ is less than $CD_D$. In some cases, $CD_C$ may be intentionally or inadvertently greater than $CD_D$, as illustrated in FIG. 29B. When this occurs, $CD_C$ may include two components, $CD_I$ and $CD_O$. $CD_I$ corresponds to the critical dimension of an inner portion of the gate cut trench 2900 whose vertical projection is approximately aligned with the second layer 2204 of the dummy fin 2300, and $CD_O$ corresponds to the critical dimension of an outer portion of the gate cut trench 2900 that is outside the inner portion. $CD_C$ may be equal to $CD_I + 2 \times CD_O$. By having the side portions of the dummy fin 2300 with a relatively tall height, as discussed above, $CD_O$ can be advantageously limited. As such, $CD_C$ can be avoided to be disadvantageously enlarged. In some other cases, the gate cut trench 2900 may be shifted from the dummy fin 2300, e.g., due to the misalignment of a patterning process, as illustrated in FIG. 29C. When this occurs, $CD_C$ may include two components, $CD_I$ and $CD_O$. $CD_I$ corresponds to the critical dimension of an inner portion of the gate cut trench 2900 whose vertical projection is approximately aligned with the second layer 2204 of the dummy fin 2300, and $CD_O$ corresponds to the critical dimension of an outer portion of the gate cut trench 2900 that is outside the inner portion. $CD_C$ may be equal to $CD_I + CD_O$. By having the side portions of the dummy fin 2300 with a relatively tall height, as discussed above, $CD_O$ can be advantageously limited. As such, $CD_C$ can be avoided to be disadvantageously enlarged.

The etching process 2901 may be configured to have at least some anisotropic etching characteristic to limit the undesired lateral etch. For example, the etching process 2901 can include a plasma etching process, which can have a certain amount of anisotropic characteristic. In such a plasma etching process (including radical plasma etching, remote plasma etching, and other suitable plasma etching processes), gas sources such as chlorine ($Cl_2$), hydrogen bromide (HBr), carbon tetrafluoride ($CF_4$), fluoroform ($CHF_3$), difluoromethane ($CH_2F_2$), fluoromethane ($CH_3F$), hexafluoro-1,3-butadiene ($C_4F_6$), boron trichloride ($BCl_3$), sulfur hexafluoride ($SF_6$), hydrogen ($H_2$), nitrogen trifluoride ($NF_3$), and other suitable gas sources and combinations thereof can be used with passivation gases such as nitrogen ($N_2$), oxygen ($O_2$), carbon dioxide ($CO_2$), sulfur dioxide ($SO_2$), carbon monoxide (CO), methane ($CH_4$), silicon tetrachloride ($SiCl_4$), and other suitable passivation gases and combinations thereof. Moreover, for the plasma etching process, the gas sources and/or the passivation gases can be diluted with gases such as argon (Ar), helium (He), neon (Ne), and other suitable dilutive gases and combinations thereof to control the above-described etching rates. As a non-limiting example, a source power of 10 watts to 3000 watts, a bias power of 0 watts to 3000 watts, a pressure of 1 millitorr to 5 torr, and an etch gas flow of 0 standard cubic centimeters per minute to 5000 standard cubic centimeters per minute may be used in the etching process 2901. However, it is noted that source powers, bias powers, pressures, and flow rates outside of these ranges are also contemplated.

In another example, the etching process 2901 can include a wet etching process, which can have a certain amount of isotropic characteristic, in combination with the plasma etching process. In such a wet etching process, a main etch chemical such as hydrofluoric acid (HF), fluorine ($F_2$), and other suitable main etch chemicals and combinations thereof can be used with assistive etch chemicals such as sulfuric acid ($H_2SO_4$), hydrogen chloride (HCl), hydrogen bromide (HBr), ammonia ($NH_3$), phosphoric acid ($H_3PO_4$), and other suitable assistive etch chemicals and combinations thereof as well as solvents such as deionized water, alcohol, acetone, and other suitable solvents and combinations thereof to control the above-described etching rates.

Figure 30A:
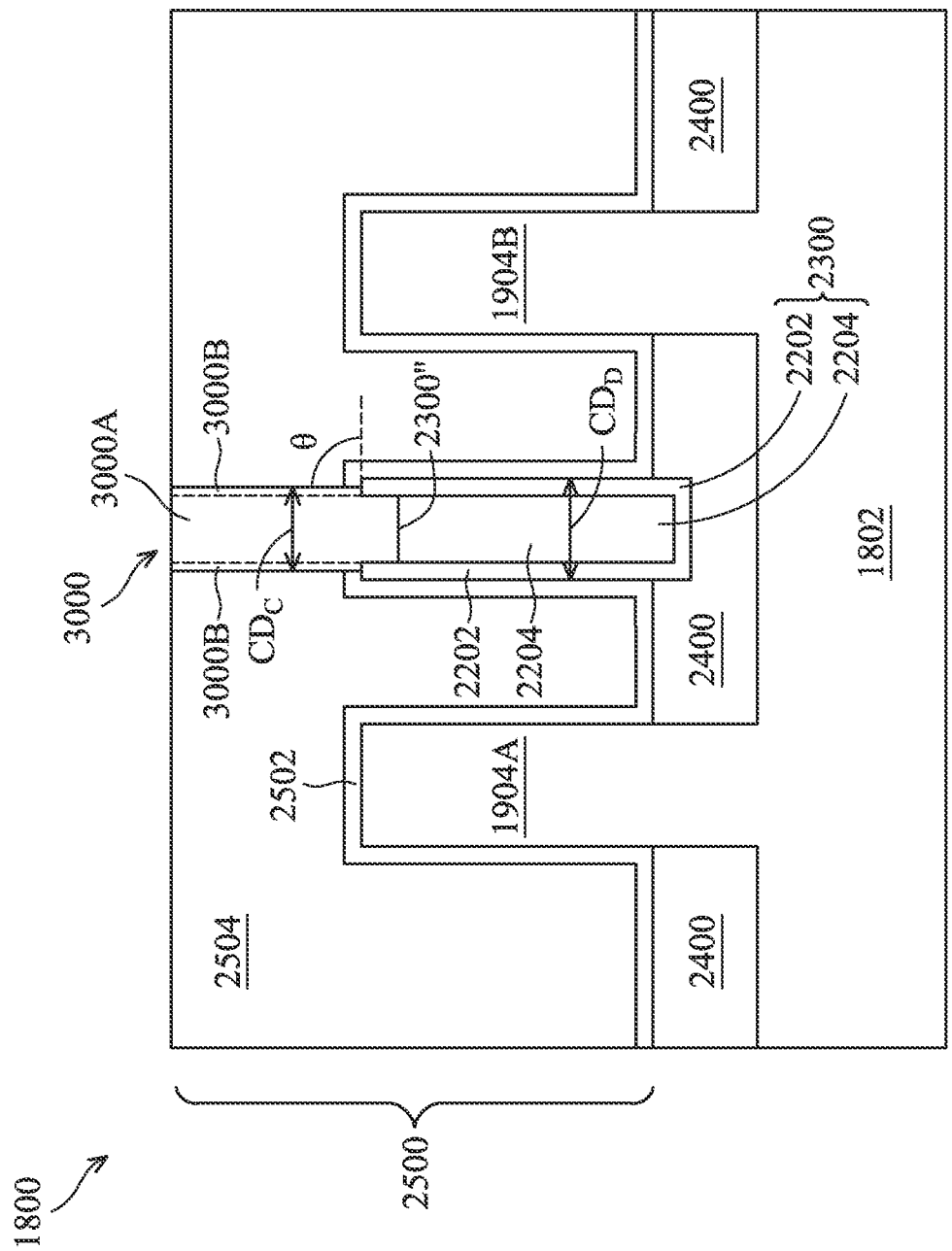
Figure 30B:
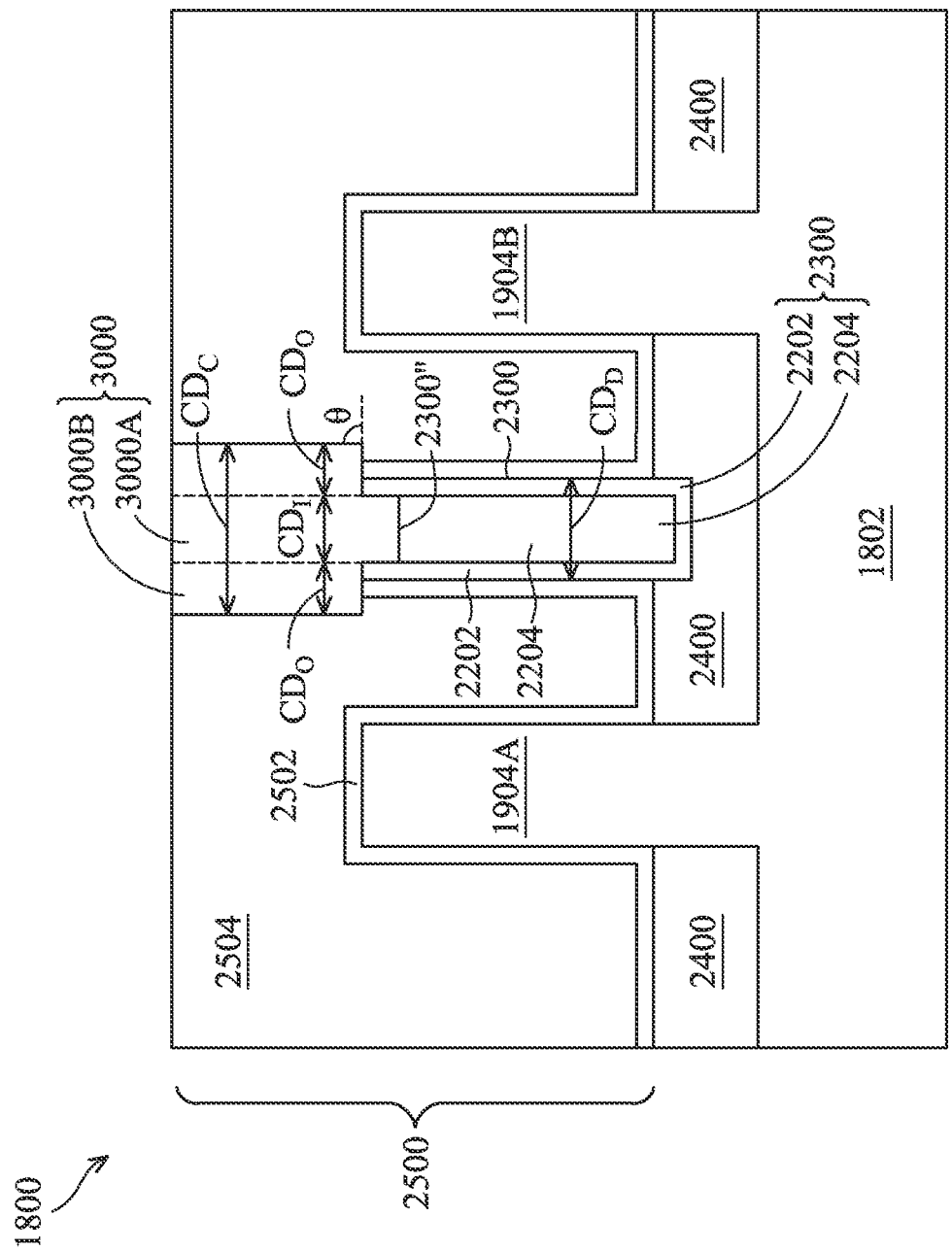
Figure 30C:
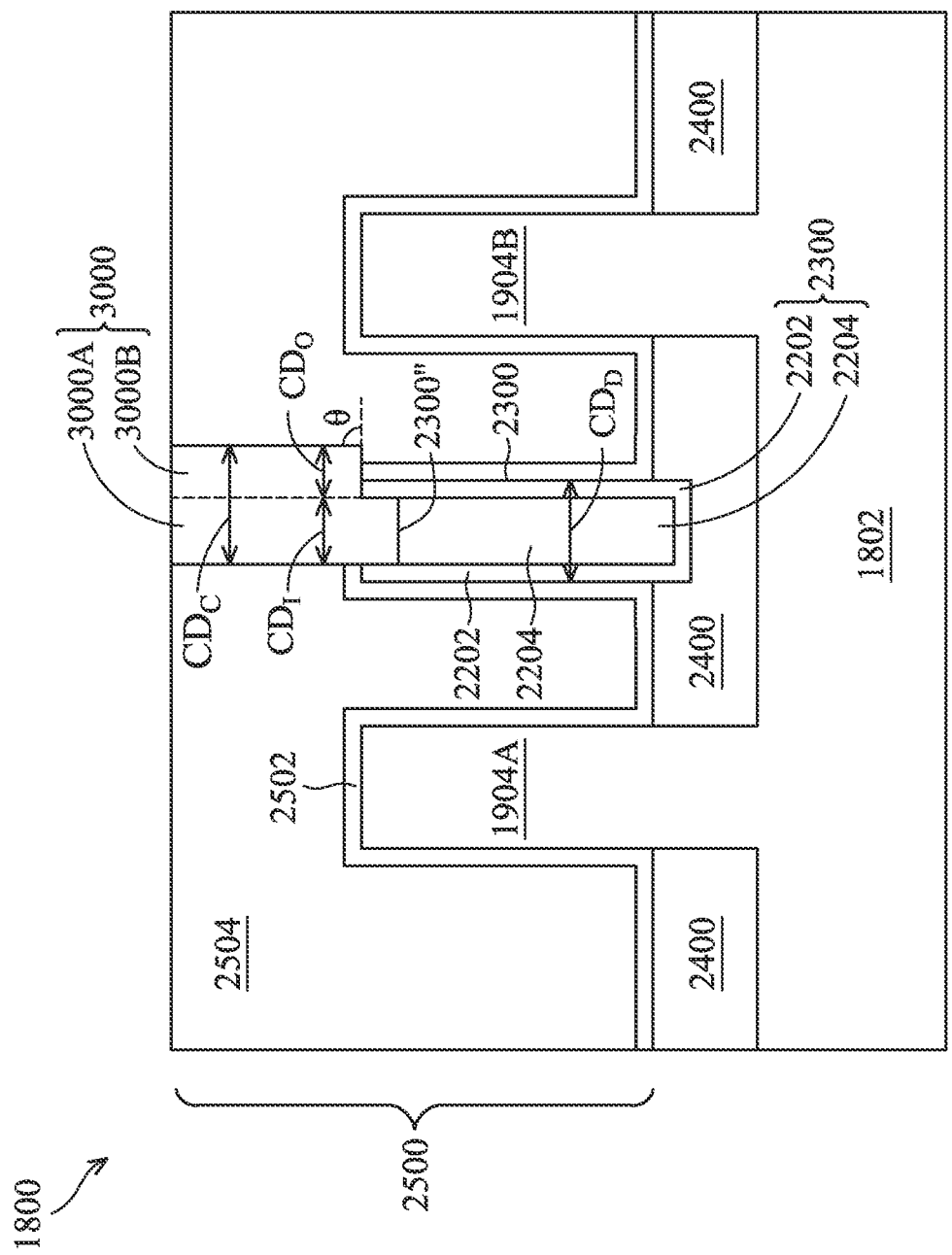

Corresponding to operation 1726 of FIG. 17, FIGS. 30A, 30B, and 30C are each a cross-sectional view of the FinFET device 1800 including a gate isolation structure 3000 at one of the various stages of fabrication. The cross-sectional views of FIGS. 30A-C are each cut along the lengthwise direction of the dummy gate structure 2500 (e.g., cross-section B-B indicated in FIG. 1). Specifically, the gate isolation structures 3000 of FIGS. 30A-C are formed according to the gate cut trenches 2900 of FIGS. 14A-C, respectively.

The gate isolation structure 3000 is formed by filling the gate cut trench 2900 with a dielectric material, which can thus inherit the profile (or dimensions) of the gate cut trench 2900. As such, the gate isolation structure 3000 can include a central portion 3000A and one or more side portions 3000B. The central portion 3000A extends farther into the dummy fin 2300 than the side portion(s) 3000B, as illustrated in FIGS. 30A-C. Further, at least a bottom surface of the central portion, which is in contact with the top surface 2300" of the dummy fin 2300, can follow its step-shaped profile. In some other embodiments, the bottom surface of the central portion and a bottom surface of at least one of the side portions can be in contact with the top surface 2300" so as to follow the step-shaped profile. For example in FIG. 30A-B, the respective bottom surfaces of the central portion 3000A and both side portions 3000B collectively follow the step-shaped profile of the dummy fin 2300. In another example of FIG. 30C, the central portion 3000A and at least one of the side portions 3000B collectively follow the step-shaped profile of the dummy fin 2300.

In accordance with various embodiments, at least a portion of the top surface 2300" of the dummy fin 2300 and at least one of the sidewalls of the gate isolation structure 3000 can form a right angle. As shown in FIG. 30A, a lateral edge of the top surface 2300" and a corresponding one of the sidewalls of the gate isolation structure 3000 form an angle, θ, that is approximately equal to 90°. In another example of FIG. 30C, a lateral edge of the top surface 2300" (or its extension) and one of the sidewalls of the gate isolation structure 3000 form an angle, θ, that is approximately equal to 90°.

In accordance with various embodiments, the gate isolation structure 3000 can also be characterized with $CD_C$ of the gate cut trench 2900. For example in FIG. 30A where the gate isolation structure 3000 fills the gate cut trench 3900 of FIG. 29A, the gate isolation structure 3000 can have its $CD_C$ less than $CD_D$. For example in FIG. 30B where the gate isolation structure 3000 fills the gate cut trench 2900 of FIG. 29B, the gate isolation structure 3000 can have its $CD_C$ greater than $CD_D$ and including two components, $CD_I$ and $CD_O$. $CD_I$ and $CD_O$ may correspond to critical dimensions of the central portion 3000A and side portion 3000B, respectively. For example in FIG. 30C where the gate isolation structure 3000 fills the gate cut trench 2900 of FIG. 29C, the gate isolation structure 3000 can have its $CD_C$ including two components, $CD_I$ and $CD_O$. $CD_I$ and $CD_O$ may correspond to critical dimensions of the central portion 3000A and side portion 3000B, respectively. In the following discussions, the illustrated embodiment of FIG. 30A will be used as an representative example.

The dielectric material that is used to form the gate isolation structure 3000 may include, for example, silicon oxide, silicon nitride, silicon oxynitride, silicon carbide, silicon carbonitride, silicon oxycarbonitride, silicon oxycarbide, or combinations thereof. The gate isolation structure 3000 can be formed by depositing the dielectric material in the gate cut trench 2900 using any suitable method, such as CVD, PECVD, or FCVD. After the deposition, a CMP may be performed to remove any excess dielectric material from the remaining dummy gate structure 2500.

Although the examples of FIGS. 30A-C show that the gate isolation structure 3000 fills the gate cut trench 2900 with a single dielectric piece (which can include one or more dielectric materials listed above), it is understood that the gate isolation structure 3000 can include multiple pieces. Each of the pieces may include, for example, silicon oxide, silicon nitride, silicon oxynitride, silicon carbide, silicon carbonitride, silicon oxycarbonitride, silicon oxycarbide, or combinations thereof. For example, the gate isolation structure 3000 may include a first piece, which is formed as a conformal layer lining the gate cut trench 2900, and a second piece, which fills the gate cut trench 2900 with the first piece coupled therebetween. In another example, the gate isolation structure 3000 may include a first piece, which fills a lower portion of the gate cut trench 2900, and a second piece, which fills an upper portion of the gate cut trench 2900.

Figure 31:
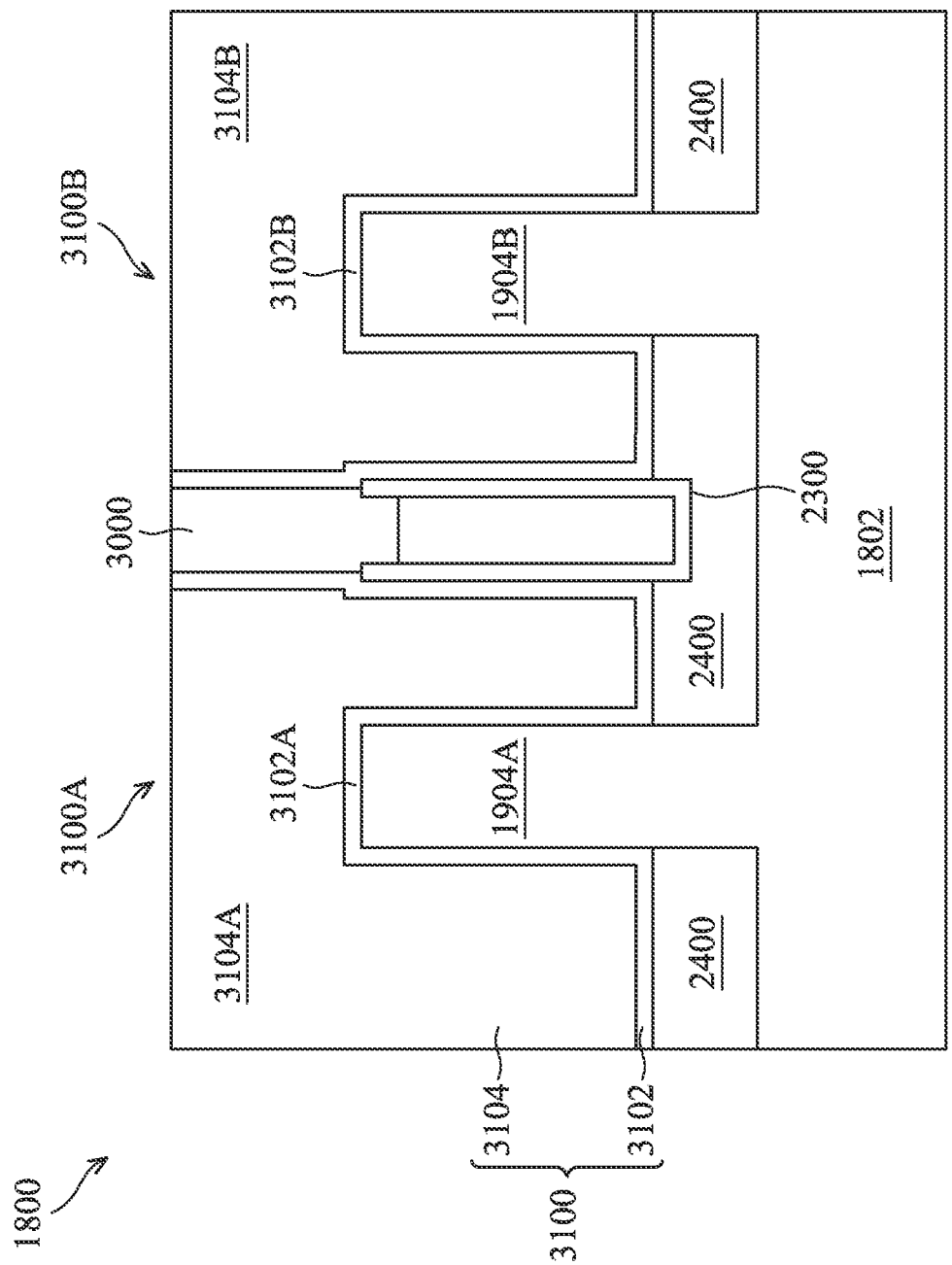

Corresponding to operation 1728 of FIG. 17, FIG. 31 is a cross-sectional view of the FinFET device 1800 including an active gate structure 3100 at one of the various stages of fabrication. The cross-sectional view of FIG. 31 is cut along a lengthwise direction of the active gate structure 3100 (e.g., cross-section B-B indicated in FIG. 1).

The active gate structure 3100 may be formed by replacing the dummy gate structure 2500. As illustrated, the active gate structure 3100 may include two portions 3100A and 3100B that are separated by the gate isolation structure 3000 and the dummy fin 2300. The portion 3100A can overlay the active fin 1904A, and the portion 3100B can overlay the active fin 1904B. After the active gate structure 3100 is formed, the FinFET device 1800 can include a number of transistors. For example, a first active transistor, adopting the active fin 1904A as its conduction channel and portion 3100A as its active gate structure, may be formed; and a second active transistor, adopting the active fin 1904B as its conduction channel and portion 3100B as its active gate structure, may be formed.

The active gate structure 3100 can include a gate dielectric layer 3102, a metal gate layer 3104, and one or more other layers that are not shown for clarity. For example, the active gate structure 3100 may further include a capping layer and a glue layer. The capping layer can protect the underlying work function layer from being oxidized. In some embodiments, the capping layer may be a silicon-containing layer, such as a layer of silicon, a layer of silicon oxide, or a layer of silicon nitride. The glue layer can function as an adhesion layer between the underlying layer and a subsequently formed gate electrode material (e.g., tungsten) over the glue layer. The glue layer may be formed of a suitable material, such as titanium nitride.

The gate dielectric layer 3102 is deposited (e.g., conformally) in a corresponding gate trench to surround (e.g., straddle) one or more fins. For example, the gate dielectric layer 3102 of the portion 3100A (sometimes referred to as "gate dielectric layer 3102A") is deposited in a gate trench that is formed by removing a portion of the dummy gate structure 2500 on the left-hand side of the dummy fin 2300. The gate dielectric layer 3102A can overlay the top surfaces and the sidewalls of the active fin 1904A, one of the sidewalls of the dummy fin 2300, and one of the sidewalls of the gate isolation structure 3000. The gate dielectric layer 3102 of the portion 3100B (sometimes referred to as "gate dielectric layer 3102B") is deposited in a gate trench that is formed by removing a portion of the dummy gate structure 2500 on the right-hand side of the dummy fin 2300. The gate dielectric layer 3102B can overlay the top surfaces and the sidewalls of the active fin 1904B, the other of the sidewalls of the dummy fin 2300, and the other of the sidewalls of the gate isolation structure 3000.

The gate dielectric layer 3102 includes silicon oxide, silicon nitride, or multilayers thereof. In example embodiments, the gate dielectric layer 3102 includes a high-k dielectric material, and in these embodiments, the gate dielectric layer 1602 may have a k value greater than about 7.0, and may include a metal oxide or a silicate of Hf, Al, Zr, La, Mg, Ba, Ti, Pb, or combinations thereof. The formation methods of gate dielectric layer 3102 may include molecular beam deposition (MBD), atomic layer deposition (ALD), PECVD, and the like. A thickness of the gate dielectric layer 3102 may be between about 8 Å and about 20 Å, as an example.

The metal gate layer 3104 is formed over the gate dielectric layer 3102. The metal gate layer 3104 of the portion 3100A (sometimes referred to as "metal gate layer 3104A") is deposited in the gate trench over the gate dielectric layer 3102A; and the metal gate layer 3104 of the portion 3100B (sometimes referred to as "metal gate layer 313104B") is deposited in the gate trench over the gate dielectric layer 3102B. The metal gate layer 3104 may be a P-type work function layer, an N-type work function layer, multi-layers thereof, or combinations thereof, in some embodiments. Accordingly, the metal gate layer 3104 is sometimes referred to as a work function layer. For example, the metal gate layer 3104 may be an N-type work function layer. In the discussion herein, a work function layer may also be referred to as a work function metal. Example P-type work function metals that may be included in the gate structures for P-type devices include TiN, TaN, Ru, Mo, Al, WN, $ZrSi_2$, $MoSi_2$, $TaSi_2$, $NiSi_2$, WN, other suitable P-type work function materials, or combinations thereof. Example N-type work function metals that may be included in the gate structures for N-type devices include Ti, Ag, TaAl, TaAlC, TiAlN, TaC, TaCN, TaSiN, Mn, Zr, other suitable N-type work function materials, or combinations thereof.

A work function value is associated with the material composition of the work function layer, and thus, the material of the work function layer is chosen to tune its work function value so that a target threshold voltage $V_t$ is achieved in the device that is to be formed. The work function layer(s) may be deposited by CVD, physical vapor deposition (PVD), ALD, and/or other suitable process. The thickness of a P-type work function layer may be between about 8 Å and about 15 Å, and the thickness of an N-type work function layer may be between about 15 Å and about 30 Å, as an example.

It should be noted that the active gate structure 3100 illustrated in FIG. 31 is formed based on the gate isolation structures 3000 being formed as shown in FIG. 30A. When the gate isolation structures 3000 is formed differently, the active gate structure 3100 may have different profiles. For example, when the gate isolation structures 3000 is formed to have a CD wider than a corresponding dummy fin 2300 (e.g., FIG. 30B), a portion of the gate dielectric layer 3102, and optionally a portion of the metal gate layer 3104 (which depends on a thickness of the gate dielectric layer 3102) may be disposed beneath each of the side portions 3000B. If the thickness of the gate dielectric layer 3102 is greater than or equal to $CD_O$, beneath any side portion 3000B, the metal gate layer 3104 may not be present; and if the thickness of the gate dielectric layer 3102 is less than $CD_O$, portions of the metal gate layer 3104 (e.g., a portion of 3104A and a portion of 3104B) may be present beneath each of the side portions 3000B. In another example, in FIG. 30C, a portion of the gate dielectric layer 3102, and optionally a portion of the metal gate layer 3104 (which depends on a thickness of the gate dielectric layer 3102) may be disposed beneath the side portion 3000B. If the thickness of the gate dielectric layer 3102 is greater than or equal to $CD_O$, beneath the side portion 3000B, the metal gate layer 3104 may not be present; and if the thickness of the gate dielectric layer 3102 is less than $CD_O$, the metal gate layer 3104 (e.g., a portion of 3104B) may be present beneath the side portion 3000B.

In one aspect of the present disclosure, a semiconductor device is disclosed. The semiconductor device includes a first semiconductor fin and a second semiconductor fin extending along a first direction. The semiconductor device includes a dielectric fin, extending along the first direction, that is disposed between the first and second semiconductor fins. The semiconductor device includes a gate isolation structure vertically disposed above the dielectric fin. The semiconductor device includes a metal gate layer extending along a second direction perpendicular to the first direction, wherein the metal gate layer includes a first portion straddling the first semiconductor fin and a second portion straddling the second semiconductor fin. The gate isolation structure has a central portion and one or more side portions. The central portion extends toward the dielectric fin a further distance than at least one of the one or more side portions.

In another aspect of the present disclosure, a semiconductor device is disclosed. The semiconductor device includes a first transistor, formed over a substrate, that includes a first conduction channel, and a first portion of a metal gate layer over the first conduction channel. The semiconductor device includes a second transistor, formed over the substrate, that includes a second conduction channel, and a second portion of the metal gate layer over the second conduction channel. The semiconductor device includes a dummy channel disposed between the first and second conduction channels. The semiconductor device includes a gate isolation structure vertically disposed above the dummy channel. The gate isolation structure separates the first and second portions of the metal gate layer from each other and includes a central portion and one or more side portions. The central portion extends toward the dielectric fin a further distance than at least one of the one or more side portions.

In yet another aspect of the present disclosure, a method for fabricating a semiconductor device is disclosed. The method includes forming a first semiconductor fin and a second semiconductor fin extending along a first direction over a substrate. The method includes forming a dielectric fin extending also along the first direction, wherein the dielectric fin is disposed between the first and second semiconductor fins. The dielectric fin has a central portion and side portions. The method includes etching the dielectric fin to cause the central portion to be shorter than each of the side portions. The method includes forming a gate isolation structure coupled to the dielectric fin. The gate isolation structure separates a metal gate layer, extending along a second direction perpendicular to the first direction, into a first portion and a second portion that straddle the first semiconductor fin and the second semiconductor fin, respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first semiconductor fin and a second semiconductor fin extending along a first direction;
   a dielectric fin, extending along the first direction, that is disposed between the first and second semiconductor fins;
   a gate isolation structure vertically disposed above the dielectric fin; and
   a metal gate layer extending along a second direction perpendicular to the first direction, wherein the metal gate layer includes a first portion straddling the first semiconductor fin and a second portion straddling the second semiconductor fin;
   wherein the gate isolation structure has a central portion and one or more side portions, wherein the central portion extends toward the dielectric fin a further distance than at least one of the one or more side portions, and wherein the dielectric fin includes a central portion and one or more side portions vertically aligned with the central portion and the one or more side portions of the gate isolation structure, respectively.

2. The semiconductor device of claim 1, wherein the gate isolation structure separates the first and second portions of the metal gate layer from each other.

3. The semiconductor device of claim 1, wherein respective bottom surfaces of the central portion and the one or more side portions collectively form a v-shaped profile.

4. The semiconductor device of claim 1, wherein respective bottom surfaces of the central portion and the one or more side portions collectively form a step-shaped profile.

5. The semiconductor device of claim 1, wherein a bottom surface of at least the central portion of the gate isolation structure is in contact with a portion of a top surface of the dielectric fin.

6. The semiconductor device of claim 1, further comprising a gate dielectric disposed between the metal gate layer and each of the first and second semiconductor fins.

7. The semiconductor device of claim 6, wherein the gate dielectric extends along: (i) a portion of a top surface of the dielectric fin; (ii) a top surface and sidewalls of each of the first and second semiconductor fins; and (iii) sidewalls of the gate isolation structure.

8. The semiconductor device of claim 7, wherein the portion of the top surface of the dielectric fin and each of the sidewalls of the gate isolation structure form an acute angle.

9. The semiconductor device of claim 7, wherein the portion of the top surface of the dielectric fin and each of the sidewalls of the gate isolation structure form a right angle.

10. The semiconductor device of claim 1, wherein the central portion and the one or more side portions of the dielectric fin have respective different etching rates.

11. A semiconductor device, comprising:
    a first transistor, formed over a substrate, that comprises:
      a first conduction channel; and
      a first portion of a metal gate layer over the first conduction channel;
    a second transistor, formed over the substrate, that comprises:
      a second conduction channel; and
      a second portion of the metal gate layer over the second conduction channel;
    a dummy channel disposed between the first and second conduction channels; and
    a gate isolation structure vertically disposed above the dummy channel;
    wherein the gate isolation structure separates the first and second portions of the metal gate layer from each other, and includes a central portion and one or more side portions, the central portion extending toward the dummy channel a further distance than at least one of the one or more side portions, and wherein the dummy channel includes a central portion and one or more side portions vertically aligned with the central portion and the one or more side portions of the gate isolation structure, respectively.

12. The semiconductor device of claim 11, wherein respective bottom surfaces of the central portion and the one or more side portions collectively form a v-shaped profile.

13. The semiconductor device of claim 11, wherein respective bottom surfaces of the central portion and the one or more side portions collectively form a step-shaped profile.

14. The semiconductor device of claim 11, wherein a bottom surface of at least the central portion is in contact with a portion of a top surface of the dummy channel.

15. The semiconductor device of claim 14, wherein a remaining portion of the top surface of the dummy channel and each of sidewalls of the gate isolation structure form an acute angle.

16. The semiconductor device of claim 14, wherein a remaining portion of the top surface of the dummy channel and each of sidewalls of the gate isolation structure form a right angle.

17. A semiconductor device, comprising:
    a first semiconductor fin and a second semiconductor fin extending along a first direction;
    a dielectric fin also extending along the first direction and interposed between the first and second semiconductor fins;
    a gate isolation structure vertically disposed above the dielectric fin; and
    a metal gate layer extending along a second direction perpendicular to the first direction, wherein the metal gate layer includes a first portion straddling the first semiconductor fin and a second portion straddling the second semiconductor fin;

wherein the gate isolation structure has a central portion and one or more side portions, and wherein the central portion extends toward the dielectric fin a further distance than at least one of the one or more side portions so as to form a v-shaped interface between a top surface of the dielectric fin and a bottom surface of at least one of the central portion or the one or more side portions of the gate isolation structure.

18. The semiconductor device of claim 17, further comprising a gate dielectric disposed between the metal gate layer and each of the first and second semiconductor fins.

19. The semiconductor device of claim 18, wherein the gate dielectric extends along: (i) a portion of a top surface of the dielectric fin; (ii) a top surface and sidewalls of each of the first and second semiconductor fins; and (iii) sidewalls of the gate isolation structure.

20. The semiconductor device of claim 19, wherein the portion of the top surface of the dielectric fin and each of the sidewalls of the gate isolation structure form an acute angle.

* * * * *